(12) United States Patent
Naito et al.

(10) Patent No.: US 10,913,680 B2
(45) Date of Patent: Feb. 9, 2021

(54) LEAD-FREE GLASS COMPOSITION, GLASS COMPOSITE MATERIAL, GLASS PASTE, SEALING STRUCTURE, ELECTRICAL/ELECTRONIC COMPONENT AND COATED COMPONENT

(71) Applicant: HITACHI, LTD., Tokyo (JP)

(72) Inventors: Takashi Naito, Tokyo (JP); Takuya Aoyagi, Tokyo (JP); Tatsuya Miyake, Tokyo (JP); Takeshi Kondo, Tokyo (JP); Hiroki Kaneko, Tokyo (JP); Kazutaka Okamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 211 days.

(21) Appl. No.: 16/068,759

(22) PCT Filed: Jan. 11, 2017

(86) PCT No.: PCT/JP2017/000571
§ 371 (c)(1),
(2) Date: Jul. 9, 2018

(87) PCT Pub. No.: WO2017/126378
PCT Pub. Date: Jul. 27, 2017

(65) Prior Publication Data
US 2018/0354843 A1 Dec. 13, 2018

(30) Foreign Application Priority Data
Jan. 18, 2016 (JP) .................................. 2016-006759

(51) Int. Cl.
*C03C 8/24* (2006.01)
*C03C 8/16* (2006.01)
(Continued)

(52) U.S. Cl.
CPC .................. *C03C 8/24* (2013.01); *C03C 3/12* (2013.01); *C03C 3/122* (2013.01); *C03C 3/125* (2013.01);
(Continued)

(58) Field of Classification Search
USPC ................................ 428/426, 428, 701, 702
See application file for complete search history.

(56) References Cited

U.S. PATENT DOCUMENTS 5,334,558 A * 8/1994 Dietz ...................... C03C 3/122
106/1.14
9,815,735 B2 * 11/2017 Miyazawa ................ C03C 8/24
(Continued)

FOREIGN PATENT DOCUMENTS

JP 08-502468 A 3/1996
JP 2013-032255 A 2/2013
(Continued)

OTHER PUBLICATIONS

Extended European Search Report dated Sep. 11, 2019 for the European Patent Application No. 17741258.2.
(Continued)

*Primary Examiner* — Lauren R Colgan
(74) *Attorney, Agent, or Firm* — Volpe Koenig

(57) ABSTRACT

The purpose of the present invention is to provide a lead-free glass composition in which crystallization is suppressed and which has a low softening point. This lead-free glass composition is characterized by containing silver oxide, tellurium oxide and vanadium oxide, and further containing at least one compound selected from among yttrium oxide, lanthanum oxide, cerium oxide, erbium oxide, ytterbium oxide, aluminum oxide, gallium oxide, indium oxide, iron oxide, tungsten oxide and molybdenum oxide as an additional component, and in that the content values (mol %) of
(Continued)

silver oxide, tellurium oxide and vanadium oxide satisfy the relationships $Ag_2O > TeO_2 \geq V_2O_5$ and $Ag_5O \leq 2V_2O_5$ when calculated in terms of the oxides, and in that the content of $TeO_2$ is 25-37 mol. %.

6 Claims, 19 Drawing Sheets

(51) Int. Cl.

| | | |
|---|---|---|
| *C03C 8/18* | (2006.01) | |
| *C03C 27/06* | (2006.01) | |
| *C03C 3/12* | (2006.01) | |
| *C03C 8/20* | (2006.01) | |
| *H01J 9/02* | (2006.01) | |
| *H01L 23/10* | (2006.01) | |
| *H01J 11/48* | (2012.01) | |
| *H01J 11/22* | (2012.01) | |
| *C03C 8/02* | (2006.01) | |
| *H01L 23/02* | (2006.01) | |
| *H01L 51/50* | (2006.01) | |
| *H01L 31/0224* | (2006.01) | |
| *H05B 33/04* | (2006.01) | |
| *H01J 9/24* | (2006.01) | |
| *H05B 33/26* | (2006.01) | |
| *C03C 3/21* | (2006.01) | |
| *C03C 14/00* | (2006.01) | |
| *C03C 17/00* | (2006.01) | |
| *C03C 17/04* | (2006.01) | |
| *H01L 51/52* | (2006.01) | |
| *H03H 9/10* | (2006.01) | |

(52) U.S. Cl.
CPC .................. *C03C 3/21* (2013.01); *C03C 8/02* (2013.01); *C03C 8/16* (2013.01); *C03C 8/18* (2013.01); *C03C 8/20* (2013.01); *C03C 14/004* (2013.01); *C03C 17/007* (2013.01); *C03C 17/04* (2013.01); *C03C 27/06* (2013.01); *H01J 9/02* (2013.01); *H01J 9/24* (2013.01); *H01J 11/22* (2013.01); *H01J 11/48* (2013.01); *H01L 23/02* (2013.01); *H01L 23/10* (2013.01); *H01L 31/0224* (2013.01); *H01L 51/50* (2013.01); *H05B 33/04* (2013.01); *H05B 33/26* (2013.01); *C03C 2205/00* (2013.01); *C03C 2218/11* (2013.01); *H01L 31/022425* (2013.01); *H01L 51/5246* (2013.01); *H01L 2224/16225* (2013.01); *H01L 2924/16152* (2013.01); *H03H 9/10* (2013.01)

(56) References Cited

U.S. PATENT DOCUMENTS

| | | | |
|---|---|---|---|
| 9,824,900 B2 * | 11/2017 | Kodama | .................. C03C 8/02 |
| 10,252,938 B2 * | 4/2019 | Sawai | .................. H01J 29/90 |
| 2012/0321902 A1 * | 12/2012 | Kohara | .................. C03C 8/24 |
| | | | 428/428 |
| 2014/0145122 A1 * | 5/2014 | Sawai | .................. C03C 8/16 |
| | | | 252/514 |
| 2014/0334937 A1 | 11/2014 | Fujieda et al. | |
| 2015/0020879 A1 | 1/2015 | Sawai et al. | |
| 2015/0279700 A1 | 10/2015 | Kodama et al. | |
| 2016/0060158 A1 * | 3/2016 | Naito | .................. C03C 17/04 |
| | | | 428/34 |
| 2016/0229737 A1 * | 8/2016 | Naito | .................. H01B 1/14 |

FOREIGN PATENT DOCUMENTS

| | | |
|---|---|---|
| JP | 2013-132756 A | 7/2013 |
| JP | 2013-133342 A | 7/2013 |
| WO | 2014/073086 A1 | 5/2014 |

OTHER PUBLICATIONS

International Search Report, PCT/JP2017/000571, dated Mar. 21, 2017, 3 pgs.

* cited by examiner

LEAD-FREE GLASS COMPOSITION, GLASS COMPOSITE MATERIAL, GLASS PASTE, SEALING STRUCTURE, ELECTRICAL/ELECTRONIC COMPONENT AND COATED COMPONENT

TECHNICAL FIELD

The present invention relates to a lead-free glass composition, a glass composite material, glass paste, a sealing structure, an electrical/electronic component, and a coated component.

BACKGROUND ART

In a vacuum insulation multilayer glass panel applied to a window glass, a display panel such as a plasma display panel, an organic EL display panel, and a fluorescent display tube, and in an electrical/electronic component such as a crystal oscillator, an IC ceramic package, and a semiconductor sensor, sealing, bonding and the like are performed with a glass composite material containing a low-melting glass composition and ceramic particles. In many cases, the glass composite material is applied in the form of glass paste. The glass paste is applied to a base material by the screen printing method, the dispenser method or the like. After drying, firing is performed, thus development into sealing, bonding and the like is achieved. Upon sealing, bonding or the like, the glass composite material or glass paste is tightly bonded to a sealed member, a bonded member or the like, by softening and flowing of the low-melting glass composition contained in the glass composite material or the glass paste.

Further, in many electrical/electronic components such as a photovoltaic cell, an image display device, a multilayer capacitor, a crystal oscillator, an LED (Light Emitting Diode), and a multilayer circuit board, electrodes and wirings are formed with a glass composite material containing a low-melting glass composition and metal particles. Further, the glass composite material is also used as a conductive junction for electrical conduction or a heat dissipation junction for thermal conduction. Upon formation of electrodes, wirings, heat dissipation junctions and the like, the metal particles are also fired or tightly bonded to the substrate by softening and flowing of the low-melting glass composition contained in the glass composite material or the glass paste.

As the low-melting glass composition contained in the above-described glass composite material and its glass paste, a PbO—$B_2O_3$ system low-melting glass composition, containing a large quantity of lead oxide, was widely used. The PbO—$B_2O_3$ system low-melting glass composition has a low softening point of 350 to 400° C. It shows good softening liquidity at 400 to 450° C. Further, it has comparatively high chemical stability.

However, in recent years, the stream of green procurement and green design is enhanced in the world, and safer materials are required. For example, in Europe, the directive about Restrictions on the use of specific hazardous substances in electrical/electronic components (RoHS directive) from European Union (EU) was enforced on Jul. 1, 2006. In the RoHS directive, six substances, i.e., lead, mercury, cadmium, hexavalent chromium, polybrominated biphenyl, and polybrominated diphenyl ether, were designated as banned substances.

Since the above-described PbO—$B_2O_3$ system low-melting glass composition contains much lead designated as a banned substance in the RoHS directive, it became difficult to use it in the glass composite material and its glass paste. Accordingly, development of a novel lead-free low-melting glass composition has been promoted.

Patent Literature 1 (Japanese Unexamined Patent Application Publication No. 2013-32255) discloses a lead-free glass composition which contains, when the component is expressed as an oxide, 10 to 60 mass % $Ag_2O$, 5 to 65 mass % $V_2O_5$, and 15 to 50 mass % $TeO_2$. The total content of $Ag_2O$, $V_2O_5$ and $TeO_2$ is equal to or greater than 75 mass % and less than 100 mass %. The rest is 0 mass % and equal to or less than 25 mass % of one or more of $P_2O_5$, BaO, $K_2O$, $WO_3$, $Fe_2O_3$, $MnO_2$, $Sb_2O_3$, and ZnO. In the $Ag_2O$—$V_2O_5$—$TeO_2$ system lead-free glass composition, the softening point obtained from the second endothermic peak temperature in differential thermal analysis (DTA) stands within a temperature range of 268 to 320° C. The glass composition is softened and fluidized at a lower temperature than that at which the conventional PbO—$B_2O_3$ system low-melting glass composition is softened and fluidized. Further, it is considered that the glass composition has good chemical stability. When it is applied to a sealing structure or an electrical/electronic component, it is fired at a higher temperature than the softening point by 30 to 50° C. Further, the patent literature proposes a glass composite material containing the $Ag_2O$—$V_2O_5$—$TeO_2$ system lead-free glass composition and its glass paste, and an electrical/electronic component utilizing them.

CITATION LIST

Patent Literature

Patent Literature 1: Japanese Unexamined Patent Application Publication No. 2013-32255

SUMMARY OF INVENTION

Technical Problem

In the $Ag_2O$—$V_2O_5$—$TeO_2$ system lead-free glass composition disclosed in Patent Literature 1, the softening point is extremely lower than that of the conventional PbO—$B_2O_3$ system low-melting glass composition. However, it is difficult to further lower the softening point since there is a fear of crystallization upon heat-firing. Further, the crystallization more prominently occurs due to compounding of ceramic particles and metal particles and use of these particles in the form of paste. Accordingly, it is difficult to achieve development into the glass composite material and its glass paste, further to achieve application to a sealing structure and an electrical/electronic component utilizing them.

The present invention provides a lead-free glass composition with reduced crystallization tendency of the $Ag_2O$—$TeO_2$—$V_2O_5$ system lead-free glass composition, which is softened and fluidized at a use temperature equal to or lower than that of tin solder not containing lead or cadmium, i.e., lower than the melting point of the tin (231.9° C.).

Solution to Problem

To attain the above object, the lead-free glass composition according to the present invention contains silver oxide, tellurium oxide, and vanadium oxide, further, containing at least any of yttrium oxide, lanthanum oxide, cerium oxide, erbium oxide, ytterbium oxide, aluminum oxide, gallium oxide, indium oxide, iron oxide, tungsten oxide, and molybdenum oxide. The contents (mol %) of the silver oxide, the tellurium oxide, and the vanadium oxide, when calculated in terms of the oxides as shown below, have the relationship of $Ag_2O > TeO_2 \geq V_2O_5$, and $Ag_2O \leq 2V_2O_5$, and the content of $TeO_2$ is 25 mol % to 37 mol %.

Advantageous Effects of Invention

According to the present invention, it is possible to provide a lead-free glass composition in which crystallization is suppressed and which has a low softening point.

DESCRIPTION OF EMBODIMENTS

Figure 1:
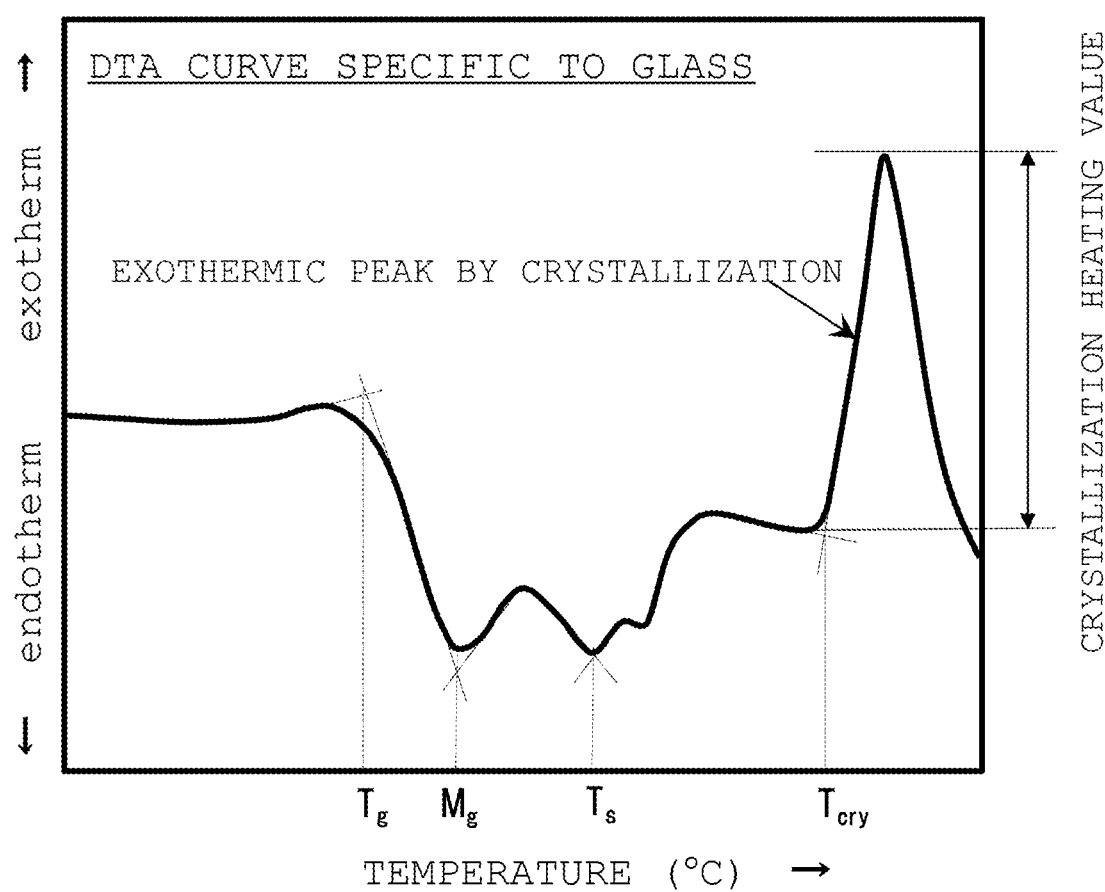
FIG. 1 illustrates an example of a typical differential thermal analysis (DTA) curve peculiar to glass.

Hereinbelow, embodiments of the present invention will be described in more detail with reference to the drawings. Note that the present invention is not limited to the embodiments described here, but arbitrary combinations and improvement can be made within a scope not to change the subject matter.

(Glass Composition)

In a low-melting glass composition, generally, the lower the characteristic temperatures of the glass such as a transition point, a yield point, and a softening point are, the better the softening liquidity is at a lower temperature. On the other hand, when the characteristic temperatures are too low, the crystallization tendency is increased, and the crystallization frequently occurs upon heat-firing. Accordingly, the softening liquidity at a low temperature is deteriorated. Further, the lower the characteristic temperatures of the glass are, the lower the chemical stability such as humidity resistance and acid resistance is. Further, the influence on environmental load tends to increase. For example, in a conventional PbO—$B_2O_3$ system low-melting glass composition, the larger the hazardous PbO content, the lower the characteristic temperatures are, however, the crystallization tendency is higher. Further, the chemical stability is lowered, and further, the influence on the environmental load is increased.

The inventors earnestly studied about a glass composition, which is a substantially lead-free low-melting glass composition having good softening liquidity at a lower temperature than that of the conventional PbO—$B_2O_3$ system low-melting glass composition, and further having good chemical stability. As a result, the inventors found that it is possible to simultaneously satisfy the above-described requirements in a novel low-melting glass composition, and completed the present invention.

The lead-free glass composition according to the present invention contains silver oxide, tellurium oxide and vanadium oxide as main components, and further contains at least one of yttrium oxide, lanthanum oxide, cerium oxide, erbium oxide, ytterbium oxide, aluminum oxide, gallium oxide, indium oxide, iron oxide, tungsten oxide and molybdenum oxide as an additional component. Note that in the present specification, "lead-free" means that the banned substances in the above-described RoHS directive (enforced on Jul. 1, 2006) may be contained within a range equal to or less than the designated value. In the case of lead (Pb), the content is 1000 ppm or less.

Further, in the lead-free glass composition according to the present invention, the contents (mol %) of the main components have, when calculated in terms of the oxides as shown below, the relationship of $Ag_2O > TeO_2 \geq V_2O_5$, and $Ag_2O \leq 2V_2O_5$, and the content of $TeO_2$ is 25 mol % to 37 mol %.

As the lead-free glass composition, containing the oxides of silver (Ag), tellurium (Te), and vanadium (V) as main components, further contains one or more of the oxides of yttrium (Y), lanthanum (La), cerium (Ce), erbium (Er), ytterbium (Yb), aluminum (Al), gallium (Ga), indium (In), iron (Fe), tungsten (W), and molybdenum (Mo), as additional component(s), it is possible to reduce the crystallization tendency. Further, it was found that by adjusting the contents (mol %) of the oxides of silver (Ag), tellurium (Te), and vanadium (V) as main components, such that the relationship $Ag_2O > TeO_2 \geq V_2O_5$, and $Ag_2O \leq 2V_2O_5$ holds, and the content of $TeO_2$ is 25 mol % to 37 mol %, it is possible to further lower the softening point. With this composition range, it is possible to lower the second endothermic peak temperature by differential thermal analysis (hereinbelow, softening point) to 200° C. or lower. As a result, it is possible to provide a lead-free glass composition having use temperature equal to or lower than that of tin solder not containing lead or cadmium, more specifically, having good softening liquidity at a temperature less than the melting point of the tin (231.9° C.). Further, although the lead-free glass composition according to the present invention has a low softening point, the chemical stability such as humidity resistance, acid resistance and the like is high. In addition, it is the lead-free glass composition in conformity with the RoHS directive.

In the above-described lead-free glass composition, the functions of $Ag_2O$, $TeO_2$, and $V_2O_5$ as main components will be described next. It is considered that the glass structure formed with $Ag_2O$, $TeO_2$, and $V_2O_5$ has a layered structure of $V_2O_5$ and $TeO_2$, and $Ag_2O$ exists in the form of $Ag^+$ ion between the layers. The glass structure contains $Ag_2O$ to lower the characteristic temperatures such as the transition point, the yield point, and the softening point, and improve the chemical stability. It is considered that the characteristic temperatures are lowered when the $Ag^+$ ions enter between the layers of the layered structure of $V_2O_5$ and $TeO_2$, and the interlayer force is weakened. Further, it is considered that the chemical stability is improved when the $Ag^+$ ions enter between the layers, to prevent infiltration of water molecules and the like. The glass structure contains $V_2O_5$ to prevent reduction of $Ag_2O$ and precipitation of the metal Ag upon manufacturing of the glass. When $Ag_2O$ as a glass component does not exist in the state of $Ag^+$ ions between the layers of the glass structure, it is not possible to obtain a desired temperature reduction effect. When the content of $Ag_2O$ is increased, i.e., when the amount of $Ag^+$ ions between the layers of the glass structure is increased, the temperature is lowered, however, it is necessary to also increase the content of $V_2O_5$ to prevent precipitation of the metal Ag at that time. Upon manufacturing of the glass, with respect to one five-valence vanadium ion ($V^{5+}$ ion), up to two Ag+ ions are contained between the layers of the glass structure. $TeO_2$ is a vitrification component for vitrification upon manufacturing of the glass. Accordingly, when $TeO_2$ is not contained, the glass is not formed. Further, when the content of $TeO_2$ is small, it is difficult to reduce the crystallization tendency. On the other hand, when the content is large, it is possible to reduce the crystallization tendency but it is difficult to lower the characteristic temperature. When the both of reduction of the crystallization tendency and the lowering of the characteristic temperature are taken into consideration, it is preferable that with respect to one four-valence tellurium ion ($Te^{4+}$ ion), one or two $V^{5+}$ ions are contained. As a particular content of $TeO_2$, 25 mol % to 37 mol % is effective.

Further, it is preferable that the content of $Ag_2O$ is equal to or greater than 40 mol % and less than 50 mol % and the content of $V_2O_5$ is equal to or greater than 20 mol % and less than 30 mol %.

As described above, in the lead-free glass composition containing $Ag_2O$, $TeO_2$, and $V_2O_5$ as main components, to reduce the crystallization tendency, it is effective to contain one or more of the oxides of yttrium (Y), lanthanum (La), cerium (Ce), erbium (Er), ytterbium (Yb), aluminum (Al), gallium (Ga), indium (In), iron (Fe), tungsten (W), and molybdenum (Mo), as additional components. It is preferable that the contents are 0.1 mol % to 3.5 mol % when calculated in terms of the oxides as shown below. When the contents of the additional components are equal to or greater than 0.1 mol %, it is possible to sufficiently obtain the effect of reduction of the crystallization tendency. Further, when the contents of the additional components are equal to or less than 3.5 mol %, it is possible to suppress the raise of the characteristic temperature and the crystallization.

It is preferable to contain any of the oxides of yttrium (Y), lanthanum (La), and aluminum (Al) as the additional component. It is possible to remarkably reduce the crystallization tendency when any of $Y_2O_3$, $La_2O_3$, and $Al_2O_3$ is contained. When any of the yttrium oxide, the lanthanum oxide, and the aluminum oxide is used as the additional component, upon manufacturing of the glass, to suppress reduction of $Ag_2O$ as the main component and the precipitation of the metal Ag, it is preferable that the content (mol %) satisfies the relationship, when calculated in terms of the oxides as shown below, $Ag_2O+Ln_2O_3 \leq 2V_2O_5$ (Ln: Y, La, Al). The metal Ag is precipitated upon manufacturing of the glass since the additional components, $Y_2O_3$, $La_2O_3$, and $Al_2O_3$ are preferentially taken between the layers of the layered structure of the glass rather than the main component $Ag_2O$, and the $Ag_2O$ that is not entered the structure is precipitated as metal Ag. Further, it is particularly preferable that the content of the above-described additional component is 0.3 mol % to 1.5 mol %.

Further, in the above-described lead-free glass composition, although the softening point is lowered, the chemical stability such as the humidity resistance and the acid resistance is high. Further, it is conformable to the RoHS directive.

Further, to develop the lead-free glass composition and the glass composite material containing ceramic particles, metal particles or resin, and its glass paste formed by pasting the glass composite material, into a sealing structure, an electrical/electronic component, and a coated component, it is preferable to use a glass composition in which the crystallization tendency is low and the softening point is lower. That is, by using a glass composition with a low crystallization tendency and a lower softening point, the softening liquidity at a low temperature is good in the glass composite material or the glass paste. However, in the conventional low-melting glass composition, the lowering of the softening point is often accompanied by lowering of crystallization start temperature.

Next, the characteristic temperature will be described. The characteristic temperature was measured by the differential thermal analysis (DTA). FIG. 1 shows an example of a typical DTA curve peculiar to glass. Generally, DTA of glass is measured by using glass particles having a particle diameter of about tens of μmeters, and further using high purity aluminum ($\alpha$-$Al_2O_3$) particles as standard samples, at a temperature rising rate of 5° C./min in the atmosphere. As shown in FIG. 1, the starting temperature of the first endothermic peak is a transition point $T_g$, its endothermic peak temperature is a yield point $M_g$, the second endothermic peak temperature is a softening point $T_s$, and the starting temperature of exothermic peak by crystallization is a crystallization starting temperature $T_{cry}$. Note that generally, the respective characteristic temperatures are obtained by tangential line method. The characteristic temperatures $T_g$, $M_g$, and $T_s$ are defined by glass viscosity. The temperature $T_g$ corresponds to $10^{13.3}$ poise; $M_g$, $10^{11.0}$ poise; and $T_s$, $10^{7.65}$ poise. The crystallization tendency is determined from the crystallization starting temperature $T_{cry}$, the size of the exothermic peak by crystallization, i.e., its heating value. It can be said that it is glass with suppressed crystallization by increase of the temperature $T_{cry}$, i.e., increase of temperature difference between the temperature $T_s$ and the temperature $T_{cry}$, and reduction of the crystallization heating value.

The firing temperature upon sealing or bonding of various parts and formation of electrode/wiring or conductive/heat dissipation junction by using the conventional low-melting glass composition is influenced by type, content and particle diameter of the contained ceramic particles or metal particles, and further, by firing conditions and the like such as temperature rising rate, atmosphere, and pressure. Generally, the firing temperature is set to be higher than the softening point $T_s$ by about 30 to 50° C. in many cases. At this firing temperature, the low-melting glass composition has good softening liquidity without crystallization. However, in the lead-free glass composition according to the present invention, the characteristic temperatures such as the transition point $T_g$, the yield point $M_g$ and the softening point $T_s$ are remarkably lower than conventional. Further, as the respective temperature differences are small, i.e., the viscosity gradients are large, it is possible to obtain good softening liquidity by holding even a firing temperature around the softening point $T_s$. Further, even when the holding time is short, sufficient softening liquidity is obtained at a temperature higher than the softening point $T_s$ by barely about 20° C. The softening point $T_s$ of the lead-free glass composition according to the present invention is low, i.e., it is equal to or lower than 200° C. Accordingly, it is possible to perform firing at a use temperature equal to or lower than that of tin solder not containing lead or cadmium, more particularly, lower than the melting point of tin (231.9° C.), or preferably equal to or lower than 200° C.

(Glass Composite Material and Glass Paste)

The glass composite material contains the lead-free glass composition according to the present invention, and one or more of ceramic particles, metal particles, and resin.

Hereinbelow, the glass composite materials containing the ceramic particles, the metal particles, and resin will be respectively described.

It is preferable that the glass composite material containing the ceramic particles contains a lead-free glass composition equal to or greater than 40 volume % and less than 100 volume %, and the ceramic particles greater than 0 volume % and less than 60 volume %. When the lead-free glass composition is equal to or greater than 40 volume %, or that of the ceramic particles is equal to or less than 60 volume %, it is possible to obtain good softening liquidity. From the viewpoint of suppression of crystallization, the ceramic particles may preferably be at least any of zirconium phosphate tungstate ($Zr_2(WO_4)(FO_4)_2$), quartz glass ($SiO_2$), zirconium silicate ($ZrSiO_4$), alumina ($Al_2O_3$), mullite ($3Al_2O_3 \cdot 2SiO_2$), and niobium oxide ($Nb_2O_5$). Especially, the ceramic particle effectively used for low-temperature expansion of the glass composite material is a compound mainly of zirconium phosphate tungstate ($Zr_2(WO_4)(FO_4)_2$) or zirconium phosphate tungstate ($Zr_2(WO_4)(FO_4)_2$), and a preferable content of which is 30 volume % to 50 volume %.

It is preferable that the glass composite material containing the metal particles contains the lead-free glass composition equal to or greater than 5 volume % and less than 100 volume %, and the metal particles greater than 0 volume % and equal to or less than 95 volume %. As the lead-free glass composition is equal to or greater than 5 volume % or the metal particles is equal to or less than 95 volume %, it is possible to improve firing among the metal particles and bonding property to the base material. From the viewpoint of improvement of conductivity and heat dissipation, the metal particles may preferably be at least any of gold (Au), silver (Ag), a silver alloy, copper (Cu), a copper alloy, aluminum (Al), an aluminum alloy, tin (Sn), and a tin alloy. Especially, the metal particle effectively used for improvement of conductivity and heat dissipation of the glass composite material is silver (Ag) or aluminum (Al), and a preferable content of which is equal to or greater than 10 volume % and less than 90 volume %. The lead-free glass composition according to an embodiment of the present invention promotes firing of silver (Ag) particles, and further, eliminates a surface oxide film of aluminum (Al) particles.

The glass composite material containing resin contains the lead-free glass composition equal to or greater than 5 volume % and less than 100 volume %, and the resin greater than 0 volume % and equal to or less than 95 volume %. As the lead-free glass composition is equal to or greater than 5 volume % or the resin is equal to or less than 95 volume %, it is possible to effectively compound the lead-free glass composition and the resin. The resin may preferably be at least any of epoxy resin, phenoxy resin, phenol resin, acrylic resin, urethane resin, and fluororesin. It is possible to obtain good softening liquidity in the resin of the lead-free glass composition by using these resins.

The glass paste contains the glass composite material containing the lead-free glass composition and a solvent. As the solvent, it is preferable to use α-terpineol or butylcarbitol. These solvents are hardly crystallized in the lead-free glass composition. Further, it is possible to add a viscosity modifier, a wetting Agent or the like in accordance with necessity to adjust stability and coating property of the glass paste.

When sealing and/or bonding is performed in the sealing structure using the glass composite material containing the ceramic particles and its glass paste, it is preferable to provide or apply the glass composite material or the glass paste in the sealing position of the sealed member or the bonding position of the bonded member, and fire the position within a temperature range from a neighboring temperature of the softening point $T_s$ of the contained lead-free glass composition to a temperature higher than the softening point $T_s$ by about 20° C. As the lead-free glass composition having a reduced crystallization tendency and a low-temperature softening point is used in the glass composite material or the glass paste, it is possible to improve the softening liquidity at a low temperature and lower the firing temperature. With this configuration, it is possible to reduce the influence on the environmental load, and to attain reduction of thermal damage to the sealing structure (high functionality) and improvement of productivity (takt reduction). Further, as the lead-free glass composition according to another embodiment of the present invention has good chemical stability, it is possible to ensure the reliability of the sealing structure.

Further, when the glass composite material containing the metal particles and its glass paste is used for formation of electrodes/wirings and conductive junctions in an electrical/electronic component, it is preferable to provide or apply the glass composite material or the glass paste in a predetermined position of the base material or the like, and fire the position within a temperature range from a neighboring temperature of the softening point $T_s$ of the contained lead-free glass composition to a temperature higher than the softening point $T_s$ by about 20° C. Note that when the used metal particle is susceptible to oxidation, to prevent oxidation of the metal particle, it is desirable to prepare inert gas or vacuum environment as firing atmosphere. As the lead-free glass composition having a reduced crystallization tendency and a low-temperature softening point is used in the glass composite material or the glass paste, it is possible to improve the softening liquidity at a low temperature and lower the firing temperature. As a result, it is possible to lower the forming temperature of the electrodes/wirings and conductivity/heat dissipation junction, i.e., the firing temperature. With this configuration, it is possible to reduce the influence on the environmental load, and to attain reduction of thermal damage to the electrical/electronic component (high functionality) and improvement of productivity (takt reduction). Further, the lead-free glass composition according to another embodiment of the present invention has good chemical stability, accordingly, it is possible to ensure the reliability of the electrical/electronic component.

Further, when the glass composite material containing resin and its glass paste is used for formation of a coating film in a coated component, metals, ceramics or glass is effective as the base material. The glass composite material or the glass paste is provided or applied in a predetermined position of the base material, and the position is fired within a temperature range from a neighboring temperature of the softening point $T_s$ of the contained lead-free glass composition to a temperature higher than the softening point $T_s$ by about 20° C. As the lead-free glass composition having a reduced crystallization tendency and a low-temperature softening point is used in the glass composite material or the glass paste, it is possible to improve the softening liquidity at a low temperature and lower the firing temperature. With this configuration, it is possible to reduce the influence on the environmental load, and further, to improve the reliability in the coated component such as coating film adhesive property, thermal resistance, chemical stability and the like.

(Sealing Structure)

The glass composite material or the glass paste according to another embodiment of the present invention is preferably used for sealing in a vacuum insulation multilayer glass panel used as window glass or the like, a display panel such as a plasma display panel, an organic EL display panel, a fluorescent display tube or the like, and a package device such as a crystal oscillator, an IC package, a MEMS and the like. The sealing structure using the glass composite material or the glass paste is formed with inner space and glass composite material, and has a sealing part to partition at least a part of the border between the inner space and the outside. It is preferable that the content of the lead-free glass composition contained in the glass composite material forming the sealing part is equal to or greater than 50 volume %. Further, it is effective that the glass composite material contains ceramic particles.

(Electrical/Electronic Component)

The glass composite material or the glass paste according to another embodiment of the present invention is preferably used for formation of electrodes, wirings, a conductive junction and a heat dissipation junction in an electrical/electronic component such as a photovoltaic cell, an image display device, a multilayer capacitor, an inductor, a crystal oscillator, a resin wiring board, a light emitting diode (LED), a multilayer circuit board, or a semiconductor module. The electrical/electronic component formed with the glass composite material or the glass paste has electrodes, wirings, a conductive junction or a heat dissipation junction of the glass composite material. It is preferable that the content of the metal particles contained in the glass composite material forming the electrodes, the wirings, the conductive junction or the heat dissipation junction is equal to or greater than 50 volume %.

(Coated Component)

The glass composite material and the glass paste according to another embodiment of the present invention may be used as a coating material. The coated component formed with the glass composite material or the glass paste has members, and the coating film formed on the members. The member is a base material of metal, ceramic or glass, and the coating film contains the glass composite material according to the present invention.

It is effective that the glass composite material forming the coating film contains resin, and the content of the resin is equal to or greater than 50 volume %. As preferable examples of the coated component, an electric cable, a vehicle body, an airframe, a washing machine tub, a toilet stool, a bathtub tile and the like are given.

EXAMPLES

Hereinbelow, the invention will be described in more detail based on particular examples. Note that the present invention is not limited to the examples taken here but the invention includes their variations.

Example 1

In the present example, a lead-free glass composition containing oxides of silver (Ag), tellurium (Te), and vanadium (V) as main components, and further containing one or more oxides of yttrium (Y), lanthanum (La), cerium (Ce), erbium (Er), ytterbium (Yb), aluminum (Al), gallium (Ga), indium (In), iron (Fe), tungsten (W), and molybdenum (Mo), as additional components, is manufactured. The influence of the glass composition on glass properties was examined. Note that as the glass properties, a vitrification state, characteristic temperatures, softening liquidity, and chemical stability of the manufactured lead-free glass composition were evaluated.

(Manufacturing of Lead-Free Glass Composition)

Lead-free glass compositions A-01 to A-41 (examples) shown in Table 1 to be described later, and lead-free glass compositions B-01 to B-48 (comparative examples) shown in Table 2 were manufactured. The compositions shown in Table 1 and Table 2 are compound compositions upon manufacturing of glass. As starting materials of the main components, powders of $V_2O_5$ by Shinko Chemical Co., Ltd., $TeO_2$ by Kojundo Chemical Laboratory Co., Ltd., and $Ag_2O$ by FUJIFILM Wako Pure Chemical Corporation were used. Further, as starting materials of the additional components, powders of $Y_2O_3$, $La_2O_3$, $CeO_2$, $Er_2O_3$, $Yb_2O_3$, $Al_2O_3$, $Ga_2O_3$, $In_2O_3$, $Fe_2O_3$, $WO_3$, $MoO_3$, $BaCO_3$, and $P_2O_5$ all by Kojundo Chemical Laboratory Co., Ltd. were used.

The powder of the respective starting materials were subjected to weighing, compounding, and mixing such that the total amount was about 200 g, and the powders were fed to a quartz glass crucible. The quartz glass crucible in which the mixed material powders were fed was set in a glass melting furnace, and heated at a temperature rising rate of about 10° C./min up to 700 to 750° C. To uniform melt composition in the quartz glass crucible, the quartz glass crucible was held for 1 hour while the composition was being stirred with an alumina bar. Thereafter, the quartz glass crucible was taken out from the glass melting furnace. The melt was poured into a stainless mold previously heated to about 100° C., thus the lead-free glass compositions A-01 to A-41 as the examples and the lead-free glass compositions B-01 to B-48 as the comparative examples were respectively manufactured. Next, the manufactured lead-free glass compositions were pulverized to a size under 45 μm.

(Evaluation of Vitrification State)

The vitrification state of the manufactured lead-free glass compositions A-01 to A-41 and B-01 to B-48 was evaluated by using the glass powder. The evaluation was made as to whether or not the crystals were precipitated by X-ray diffraction. When the precipitation of the crystals was not observed, it was determined that the vitrification state was good, and evaluated as "accepted". On the other hand, when the precipitation of the crystals was observed, it was determined that the vitrification state was not uniform noncrystal state, and evaluated as "rejected".

(Evaluation of Characteristic Temperatures)

The characteristic temperatures of the manufactured lead-free glass compositions A-01 to A-41 and B-01 to B-48 were evaluated by using the glass powder, by differential thermal analysis (DTA). In the DTA, a macrocell type cell was used. About 500 mg glass powder was fed in the macrocell, and heated at a temperature rising rate of about 5° C./min in the atmosphere from a room temperature up to 300° C., and a DAT curve as shown in FIG. 1 was obtained. The transition point $T_g$, the yield point $M_g$ and the softening point $T_s$ were measured from the obtained DAT curve. Note that upon evaluation of the characteristic temperatures, regarding the lead-free glass composition with the "rejected" vitrification state, the DTA was not performed.

(Evaluation of Softening Liquidity)

The softening liquidity of the manufactured lead-free glass compositions A-01 to A-41 and B-01 to B-48 was evaluated by using the glass powder, by a button flow test of the manufactured molded powder compact. The molded powder compact was molded by using a metal mold and a hand press, on the condition of 1 ton/cm², to have a columnar shape with a diameter of about 10 mm and a height of about 5 mm. The molded powder compact set on an alumina ceramics substrate was introduced in an electric furnace. It was heated at a temperature rising rate of about 10° C./min in the atmosphere from a room temperature up to, 180° C., 190° C., 200° C., 210° C., and 220° C., respectively. It was held for 30 minutes, then cooled down, and the softening liquidity and crystallized state at the respective heating temperatures were evaluated. When the molded powder compact was not soften-liquidized but the shape was almost maintained, the state was determined as "x". When the glass powder forming the molded powder compact was softened, fired and contracted, and it had near roundness, the state was determined as "softened", and when it was melted, "fluidized". Further, when it was crystallized, "crystallized" was registered. The crystallization which inhibits the softening liquidity is not preferable. Upon evaluation of the softening liquidity, regarding the lead-free glass composition with the "rejected" vitrification state, the above-described button flow test was not performed.

(Evaluation of Chemical Stability)

The chemical stability of the manufactured lead-free glass compositions A-01 to A-41 and B-01 to B-48 was evaluated by a humidity resistance test and an acid resistance test. As a glass test piece, an about 10 to 20 mm cullet before pulverization was used. In the humidity resistance test, the cullet was left for 10 days on the conditions of 80° C. temperature and 90% humidity. Further, in the acid resistance test, the cullet was immersed in a 1N hydrochloric acid aqueous solution at room temperature for 3 days. After the both tests, the outer appearance of the cullet was visually observed. When there was no change in the outer appearance, it was determined as "accepted". On the other hand, when a change was found, it was determined as "rejected". Note that when similar humidity resistance test and acid resistance test were performed on the conventional lead-containing low-melting glass composition (84PbO-13$B_2O_3$-2$SiO_2$-1$Al_2O_3$ mass %), in which the transition point $T_g$ is 313° C., the yield point $M_g$ is 332° C., and the softening point $T_s$ is 386° C., the evaluation was "rejected" in the both tests. Upon evaluation of the chemical stability, regarding the lead-free glass composition with the "rejected" vitrification state, the above-described humidity resistance test and acid resistance test were not performed.

Table 1 and Table 2 show the result of evaluation of the vitrification state, the characteristic temperatures, the softening liquidity, and the chemical stability of the lead-free glass compositions A-01 to A-41 according to the example and the lead-free glass compositions B-01 to B-48 as the comparative examples. In Table 1 and Table 2, the unit of the main component and subcomponent values is mol %.

TABLE 1

| Glass No. | Main Component | | | Subcomponent | Vitrification State Accepted | Characteristic Temperature (° C.) | | |
|---|---|---|---|---|---|---|---|---|
| | $Ag_2O$ | $TeO_2$ | $V_2O_6$ | | | Transition Point $T_g$ | Yield Point $M_g$ | Softening Point $T_g$ |
| A-01 | 49.9 | 25.0 | 25.0 | $La_2O_3$: 0.1 | Accepted | 131 | 142 | 170 |
| A-02 | 49.7 | 25.0 | 25.0 | $La_2O_3$: 0.3 | Accepted | 134 | 145 | 174 |
| A-03 | 49.5 | 25.0 | 25.0 | $La_2O_3$: 0.5 | Accepted | 138 | 148 | 177 |
| A-04 | 46.0 | 30.0 | 23.5 | $Y_2O_3$: 0.5 | Accepted | 145 | 155 | 189 |
| A-05 | 46.0 | 30.0 | 23.5 | $La_2O_3$: 0.5 | Accepted | 146 | 158 | 187 |
| A-06 | 46.0 | 30.0 | 23.5 | $Al_2O_3$: 0.5 | Accepted | 148 | 160 | 189 |
| A-07 | 45.7 | 30.0 | 24.0 | $Y_2O_3$: 0.3 | Accepted | 141 | 151 | 184 |
| A-08 | 45.7 | 30.0 | 24.0 | $La_2O_3$: 0.3 | Accepted | 142 | 153 | 182 |
| A-09 | 45.7 | 30.0 | 24.0 | $CeO_3$: 0.3 | Accepted | 144 | 150 | 181 |
| A-10 | 45.7 | 30.0 | 24.0 | $Er_2O_3$: 0.3 | Accepted | 143 | 149 | 183 |
| A-11 | 45.7 | 30.0 | 24.0 | $Yb_2O_3$: 0.3 | Accepted | 145 | 154 | 185 |
| A-12 | 45.7 | 30.0 | 24.0 | $Al_2O_3$: 0.3 | Accepted | 146 | 155 | 186 |
| A-13 | 45.7 | 30.0 | 24.0 | $Ga_2O_3$: 0.3 | Accepted | 145 | 153 | 185 |
| A-14 | 45.7 | 30.0 | 24.0 | $In_2O_3$: 0.3 | Accepted | 144 | 151 | 184 |
| A-15 | 45.7 | 30.0 | 24.0 | $Fe_2O_3$: 0.3 | Accepted | 145 | 155 | 186 |
| A-16 | 45.7 | 30.0 | 24.0 | $WO_3$: 0.3 | Accepted | 144 | 149 | 181 |
| A-17 | 45.7 | 30.0 | 24.0 | $MoO_3$: 0.3 | Accepted | 141 | 147 | 178 |
| A-18 | 45.5 | 30.0 | 23.0 | $La_2O_3$: 0.5, $WO_3$: 1.0 | Accepted | 148 | 161 | 190 |
| A-19 | 45.0 | 31.0 | 23.0 | $La_2O_3$: 0.5, $Al_2O_3$: 0.5 | Accepted | 147 | 159 | 189 |
| A-20 | 45.0 | 31.0 | 23.0 | $Y_2O_3$: 0.5, $La_2O_3$: 0.5, | Accepted | 146 | 156 | 188 |
| A-21 | 45.0 | 30.0 | 23.0 | $La_2O_3$: 0.5, $WO_3$: 1.5 | Accepted | 150 | 160 | 191 |
| A-22 | 45.0 | 29.5 | 23.0 | $La_2O_3$: 0.5, $WO_3$: 2.0 | Accepted | 151 | 164 | 193 |
| A-23 | 45.0 | 31.7 | 23.0 | $La_2O_3$: 0.3 | Accepted | 145 | 155 | 186 |
| A-24 | 45.0 | 31.0 | 23.0 | $La_2O_3$: 1.0 | Accepted | 147 | 156 | 188 |
| A-25 | 45.0 | 30.0 | 23.0 | $La_2O_3$: 1.5 | Accepted | 149 | 158 | 190 |
| A-26 | 45.0 | 29.5 | 23.5 | $La_2O_3$: 2.0 | Accepted | 155 | 167 | 199 |
| A-27 | 44.5 | 29.0 | 23.0 | $La_2O_3$: 0.5, $MoO_3$: 3.0 | Accepted | 155 | 169 | 196 |
| A-28 | 44.0 | 29.5 | 23.0 | $La_2O_3$: 0.5, $WO_3$: 3.0 | Accepted | 157 | 172 | 200 |
| A-29 | 44.0 | 32.0 | 23.0 | $La_2O_3$: 1.0 | Accepted | 156 | 170 | 197 |
| A-30 | 44.0 | 31.5 | 23.0 | $La_2O_3$: 0.5, $Al_2O_3$: 0.5, $WO_3$: 0.5 | Accepted | 153 | 164 | 198 |
| A-31 | 44.0 | 31.5 | 23.0 | $Y_2O_3$: 0.5, $La_2O_3$: 0.5, $WO_3$: 0.5 | Accepted | 151 | 165 | 196 |
| A-32 | 43.0 | 32.0 | 23.0 | $La_2O_3$: 2.0 | Accepted | 158 | 167 | 195 |
| A-33 | 42.5 | 35.0 | 22.0 | $La_2O_3$: 0.5 | Accepted | 152 | 165 | 195 |
| A-34 | 42.0 | 32.0 | 23.0 | $La_2O_3$: 3.0 | Accepted | 156 | 164 | 192 |
| A-35 | 41.5 | 35.0 | 22.0 | $Y_2O_3$: 0.5, $WO_3$: 1.0 | Accepted | 153 | 166 | 197 |
| A-36 | 41.0 | 36.5 | 21.0 | $Al_2O_3$: 0.5, $WO_3$: 1.0 | Accepted | 151 | 165 | 199 |
| A-37 | 40.5 | 37.0 | 22.0 | $La_2O_3$: 0.5 | Accepted | 155 | 169 | 200 |
| A-38 | 40.0 | 30.0 | 29.5 | $La_2O_3$: 0.5 | Accepted | 152 | 166 | 198 |
| A-39 | 40.0 | 37.0 | 20.0 | $WO_3$: 3.0 | Accepted | 156 | 170 | 199 |
| A-40 | 40.0 | 30.0 | 29.5 | $Y_2O_3$: 0.5 | Accepted | 153 | 167 | 195 |
| A-41 | 40.0 | 30.0 | 29.7 | $La_2O_3$: 0.3 | Accepted | 149 | 162 | 194 |

| Glass No. | Softening Liquidity | | | | | Chemical Stability | |
|---|---|---|---|---|---|---|---|
| | 180° C. | 190° C. | 200° C. | 210° C. | 220° C. | Humidity Resistance | Acid Resistance |
| A-01 | Fluidized | Fluidized | Fluidized | Crystallized | Crystallized | Accepted | Accepted |
| A-02 | Fluidized | Fluidized | Fluidized | Fluidized | Fluidized | Accepted | Accepted |
| A-03 | Fluidized | Fluidized | Fluidized | Fluidized | Fluidized | Accepted | Accepted |
| A-04 | Fluidized | Fluidized | Fluidized | Fluidized | Fluidized | Accepted | Accepted |
| A-05 | Fluidized | Fluidized | Fluidized | Fluidized | Fluidized | Accepted | Accepted |
| A-06 | Fluidized | Fluidized | Fluidized | Fluidized | Fluidized | Accepted | Accepted |
| A-07 | Fluidized | Fluidized | Fluidized | Fluidized | Fluidized | Accepted | Accepted |
| A-08 | Fluidized | Fluidized | Fluidized | Fluidized | Fluidized | Accepted | Accepted |
| A-09 | Fluidized | Fluidized | Fluidized | Fluidized | Fluidized | Accepted | Accepted |

TABLE 1-continued

| | | | | | | | |
|---|---|---|---|---|---|---|---|
| A-10 | Fluidized | Fluidized | Fluidized | Fluidized | Fluidized | Accepted | Accepted |
| A-11 | Fluidized | Fluidized | Fluidized | Fluidized | Fluidized | Accepted | Accepted |
| A-12 | Fluidized | Fluidized | Fluidized | Fluidized | Fluidized | Accepted | Accepted |
| A-13 | Fluidized | Fluidized | Fluidized | Fluidized | Fluidized | Accepted | Accepted |
| A-14 | Fluidized | Fluidized | Fluidized | Fluidized | Fluidized | Accepted | Accepted |
| A-15 | Fluidized | Fluidized | Fluidized | Fluidized | Fluidized | Accepted | Accepted |
| A-16 | Fluidized | Fluidized | Fluidized | Fluidized | Fluidized | Accepted | Accepted |
| A-17 | Fluidized | Fluidized | Fluidized | Fluidized | Fluidized | Accepted | Accepted |
| A-18 | Fluidized | Fluidized | Fluidized | Fluidized | Fluidized | Accepted | Accepted |
| A-19 | Fluidized | Fluidized | Fluidized | Fluidized | Fluidized | Accepted | Accepted |
| A-20 | Fluidized | Fluidized | Fluidized | Fluidized | Fluidized | Accepted | Accepted |
| A-21 | Softened | Fluidized | Fluidized | Fluidized | Fluidized | Accepted | Accepted |
| A-22 | Softened | Fluidized | Fluidized | Fluidized | Fluidized | Accepted | Accepted |
| A-23 | Fluidized | Fluidized | Fluidized | Fluidized | Fluidized | Accepted | Accepted |
| A-24 | Fluidized | Fluidized | Fluidized | Fluidized | Fluidized | Accepted | Accepted |
| A-25 | Fluidized | Fluidized | Fluidized | Fluidized | Fluidized | Accepted | Accepted |
| A-26 | Softened | Softened | Fluidized | Fluidized | Fluidized | Accepted | Accepted |
| A-27 | Softened | Softened | Fluidized | Fluidized | Fluidized | Accepted | Accepted |
| A-28 | Softened | Softened | Fluidized | Fluidized | Fluidized | Accepted | Accepted |
| A-29 | Softened | Softened | Fluidized | Fluidized | Fluidized | Accepted | Accepted |
| A-30 | Softened | Softened | Fluidized | Fluidized | Fluidized | Accepted | Accepted |
| A-31 | Softened | Softened | Fluidized | Fluidized | Fluidized | Accepted | Accepted |
| A-32 | Softened | Fluidized | Fluidized | Fluidized | Fluidized | Accepted | Accepted |
| A-33 | Softened | Fluidized | Fluidized | Fluidized | Fluidized | Accepted | Accepted |
| A-34 | Softened | Fluidized | Fluidized | Fluidized | Fluidized | Accepted | Accepted |
| A-35 | Softened | Softened | Fluidized | Fluidized | Fluidized | Accepted | Accepted |
| A-36 | Softened | Softened | Fluidized | Fluidized | Fluidized | Accepted | Accepted |
| A-37 | Softened | Softened | Fluidized | Fluidized | Fluidized | Accepted | Accepted |
| A-38 | Softened | Softened | Fluidized | Fluidized | Fluidized | Accepted | Accepted |
| A-39 | Softened | Softened | Fluidized | Fluidized | Fluidized | Accepted | Accepted |
| A-40 | Softened | Fluidized | Fluidized | Fluidized | Fluidized | Accepted | Accepted |
| A-41 | Softened | Fluidized | Fluidized | Fluidized | Fluidized | Accepted | Accepted |

TABLE 2

| Glass No. | Main Component | | | | Vitrification State | Characteristic Temperature | | |
|---|---|---|---|---|---|---|---|---|
| | $Ag_2O$ | $TeO_2$ | $V_2O_6$ | Subcomponent | | Transition Point $T_g$ | Yield Point $M_g$ | Softening Point $T_s$ |
| B-01 | 45.0 | 40.0 | 15.0 | — | Rejected | — | — | — |
| B-02 | 42.7 | 40.0 | 17.0 | $La_2O_3$: 0.3 | Rejected | — | — | — |
| B-03 | 41.0 | 39.0 | 19.0 | $Y_2O_3$: 1.0 | Rejected | — | — | — |
| B-04 | 40.0 | 40.0 | 20.0 | — | Accepted | 156 | 170 | 204 |
| B-05 | 39.0 | 39.0 | 20.0 | $P_2O_3$: 2.0 | Accepted | 160 | 181 | 213 |
| B-06 | 38.0 | 39.0 | 20.0 | $La_2O_3$: 3.0 | Rejected | — | — | — |
| B-07 | 38.0 | 38.0 | 21.0 | BaO: 3.0, $WO_3$: 1.0 | Accepted | 167 | 182 | 216 |
| B-08 | 37.0 | 40.0 | 20.0 | BaO: 1.0, $La_2O_3$: 1.0, $WO_3$: 1.0 | Accepted | 170 | 187 | 219 |
| B-09 | 36.0 | 40.0 | 20.0 | BaO: 1.0, $Fe_2O_3$: 1.0, $WO_3$: 1.0 | Accepted | 169 | 186 | 216 |
| B-10 | 36.0 | 38.5 | 20.0 | BaO: 5.0, $La_2O_3$: 0.5 | Accepted | 169 | 185 | 221 |
| B-11 | 36.0 | 38.5 | 20.0 | $WO_3$: 5.0, $La_2O_3$: 0.5 | Accepted | 176 | 191 | 226 |
| B-12 | 36.0 | 38.0 | 20.0 | BaO: 5.0, $WO_3$: 1.0 | Accepted | 170 | 185 | 219 |
| B-13 | 36.0 | 38.0 | 20.0 | BaO: 5.0, $Y_2O_3$: 0.3, $WO_3$: 0.7 | Accepted | 168 | 186 | 222 |
| B-14 | 36.0 | 38.0 | 20.0 | BaO: 5.0, $La_2O_3$: 0.3, $WO_3$: 0.7 | Accepted | 168 | 189 | 220 |
| B-15 | 36.0 | 38.0 | 20.0 | BaO: 5.0, $CeO_2$: 0.3, $WO_3$: 0.7 | Accepted | 170 | 184 | 219 |
| B-16 | 36.0 | 38.0 | 20.0 | BaO: 5.0, $Er_2O_3$: 0.3, $WO_3$: 0.7 | Accepted | 169 | 185 | 221 |
| B-17 | 36.0 | 38.0 | 20.0 | BaO: 5.0, $Yb_2O_3$: 0.3, | Accepted | 170 | 187 | 222 |

TABLE 2-continued

| Glass No. | | | | | | | | |
|---|---|---|---|---|---|---|---|---|
| B-18 | 36.0 | 38.0 | 20.0 | BaO: 5.0, Al₂O₃: 0.3, WO₃: 0.7 | Accepted | 171 | 187 | 223 |
| B-19 | 36.0 | 38.0 | 20.0 | BaO: 5.0, Ga₂O₃: 0.3, WO₃: 0.7 | Accepted | 169 | 186 | 222 |
| B-20 | 36.0 | 38.0 | 20.0 | BaO: 5.0, In₃O₃: 0.3, WO₃: 0.7 | Accepted | 169 | 184 | 221 |
| B-21 | 36.0 | 38.0 | 20.0 | BaO: 5.0, Fe₂O₃: 0.3, WO₃: 0.7 | Accepted | 170 | 187 | 222 |
| B-22 | 35.0 | 40.0 | 20.0 | — | Accepted | 173 | 185 | 218 |
| B-23 | 35.0 | 40.0 | 20.0 | BaO: 5.0 | Accepted | 176 | 196 | 231 |
| B-24 | 35.0 | 40.0 | 20.0 | MoO₃: 5.0, | Accepted | 185 | 200 | 235 |
| B-25 | 35.0 | 40.0 | 20.0 | WO₃: 5.0 | Accepted | 184 | 209 | 241 |
| B-26 | 35.0 | 40.0 | 20.0 | BaO: 4.0, La₂O₃: 1.0 | Accepted | 175 | 192 | 223 |
| B-27 | 35.0 | 37.5 | 20.0 | BaO: 5.0, La₂O₃: 0.5, WO₃: 2.0 | Accepted | 174 | 196 | 231 |
| B-28 | 33.0 | 36.5 | 20.0 | BaO: 5.0, La₂O₃: 0.5, WO₃: 5.0 | Accepted | 185 | 207 | 239 |
| B-29 | 32.0 | 36.0 | 20.0 | BaO: 6.0, La₂O₃: 1.0, WO₃: 5.0 | Accepted | 190 | 212 | 247 |
| B-30 | 31.0 | 41.5 | 21.0 | La₂O₃: 2.0, WO₃: 5.0 | Accepted | 194 | 216 | 252 |
| B-31 | 31.0 | 37.5 | 17.5 | BaO: 3.0, P₂O₃: 6.0, WO₃: 5.0 | Accepted | 207 | 226 | 263 |
| B-32 | 30.0 | 40.0 | 30.0 | — | Accepted | 188 | 199 | 234 |
| B-33 | 30.0 | 40.0 | 20.0 | BaO: 10.0 | Accepted | 180 | 213 | 249 |
| B-34 | 30.0 | 40.0 | 20.0 | MoO₃: 10.0 | Accepted | 204 | 222 | 255 |
| B-35 | 30.0 | 40.0 | 20.0 | WO₃: 10.0 | Accepted | 211 | 213 | 268 |
| B-36 | 30.0 | 40.0 | 20.0 | BaO: 5.0, WO₃: 5.0 | Accepted | 191 | 208 | 242 |
| B-37 | 30.0 | 40.0 | 20.0 | La₂O₃: 1.0, WO₃: 5.0 | Accepted | 203 | 221 | 258 |
| B-38 | 30.0 | 40.0 | 20.0 | La₂O₃: 3.0, WO₃: 7.0 | Accepted | 204 | 230 | 265 |
| B-39 | 30.0 | 39.5 | 20.0 | BaO: 5.0, La₂O₃: 0.5, WO₃: 5.0 | Accepted | 190 | 212 | 245 |
| B-40 | 30.0 | 39.5 | 20.0 | P₂O₃: 5.0, Fe₂O₃: 0.5, WO₃: 5.0 | Accepted | 205 | 222 | 256 |
| B-41 | 30.0 | 38.0 | 25.0 | WO₃: 7.0 | Accepted | 203 | 222 | 256 |
| B-42 | 30.0 | 37.7 | 20.0 | BaO: 5.0, Al₂O₃: 0.3, WO₃: 7.0 | Accepted | 202 | 228 | 263 |
| B-43 | 30.0 | 37.5 | 20.0 | Al₂O₃: 0.3, WO₃: 7.0, MoO₃: 5.0 | Accepted | 211 | 232 | 266 |
| B-44 | 30.0 | 37.0 | 20.0 | BaO: 6.5, La₂O₃: 0.5, WO₃: 6.0 | Accepted | 207 | 229 | 263 |
| B-45 | 30.0 | 35.0 | 20.0 | BaO: 10.0, WO₃: 5.0 | Accepted | 194 | 216 | 246 |
| B-46 | 30.0 | 30.0 | 20.0 | BaO: 5.0, P₂O₅: 5.0 | Accepted | 224 | 247 | 287 |
| B-47 | 25.0 | 40.0 | 35.0 | — | Accepted | 201 | 214 | 248 |
| B-48 | 24.0 | 42.7 | 20.0 | BaO: 8.0, La₂O₃: 0.3, WO₃: 5.0 | Accepted | 209 | 229 | 265 |

| Glass No. | Softening Liquidity | | | | | Chemical Stability | |
|---|---|---|---|---|---|---|---|
| | 180° C. | 190° C. | 200° C. | 210° C. | 220° C. | Humidity Resistance | Acid Resistance |
| B-01 | — | — | — | — | — | — | — |
| B-02 | — | — | — | — | — | — | — |
| B-03 | — | — | — | — | — | — | — |
| B-04 | x | x | x | Softened | Crystallized | Accepted | Accepted |

TABLE 2-continued

| | | | | | | | |
|---|---|---|---|---|---|---|---|
| B-05 | x | x | x | Softened | Softened | Accepted | Accepted |
| B-06 | — | — | — | — | — | — | — |
| B-07 | x | x | x | Softened | Softened | Accepted | Accepted |
| B-08 | x | x | x | x | Softened | Accepted | Accepted |
| B-09 | x | x | x | x | Softened | Accepted | Accepted |
| B-10 | x | x | x | | Softened | Accepted | Accepted |
| B-11 | x | x | x | x | Softened | Accepted | Accepted |
| B-12 | x | x | x | x | Softened | Accepted | Accepted |
| B-13 | x | x | x | x | Softened | Accepted | Accepted |
| B-14 | x | x | x | x | Softened | Accepted | Accepted |
| B-15 | x | x | x | x | Softened | Accepted | Accepted |
| B-16 | x | x | x | x | Softened | Accepted | Accepted |
| B-17 | x | x | x | x | Softened | Accepted | Accepted |
| B-18 | x | x | x | x | Softened | Accepted | Accepted |
| B-19 | x | x | x | x | Softened | Accepted | Accepted |
| B-20 | x | x | x | x | Softened | Accepted | Accepted |
| B-21 | x | x | x | x | Softened | Accepted | Accepted |
| B-22 | x | x | x | Softened | Softened | Accepted | Accepted |
| B-23 | x | x | x | x | x | Accepted | Accepted |
| B-24 | x | x | x | x | x | Accepted | Accepted |
| B-25 | x | x | x | x | x | Accepted | Accepted |
| B-26 | x | x | x | x | Softened | Accepted | Accepted |
| B-27 | x | x | x | x | x | Accepted | Accepted |
| B-28 | x | x | x | x | x | Accepted | Accepted |
| B-29 | x | x | x | x | x | Accepted | Accepted |
| B-30 | x | x | x | x | x | Accepted | Accepted |
| B-31 | x | x | x | x | x | Accepted | Accepted |
| B-32 | x | x | x | x | x | Accepted | Accepted |
| B-33 | x | x | x | x | x | Accepted | Accepted |
| B-34 | x | x | x | x | x | Accepted | Accepted |
| B-35 | x | x | x | x | x | Accepted | Accepted |
| B-36 | x | x | x | x | x | Accepted | Accepted |
| B-37 | x | x | x | x | x | Accepted | Accepted |
| B-38 | x | x | x | x | x | Accepted | Accepted |
| B-39 | x | x | x | x | x | Accepted | Accepted |
| B-40 | x | x | x | x | x | Accepted | Accepted |
| B-41 | x | x | x | x | x | Accepted | Accepted |
| B-42 | x | x | x | x | x | Accepted | Accepted |
| B-43 | x | x | x | x | x | Accepted | Accepted |
| B-44 | x | x | x | x | x | Accepted | Accepted |
| B-45 | x | x | x | x | x | Accepted | Accepted |
| B-46 | x | x | x | x | x | Accepted | Accepted |
| B-47 | x | x | x | x | x | Accepted | Accepted |
| B-48 | x | x | x | x | x | Accepted | Accepted |

The vitrification state of the glass compositions B-01 to B-03 and B-06 as the comparative examples was "rejected" since the metal Ag and the like were precipitated. The vitrification state of other glass compositions (examples A-01 to A-41, and the comparative examples B-4, B-5 and B-7 to B-48) than the glass compositions B-01 to B-03 and B-06 was good and "accepted". Further, it was found that these lead-free glass compositions as the examples and the comparative examples have both "accepted" humidity resistance and acid resistance i.e. have excellent chemical stability. However, the softening point $T_s$ of the lead-free glass compositions B-4, B-5 and B-7 to B-48 was higher than 200° C. Further, the glass composition B-04 is an easily-crystallized glass composition. Accordingly, the softening liquidity of the glass compositions B-4, B-5 and B-7 to B-48 within a temperature range of 180 to 220° C. was not "fluidized" but "softened" at best. Further, none of these lead-free glass composition as comparative examples was "softened" at or lower than 200° C.

On the other hand, all the lead-free glass compositions A-01 to A-41 as the examples have low softening point $T_s$ equal to or lower than 200° C., and good softening liquidity was obtained at or lower than 220° C. In the example A-01, the softening liquidity at 180 to 200° C. was "fluidized", however, at higher temperatures of 210° C. and 220° C., surface devitrification due to crystallization which inhibits "fluidized" was observed. It is considered that this occurred since the content of $La_2O_3$ as the additional component was small. In the other examples A-02 to A-41, this surface devitrification was not observed. These examples had a glossy surface, and the crystallization tendency at 210° C. and 220° C. was prevented or suppressed. Further, in the examples A-02 to A-41, the softening liquidity at 210° C. and 220° C. was "fluidized" and was good evaluation result. Further, in all the examples A-01 to A-41, the softening liquidity at 200° C. was "fluidized". Above all, in the examples A-01 to A-25, A-32 to A-34, A-40 and A-41, the softening liquidity at 190° C. was also "fluidized", and in the examples A-01 to A-20 and A-23 to A-25, the softening liquidity at 180° C. was also "fluidized". It was found that these examples have excellent softening liquidity at or lower than 200° C. With these results, a glass composition having use temperature equal to or lower than that of tin solder not containing lead or cadmium, more specifically, having good softening liquidity at a temperature lower than the melting point of tin (231.9° C.) or preferably equal to or lower than 200° C., was realized. Further, different from the above-described tin solder, the firing atmosphere is not limited, and heating is possible in various atmospheres. Further, it can be bonded to various materials such as ceramics, glass, metals, semiconductors, thermal resistance resin and the like.

As described above, it was found that an effective glass composition contains $Ag_2O$, $TeO_2$, and $V_2O_5$ as main components, and further, contains at least one of $Y_2O_3$, $La_2O_3$, $CeO_2$, $Er_2O_3$, $Yb_2O_3$, $Al_2O_3$, $Ga_2O_3$, $In_2O_3$, $Fe_2O_3$, $WO_3$ and $MoO_3$ by a small amount, as an additional component, and the contents of the main components are, represented by mol %, $Ag_2O>TeO_2 \geq V_2O_5$ and $Ag_2O \leq 2V_2O_5$, and the content of $TeO_2$ is 25 mol % to 37 mol %. More preferably, the content of $Ag_2O$ was equal to or greater than 40 mol % and less than 50 mol % and the content of $V_2O_5$ was equal to or greater than 20 mol % and less than 30 mol %. Further, the content of the above-described additional component was, when calculated in terms of the oxides as shown below, 0.1 mol % to 3.5 mol %. Further, as the above-described additional component, one or more of $Y_2O_3$, $La_2O_3$, and $Al_2O_3$ are preferable, and it was effective that the content was, represented by mol %, $Ag_2O+Ln_2O_3 \leq 2V_2O_5$ (Ln: Y, La, Al). Further, an especially preferable content of additional component was, when calculated in terms of the oxides as described above, 0.3 mol % to 1.5 mol %.

In the lead-free glass composition in the above-described effective composition range, the softening point $T_s$ as the second endothermic peak temperature by the differential thermal analysis was equal to or lower than 200° C.

In the following example, the above-described glass composite material, glass paste, a sealing structure, an electrical/electronic component, and a coated component, containing the lead-free glass composition according to the embodiment of the present invention, will be described respectively particularly.

Example 2

In an example 2, the same type metal base materials, glass base materials, and ceramic base materials were bonded, using the glass composite material containing the lead-free glass composition and the ceramic particles, and the bonded states, represented as shear stress, were evaluated. As the lead-free glass composition, the two types of compositions, A-05 and A-22 shown in Table 1, and as the ceramic particles, seven types of ceramic particles shown in Table 3 (CF-01 to CF-07) were used. Note that Table 3 also shows densities and thermal expansion coefficients of these ceramic particles. With respect to these values, the density of the lead-free glass composition shown in Table 1 was about 6 g/cm³, and the thermal expansion coefficient was within a range of about $180 \times 10^{-7}$ to $200 \times 10^{-7}/°$ C. Further, as the metal base materials, aluminum (Al), silver (Ag), copper (Cu), nickel (Ni), and iron (Fe) were used, and as the glass base material, soda lime glass was used, and further, as the ceramic substrate, alumina ($Al_2O_3$) was used. As an evaluation sample, first, glass paste containing the lead-free glass composition particles, the ceramic particles, and a solvent was manufactured. The paste was applied to the respective base materials, and the base materials were subjected to drying and temporary firing. Then the base materials were attached to each other and heated, thus the base materials were bonded.

TABLE 3

| No. | Ceramic Particle | Density (g/cm³) | Thermal Expansion Coefficient (×10⁻⁷/° C.) |
|---|---|---|---|
| CF-01 | Zirconium phosphate tungstate $Zr_2(WO_4)(PO_4)_2$ | 3.8 | −32 |
| CF-02 | zirconium phosphate tungstate microcontaining iron tungstate $Zr_2(WO_4)(PO_4)_2$ microcontaining $FeWO_4$ | 3.8 | −30 |
| CF-03 | Quartz glass $SiO_2$ | 2.2 | 5 |
| CF-04 | Zirconium silicate $ZrSiO_2$ | 4.6 | 45 |
| CF-05 | Alumina $Al_2O_3$ | 4.0 | 81 |
| CF-06 | Mullite $3Al_2O_3 \cdot 2SiO_2$ | 3.2 | 33 |
| CF-07 | Niobium oxide $Nb_2O_5$ | 4.6 | 12 |

(Manufacturing of Glass Paste)

The glass paste was manufactured by compounding and mixing the lead-free glass composition particles, the ceramic particles, and the solvent. As the lead-free glass composition particles, the glass compositions A-05 and A-22 having a particle diameter of about 10 μm were used, and as the ceramic particles, zirconium phosphate tungstate (CF-01) having a particle diameter of about 10 to 30 μm, zirconium phosphate tungstate microcontaining iron tungstate (CF-02), quartz glass (CF-03), zirconium silicate (CF-04), alumina (CF-05), mullite (CF-06), and niobium oxide (CF-07) were used. Upon heat-firing in an inert gas or vacuum environment, α-terpineol was used as the solvent, and isobonyl cyclohexanol was added as a viscosity modifier. Further, upon firing in the atmosphere, butylcarbitol acetate was used as the solvent, and ethylcellulose was used as a resin binder. The respective glass pastes were manufactured, at eight compounding ratios between the lead-free glass composition particles and the ceramic particles, represented by volume %, 100:0, 90:10, 80:20, 70:30, 60:40, 50:50, 40:60, and 30:70. Further, the content of solid in the glass paste (sum of the lead-free glass composition particles and the ceramic particles) was about 75 to 80 mass %.

(Manufacturing of Evaluation Sample)

Figure 2:
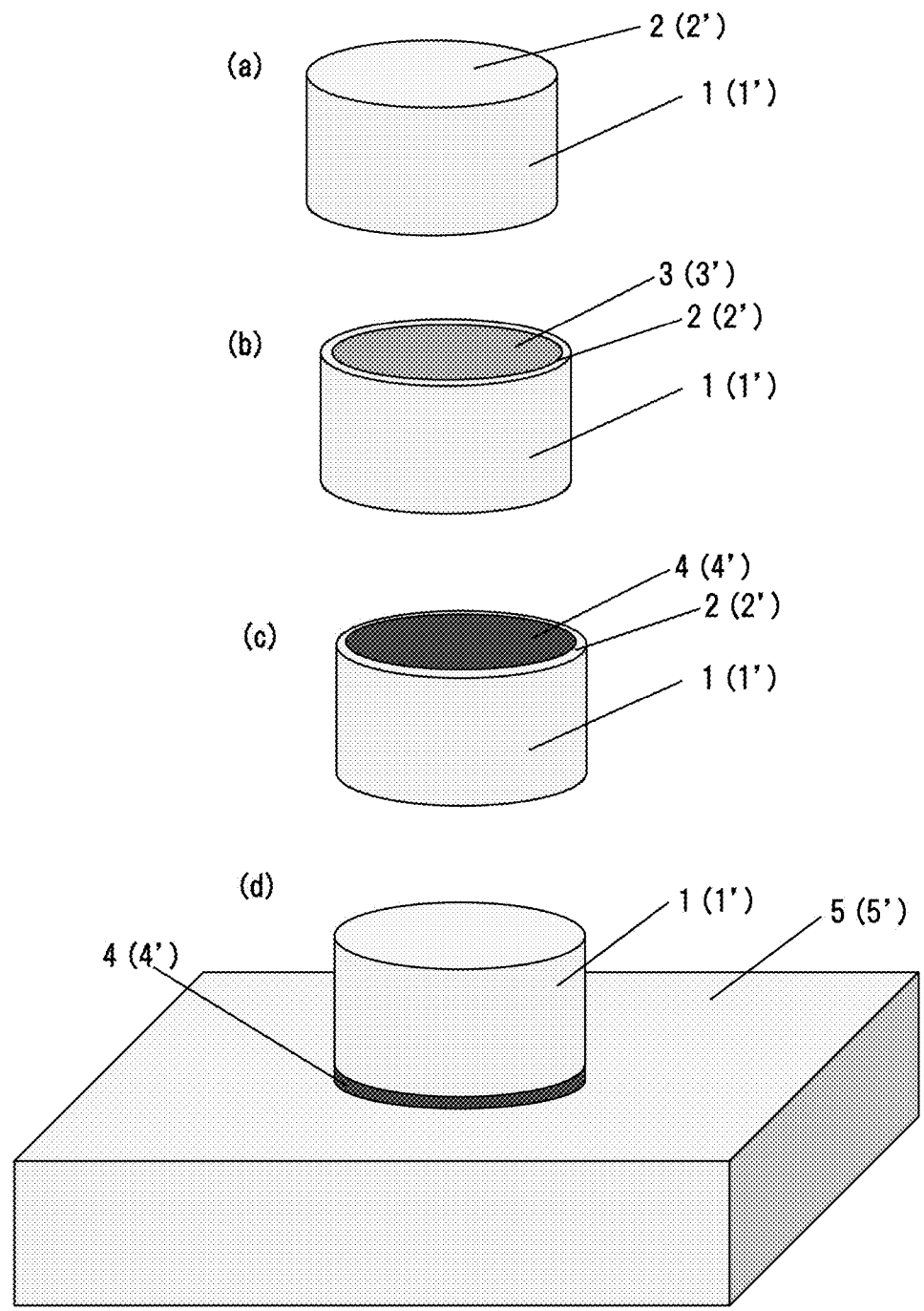
FIG. 2 is a schematic diagram showing a bonded body manufacturing method for measurement of shear stress.

FIG. 2 shows a manufacturing method of the evaluation sample. First, a columnar base material 1 with a bonded surface 2, having a diameter of 5 mm and a thickness of 2 mm, was prepared (a). Next, glass paste 3 was applied to the bonded surface 2 of the columnar base material 1 by the dispenser method (b).

Thereafter, the base material 1 was dried for 30 minutes at 150° C. in the atmosphere. Then, by setting the base material 1 in the electric furnace, heating it at a temperature rising rate of 10° C./min in the inert gas (in nitrogen) or in the atmosphere up to 200° C., and holding it for 15 minutes, the glass composite material 4 was formed on the bonded surface 2 of the columnar base material 1 (c).

The bonded body was manufactured by setting the base material 1 on the same type of plate base material 5 having a thickness of 1 to 3 mm, holding it with a thermal resistant clip, heating it at a temperature rising rate of 10° C./min in the inert gas (in nitrogen) or in the atmosphere up to 190° C., and holding it for 30 minutes (d).

The shear stress was measured with this bonded body. Note that when copper (Cu) and iron (Fe) were used as the base materials, the heating atmosphere was the inert gas (in nitrogen), and in other cases, the heating was performed in the atmosphere. Further, in consideration of the thermal expansion coefficient of the base material, the compounding ratio between the lead-free glass composition particles and the ceramic particles in the glass paste and the type of the ceramic particles were selected. The thermal expansion coefficients of the used base materials were as follows. The expansion coefficient of aluminum (Al) was $224\times10^{-7}/°$ C.; silver (Ag), $197\times10^{-7}/°$ C.; copper (Cu), $164\times10^{-7}/°$ C.; nickel (Ni), $133\times10^{-7}/°$ C.; iron (Fe), $127\times10^{-7}/°$ C.; soda lime glass, $88\times10^{-7}/°$ C.; and alumina ($Al_2O_3$), $81\times10^{-7}/°$ C.

(Evaluation of Bonded State)

The shear stress was evaluated in the bonded bodies manufactured by using the respective types of glass pastes. The evaluation of shear stress was determined as "excellent" when it was equal to or higher than 30 MPa; "good" when it was 20 to 30 MPa; "normal" when it was 10 to 20 MPa; and "rejected" when it was lower than 10 Mpa.

Tables 4 to 10 show the results of the evaluation of the shear stress of the bonded bodies in the respective base materials. Table 4 shows the evaluation results of the bonded body using the aluminum (Al) base materials; Table 5, the evaluation results of the bonded body using the silver (Ag) base materials; Table 6, the evaluation results of the bonded body using the copper (Cu) base materials; Table 7, the evaluation results of the bonded body using the nickel (Ni) base materials; Table 8, the evaluation results of the bonded body using the iron (Fe) base materials; Table 9, the evaluation results of the soda lime glass base materials; and Table 10, the evaluation results of the bonded body using the alumina ($Al_2O_3$) base materials.

TABLE 4

| Compounded Amount of Lead-Free Glass Composition (volume %) | | 100 | 90 | 80 |
|---|---|---|---|---|
| Compounded Amount of Ceramic Particles (volume %) | | 0 | 10 | 20 |
| A-05 | CF-04 | Excellent | Excellent | Excellent |
| | CF-05 | Excellent | Excellent | Excellent |
| | CF-06 | Excellent | Excellent | Excellent |
| A-22 | CF-04 | Excellent | Excellent | Excellent |
| | CF-05 | Excellent | Excellent | Excellent |
| | CF-06 | Excellent | Excellent | Excellent |

TABLE 5

| Compounded Amount of Lead-Free Glass Composition (volume %) | | 100 | 90 | 80 |
|---|---|---|---|---|
| Compounded Amount of Ceramic Particles (volume %) | | 0 | 10 | 20 |
| A-05 | CF-04 | Excellent | Excellent | Excellent |
| | CF-05 | Excellent | Excellent | Excellent |
| | CF-06 | Excellent | Excellent | Excellent |
| A-22 | CF-04 | Excellent | Excellent | Excellent |
| | CF-05 | Excellent | Excellent | Excellent |
| | CF-06 | Excellent | Excellent | Excellent |

TABLE 6

| Compounded Amount of Lead-Free Glass Composition (volume %) | | 80 | 70 | 60 |
|---|---|---|---|---|
| Compounded Amount of Ceramic Particles (volume %) | | 20 | 30 | 40 |
| A-05 | CF-04 | Good | Excellent | Excellent |
| | CF-06 | Good | Excellent | Excellent |
| | CF-07 | Excellent | Excellent | Good |
| A-22 | CF-04 | Good | Excellent | Excellent |
| | CF-06 | Good | Excellent | Excellent |
| | CF-07 | Excellent | Excellent | Good |

TABLE 7

| Compounded Amount of Lead-Free Glass Composition (volume %) | | 70 | 60 | 50 |
|---|---|---|---|---|
| Compounded Amount of Ceramic Particles (volume %) | | 30 | 40 | 50 |
| V-05 | CF-03 | Good | Excellent | Good |
| | CF-06 | Good | Good | Excellent |
| | CF-07 | Good | Excellent | Excellent |
| A-22 | CF-03 | Good | Excellent | Good |
| | CF-06 | Good | Good | Excellent |
| | CF-07 | Good | Excellent | Excellent |

TABLE 8

| Compounded Amount of Lead-Free Glass Composition (volume %) | | 70 | 60 | 50 |
|---|---|---|---|---|
| Compounded Amount of Ceramic Particles (volume %) | | 30 | 40 | 50 |
| A-05 | CF-01 | Excellent | Excellent | Excellent |
| | CF-02 | Excellent | Excellent | Excellent |
| | CF-03 | Good | Good | Excellent |
| A-22 | CF-01 | Excellent | Excellent | Excellent |
| | CF-02 | Excellent | Excellent | Excellent |
| | CF-03 | Good | Good | Excellent |

TABLE 9

| Compounded Amount of Lead-Free Glass Composition (volume %) | | 60 | 50 | 40 | 30 |
|---|---|---|---|---|---|
| Compounded Amount of Ceramic Particles (volume %) | | 40 | 50 | 60 | 70 |
| A-05 | CF-01 | Excellent | Excellent | Good | Rejected |
| | CF-02 | Excellent | Excellent | Good | Rejected |
| A-22 | CF-01 | Excellent | Excellent | Good | Rejected |
| | CF-02 | Excellent | Excellent | Good | Rejected |

TABLE 10

| Compounded Amount of Lead-Free Glass Composition (volume %) | | 60 | 50 | 40 | 30 |
|---|---|---|---|---|---|
| Compounded Amount of Ceramic Particles (volume %) | | 40 | 50 | 60 | 70 |
| A-05 | CF-01 | Excellent | Excellent | Good | Rejected |
| | CF-02 | Excellent | Excellent | Good | Rejected |
| A-22 | CF-01 | Excellent | Excellent | Good | Rejected |
| | CF-02 | Excellent | Excellent | Good | Rejected |

In the examination of the bonded body using the aluminum (Al) base materials, as shown Table 4, the ceramic particles CF-04 to CF-05 in Table 3 were used as the ceramic particles, and the contents (compounded amounts) were 0 to 20 volume % (equal to or greater than 0 volume % and equal to or less than 20 volume %), and the contents of the lead-free glass compositions A-05 and A-22 were within a range of 80 to 100 volume %. Excellent results were obtained on all the conditions. It was found that bonding force and adhesive force to aluminum (Al) are very high in both of the A-05 and A-22 glass compositions. Also in the bonded body using the silver (Ag) base materials in Table 5, excellent results were obtained as in the case of aluminum (Al), and it was found that the bonding force and the adhesive force to silver (Ag) are very high, as in the case of aluminum (Al).

In the examination of the bonded body using the copper (Cu) base materials, as shown in Table 6, the ceramic particles CF-04, CF-05 and CF-06 in Table 3 were used as the ceramic particles, and the contents (compounded amounts) were 20 to 40 volume %, and the contents of the lead-free glass compositions A-05 and A-22 were within a range of 60 to 80 volume %. "Good" or higher results were obtained on all the conditions, and similar results were obtained in both of the glass compositions A-05 and A-22. When the contents (compounded amounts) were increased in correspondence with combination with the ceramic particles CF-04 or CF-06, the bonding force and the adhesive force to copper (Cu) were improved since matching between the copper (Cu) and the thermal expansion coefficient was promoted. On the other hand, in the case of the ceramic particles CF-07, the results were opposite, since thermal expansion coefficient of the ceramic particles CF-07 is very low in comparison with that of the ceramic particles CF-04 and CF-06.

In the examination of the bonded body using the nickel (Ni) base materials, as shown in Table 7, the ceramic particles CF-03, CF-06 and CF-07 in Table 3 were used as the ceramic particles. The contents (compounded amounts) were 30 to 50 volume %, and the contents of the lead-free glass compositions A-05 and A-22 were within a range of 50 to 70 volume %. "Good" or higher results were obtained on all the conditions, and similar results were obtained in both of the glass compositions A-05 and A-22. It was found that in the ceramic particles CF-03, when the content (compounded amount) is 40 volume %, the shear stress is the highest, and the bonding force and the adhesive force to the nickel (Ni) base material are very high. It was found that in the ceramic particles CF-06 and CF-07, the shear stress is increased in accordance with increment of the contents (compounded amounts), and the bonding force and the adhesive force to the nickel (Ni) base material are improved. These results were obtained by matching between the thermal expansion coefficient and nickel (Ni).

In the examination of the bonded body using the iron (Fe) base materials, as shown in Table 8, the ceramic particles CF-01 to CF-03 in Table 3 were used as the ceramic particles, and the contents (compounded amounts) were 30 to 50 volume %, and the contents of the lead-free glass compositions A-05 and A-22 were within a range of 50 to 70 volume %. "Good" or higher results were obtained on all the conditions, and similar results were obtained in both of the glass compositions A-05 and A-22. It was found that in the ceramic particles CF-01 and CF-02, high shear stress is obtained regardless of content (compounded amount), and the bonding force and the adhesive force to iron (Fe) are very high. It is considered that since the thermal expansion coefficients of the ceramic particles CF-01 and CF-02 are the smallest in Table 3, and further, wettability and bonding with respect to the glass compositions A-05 and A-22 are good, the thermal expansion coefficient as the glass composite material is effectively and greatly reduced, and is easily matched to the thermal expansion coefficient with respect to the iron (Fe) substrate, which obtains the good and higher results. In the ceramic particles CF-03, the results were not so high as these results, and it was found that the shear stress is increased in accordance with increment of the content (compounded amount), and the bonding force and the adhesive force to the iron (Fe) base material are improved. This result is also attained by matching between the thermal expansion coefficient and iron (Fe).

In the examination of the bonded body using the soda lime glass base materials, as shown in Table 9, the ceramic particles CF-01 and CF-02 in Table 3 were used as the low-thermal expansion ceramic particles, the contents (compounded amounts) were 40 to 70 volume %, and the contents of the lead-free glass compositions A-05 and A-22 were within a range of 30 to 60 volume %. Regarding the shear stress, almost no difference was observed between the ceramic particles CF-01 and CF-02, and between the glass compositions A-05 and A-22. When the contents (compounded amounts) of the ceramic particles CF-01 and CF-02 were 40 to 60 volume % and the contents (compounded amounts) of the glass compositions A-05 and A-22 were within the range of 40 to 60 volume %, "good" or higher results were obtained on all the conditions. It was found that when the contents are 40 to 50%, the shear stress is the highest, and the bonding force and the adhesive force to the soda lime glass base material are very high. When the contents (compounded amounts) of the ceramic particles CF-01 and CF-02 were equal to or greater than 60 volume %, the shear stress was reduced, and when the contents were 70 volume %, the evaluation was "rejected". When the contents (compounded amounts) of the glass compositions A-05 and A-22 were too little with respect to the contents (compounded amounts) of the ceramic particles CF-01 and CF-02, the softening liquidity as glass composite material was insufficient, the adhesive property and the bonding property to the soda lime glass base material were deteriorated, and good shear stress was not obtained. In the bonded body using the alumina ($Al_2O_3$) base materials, as shown in Table 10, evaluation results of the shear stress similar to those in the bonded body using the soda lime glass base material were obtained, since the thermal expansion coefficients of alumina ($Al_2O_3$) and soda lime glass are similar. Accordingly, it is important that in the glass composite material, the content (compounded amount) of the lead-free glass composition according to the present invention is equal to or greater than 40 volume %, and the content (compounded amounts) of the ceramic particles is equal to or less than 60 volume %. Further, in the above-described bonding of the soda lime glass base materials and bonding of the alumina ($Al_2O_3$) base materials, as the glass paste, butylcarbitol acetate was used as the solvent, and ethylcellulose was used as the resin binder. In place of these materials, isobonyl cyclohexanol-added α-terpineol was used as a viscosity modifier, and by similar heating in the atmosphere, the respective bonded bodies were manufactured. As a result of evaluation of the shear stress of the manufactured bonded bodies in a similar manner, the tendency of improvement of the shear stress was observed because the residual bubbles in the glass composite material in the junctions were reduced. As the solvent, α-terpineol was effective not only in the inert gas but also in the atmosphere.

As described above, it was found that, by using the glass composite material containing 40 to 100 volume % lead-free glass composition and 0 to 60 volume % ceramic particles, it is possible to realize low-temperature sealing and low-temperature adhesion of various base materials in air-tight manner. In the present example, the glass compositions A-05 and A-22 have been described as representative lead-free glass, however, regarding the lead-free glass compositions A-01 to A-41, it is possible to exhibit equivalent performance. When the glass composite material and its glass paste contains ceramic particles, zirconium phosphate tungstate ($Zr_2(WO_4)(PO_4)_2$), quartz glass ($SiO_2$), zirconium silicate ($ZrSiO_4$), alumina ($Al_2O_3$), mullite ($3Al_2O_3 \cdot 2SiO_2$), and niobium oxide ($Nb_2O_5$), have been described; however, the ceramic particles are not limited to these materials.

Example 3

In an example 3, the same type of and different types of metal base materials are bonded using the glass composite material containing the lead-free glass composition and the metal particles, and the bonded states were evaluated by using electric resistance (connection resistance) between the metal base materials. As the lead-free glass composition, the glass composition A-18 shown in Table 1 was used, and as the metal particles, four types of metal particles of silver (Ag), copper (Cu), aluminum (Al), and tin (Sn) were used. Further, as the metal base materials, aluminum (Al), copper (Cu), nickel (Ni), and iron (Fe) were used. The glass paste containing the lead-free glass composition particles, the metal particles, and a solvent was manufactured. The paste was applied to the aluminum (Al) base material. The base material was dried, then temporarily fired, and attached to the same type or different type of metal base material, and bonded by resistance welding, as an evaluation sample.
(Manufacturing of Glass Paste)

The glass paste was manufactured by compounding and mixing the lead-free glass composition particles, the metal particles, and the solvent. As the lead-free glass composition particles, the particles of glass composition A-18 having a particle diameter of about 3 μm were used, and as the metal particles, spherical silver (Ag) particles having an average particle diameter of about 2 μm, spherical copper (Cu) particles having an average particle diameter of about 15 μm, spherical aluminum (Al) particles having an average particle diameter of about 3 μm, and tin (Sn) particles having an average particle diameter of about 30 μm, were used. Further, as the solvent, α-terpineol was used, and isobonyl cyclohexanol was added as a viscosity modifier. The respective glass pastes were manufactured, at seven types of compounding ratios between the lead-free glass composition particles and the metal particles, represented by volume %, 100:0, 80:20, 60:40, 40:60, 30:70, 20:80, and 10:90. Further, the content of solid in the glass paste (sum of the lead-free glass composition particles and the metal particles) was about 75 to 80 mass %.
(Manufacturing of Evaluation Sample)

As the evaluation sample for measurement of the connection resistance between the metal base materials and the manufacturing method, an evaluation sample and the manufacturing method similar to those in the example 2 were used. That is, in the present example, the evaluation sample and the manufacturing method were in accordance with those shown in FIG. 2.

First, an aluminum (Al) columnar base material 1' with a bonded surface 2', having a diameter of 5 mm and a thickness of 2 mm, was prepared (a).

Next, glass paste 3' was applied to the bonded surface 2' of the columnar base material 1' by the dispenser method (b).

Thereafter, the base material was dried at 150° C. in the atmosphere. Then by setting the base material in the electric furnace, heating it at a temperature rising rate of 10° C./min in the atmosphere up to 200° C., and holding it for 15 minutes, a glass composite material 4' was formed on the bonded surface 2' of the aluminum (Al) columnar base material 1' (c). The base material was set on a plate metal base material 5' of aluminum (Al), copper (Cu), nickel (Ni), and iron (Fe), having a thickness of about 1 mm. With a resistance welder, bonded bodies of Al and Al, Al and Cu, Al and Ni, and Al and Fe, were manufactured on the conditions of load of 100 to 150N, force current of 5 kA, and application time of 100 to 200 msec. (d).

In these bonded bodies, the connection resistance between the metal base materials was measured.
(Evaluation of Bonded State)

In the manufactured respective bonded bodies, the connection resistance (electric resistance) between the metal base materials was measured by the four-terminal method. Further, as a comparison, bonding was performed using lead-free tin solder in inert gas (in argon) at 250° C.-10 min. The connection resistance by solder was, in the Al and Al solder bonded body, $3.2 \times 10^{-3}$ Ω/mm²; in the Al and Cu solder bonded body, $1.5 \times 10^{-3}$ Ω/mm²; in the Al and Ni solder bonded body, $1.7 \times 10^{-3}$ Ω/mm²; and in the Al and Fe bonded body, $1.9 \times 10^{-3}$ Ω/mm². Since the connection resistance in the Cu and Cu solder bonded body was $5.0 \times 10^{-6}$ Ω/mm², these connection resistances were about thrice higher. It is considered that a natural oxidation film having high electric resistance, formed on the surface of the Al base material, caused this high connection resistance.

Figure 3:
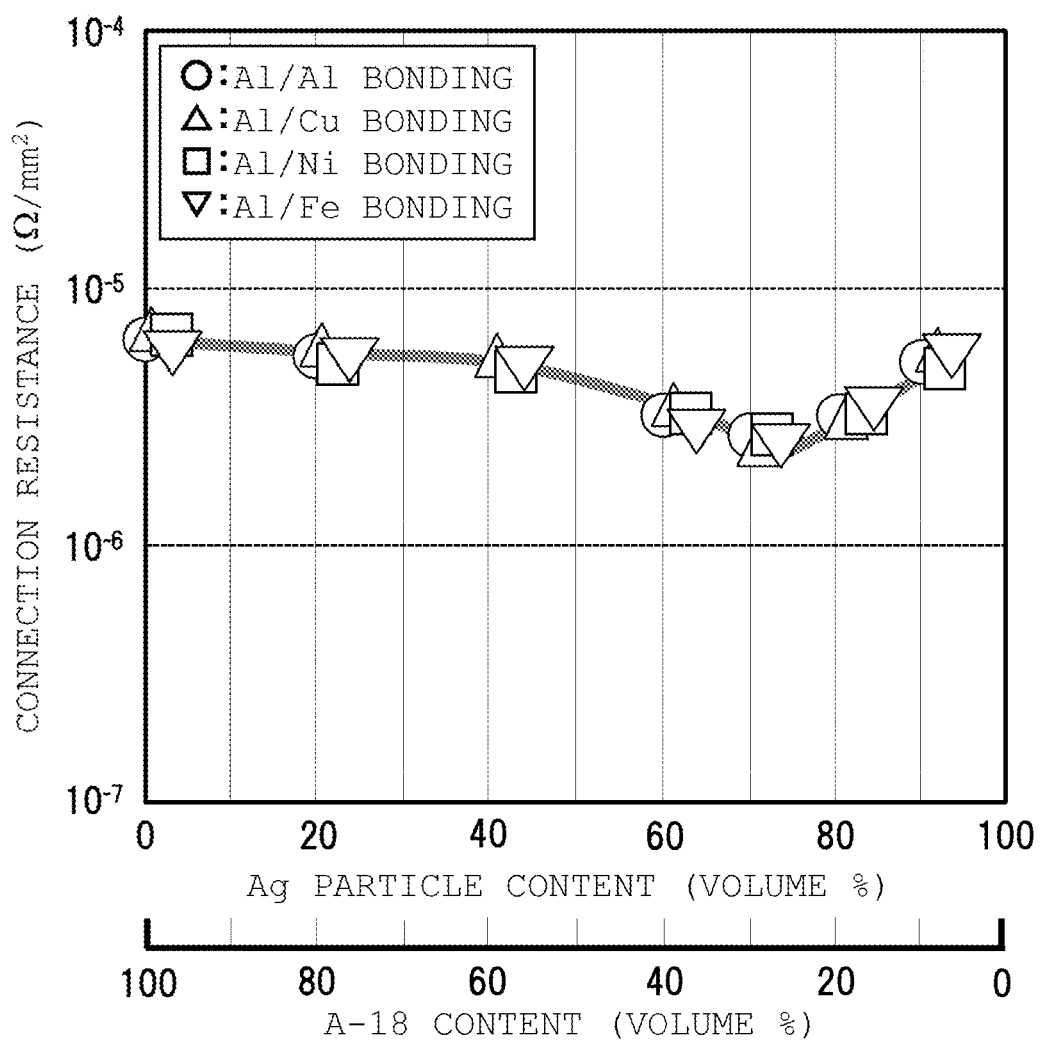
FIG. 3 is a graph showing the relationship between connection resistance of a bonded body, obtained by bonding a lead-free glass composition according to an embodiment of the present invention and a glass composite material containing Ag particles, and the content ratio between the lead-free glass composition and the Ag particles in the glass composite material.

FIG. 3 shows the relationship between the connection resistance when Al and Al, Al and Cu, Al and Ni, and Al and Fe were bonded with the glass composite material containing the lead-free glass composition A-18 and the metal particles Ag, and the content ratio between the glass composition A-18 and the Ag particles in the glass composite material. In any of the Al and Al, Al and Cu, Al and Ni, and Al and Fe bonded bodies, connection resistance of $10^{-6}$ Ω/mm² level was attained in a wide range regardless of compounding ratio between the content of the glass composition A-18 and the content of the Ag particles. Especially, the connection resistance was stable and lower when the content of the glass composition A-18 was 40 to 20 volume % and the content of the Ag particles was 60 to 80 volume % in the glass composite material. These connection resistances had good values lower than those in the Al solder bonded bodies by about 3 digits and equal to or lower than those in the Cu and Cu solder bonded bodies. It is considered that the electric resistance in the boundary surface was lowered, since the glass composition A-18 in the glass composite material was softened and fluidized, and reacted with the Al base material, then the natural oxidation film formed on the surface of the Al base material was eliminated, an Al—V alloy such as $Al_3V$ was generated in the boundary surface, and V was excluded from the glass composition A-18 and the metal Ag precipitated. Further, with the force current of the resistance welding, the metal Ag precipitated on the boundary surface was precipitated and grew in the current application direction. Accordingly, it is considered that even when the glass composite material did not contain the Ag particles but contained only the glass composition A-18, connection resistance of $10^{-6}$ Ω/mm² level was attained in the respective bonded bodies. Note that when the Ag particles were not contained, spark occurred between the electrodes of the resistance welder. As this shortens the life of the electrodes of the resistance welder, attention should be paid. It is considered that when the glass composition material contained the Ag particles, necking was performed among the Ag particles with the metal Ag precipitated from the glass composition A-18 and resistance was further lowered. It is considered that in the glass composite material, an appropriate content of the glass composition A-18 is 40 to 20 volume %, and an appropriate content of the Ag particles is 60 to 80 volume %. It is considered that when the content of the glass composition A-18 was less than 20 volume %, the reaction with the Al base material was reduced, further, the amount of the precipitation of the metal Ag from the glass composition A-18 was reduced, thus the necking among the Ag particles was not promoted, and the tendency of slight raise of the connection resistance was observed.

Figure 4:
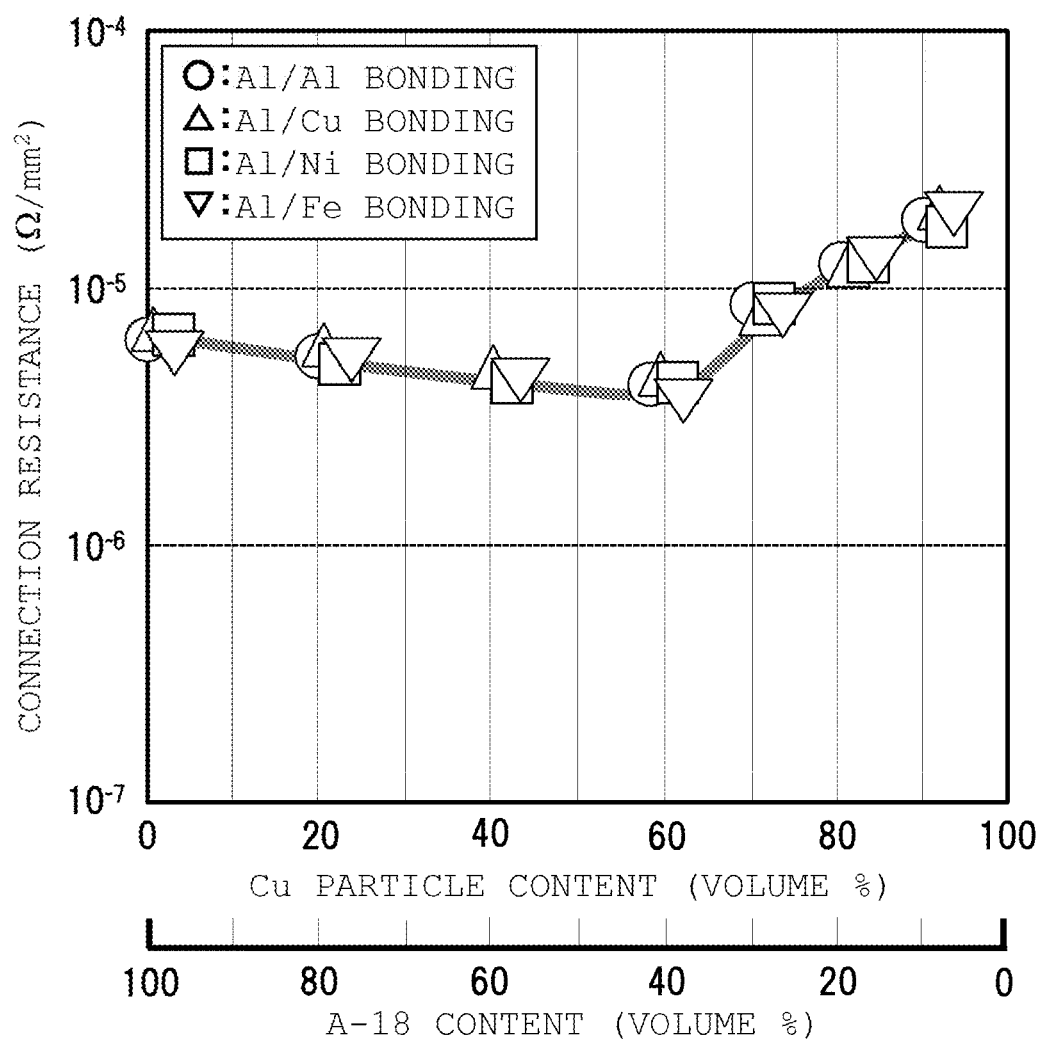
FIG. 4 is a graph showing the relationship between the connection resistance of a bonded body bonded with a conductive material containing the lead-free glass composition according to the embodiment of the present invention and Cu particles, and the content ratio between the lead-free glass composition and the Cu particles in the glass composite material.

FIG. 4 shows the relationship between the connection resistance when Al and Al, Al and Cu, Al and Ni, and Al and Fe were bonded with the glass composite material containing the lead-free glass composition A-18 and the metal particles cu, and the content ratio between the glass composition A-18 and Cu particles in the glass composite material. In any of the Al and Al, Al and Cu, Al and Ni, and Al and Fe bonded bodies, connection resistance of the second-half of $10^{-6}$ $\Omega/mm^2$ level to the first-half of $10^{-5}$ $\Omega/mm^2$ level was attained in a wide range regardless of compounding ratio between the content of the glass composition A-18 and the content of the Cu particles. Especially, the connection resistance was lower when the content of the glass composition A-18 was 80 to 40 volume % and the content of the Cu particles was 20 to 60 volume % in the glass composite material. However, in comparison with FIG. 3 using the Ag particles, the connection resistance is high. It is considered that the surface oxidation of the Cu particles in the glass composite material was the cause of this high connection resistance.

Figure 5:
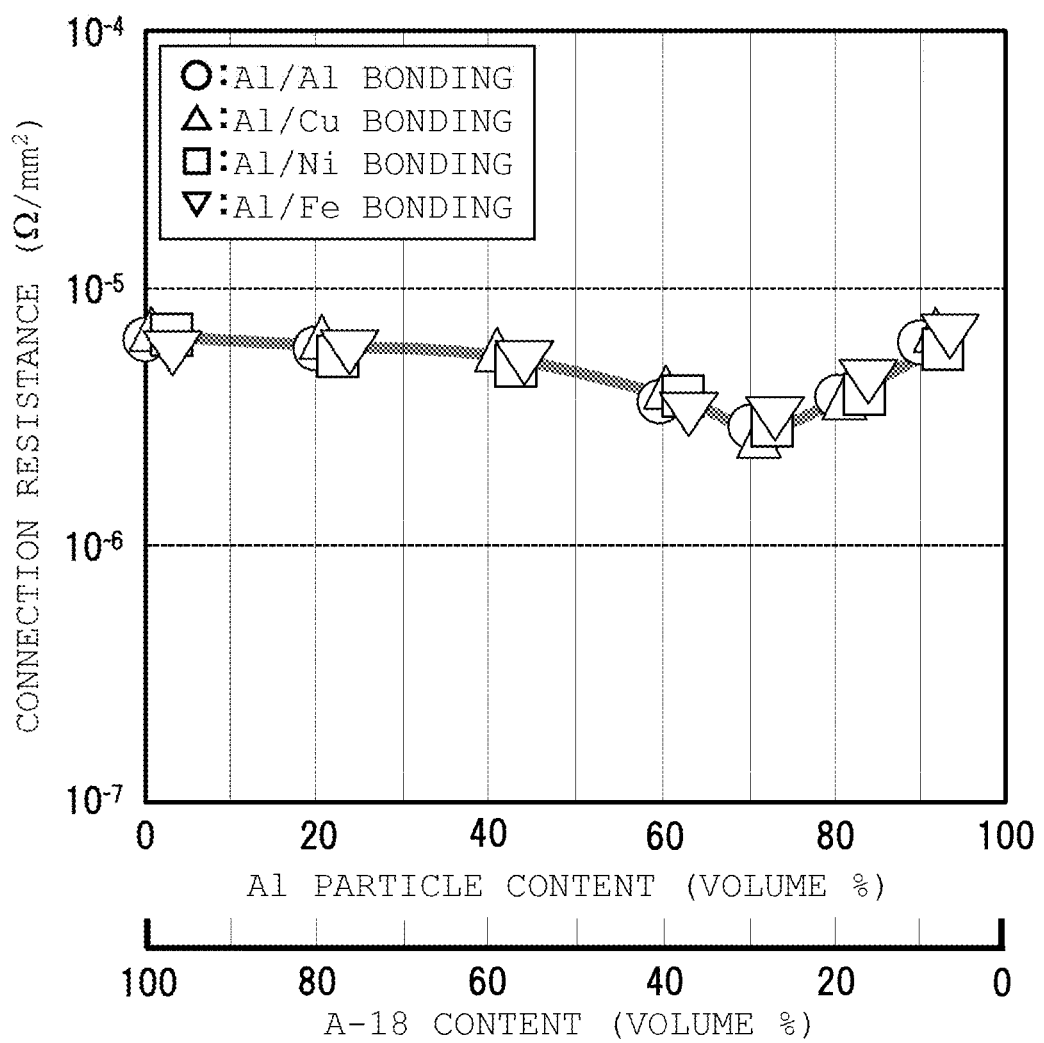
FIG. 5 is a graph showing the relationship between the connection resistance of a bonded body bonded with a conductive material containing the lead-free glass composition according to the embodiment of the present invention and Al particles, and the content ratio between the lead-free glass composition and the Al particles in the glass composite material.

FIG. 5 shows the relationship between the connection resistance when Al and Al, Al and Cu, Al and Ni, and Al and Fe were bonded with the glass composite material containing the lead-free glass composition A-18 and the metal particles Al, and the content ratio between the glass composition A-18 and the Al particles in the glass composite material. In any of the Al and Al, Al and Cu, Al and Ni, and Al and Fe bonded bodies, connection resistance of $10^{-6}$ $\Omega/mm^2$ level was attained in a wide range regardless of compounding ratio between the content of the glass composition A-18 and the content of the Al particles. Especially, the connection resistance was lower when the content of the glass composition A-18 was 40 to 20 volume % and the content of the Al particles was 60 to 80 volume % in the glass composite material. However, in comparison with FIG. 3 using the Ag particles, the connection resistance was slightly high. It was considered that since the Al particles are very cheaper than the Ag particles, it is advantageous to use both of the Al particles and the Ag particles as the metal particles for reduction of the resistance and cost reduction in the glass composite material and its glass paste. Accordingly, Al and Cu bonded bodies were respectively manufactured by using the glass composite material, such that the content of the glass composition A-18 in the glass composite material was constantly 30 volume % and the compounding ratio between the Al particles and the Ag particles by volume % was 30:40, and 40:30, as in the case of the above-described manufacturing, and the connection resistances were evaluated. As a result, connection resistance equal to that not containing Al particles but containing 70 volume % Ag particles was obtained. It was clarified that it is effective to use both of the Al particles and the Ag particles.

Figure 6:
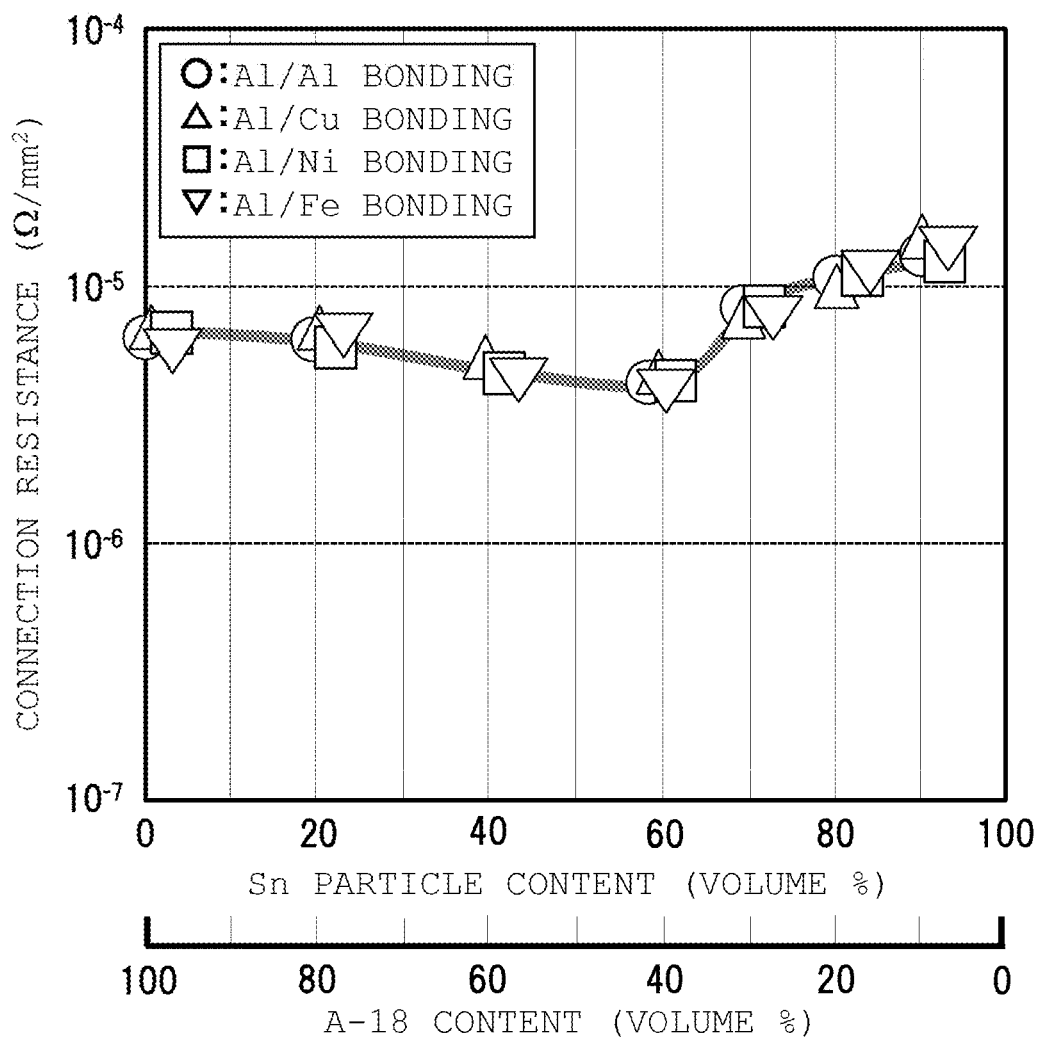
FIG. 6 is a graph showing the relationship between the connection resistance of a bonded body bonded with a conductive material containing the lead-free glass composition according to the embodiment of the present invention and Sn particles, and the content ratio between the lead-free glass composition and the Sn particles in the glass composite material.

FIG. 6 shows the relationship between the connection resistance when Al and Al, Al and Cu, Al and Ni, and Al and Fe were bonded with the conductive material containing the lead-free glass composition A-18 and the metal particles Sn, and the content ratio between the glass composition A-18 and the Sn particles in the glass composite material. In any of the Al and Al, Al and Cu, Al and Ni, and Al and Fe bonded bodies, connection resistance of the second-half of $10^{-6}$ $\Omega/mm^2$ level to the first-half of $10^{-5}$ $\Omega/mm^2$ level was attained in a wide range regardless of compounding ratio between the content of the glass composition A-18 and the content of the Sn particles. Especially, the connection resistance was lower when the content of the glass composition A-18 was 80 to 40 volume % and the content of the Cu particles was 20 to 60 volume % in the glass composite material. This shows a similar tendency to that in FIG. 4 using the Cu particles. In comparison with FIG. 3 and FIG. 5 using the Ag particles and the Al particles, the connection resistance is high. It is considered that the surface oxidation of the Sn particles in the glass composite material was the cause of this high connection resistance.

As described above, it is possible to effectively develop the lead-free glass composition according to the present invention into glass composite material and its glass paste to form a conductive junction for conduction between metal base materials at a low temperature, by compounding the lead-free glass composition with metal particles. Further, as conductivity and heat dissipation have some degree of correlation, it goes without saying that it is possible to develop the lead-free glass composition to glass composite material and its glass paste to form not only the conductive junction but also glass composite material and its glass paste to form a heat dissipation junction. In the present example, the glass composition A-18 has been described as representative lead-free glass, however, regarding the lead-free glass compositions A-1 to A-41, similar performance is exhibited. When the glass composite material and its glass paste contains metal particles, Ag, Cu, Al, and Sn have been described; however, the metal particles are not limited to these materials, but similar performance is exhibited in alloys of these materials.

In formation of the conductive junction or the heat dissipation junction between the metal base materials, the solder is frequently used. In consideration of differentiation from the solder, Ag particles and Al particles are effective as the metal particles contained in the glass composite and the glass paste. Further, it is difficult with the solder to satisfactorily perform conductive bonding and heat dissipation bonding in the case of the metal base material in which a natural oxidation film is formed on the surface as in the case of Al. In the glass composite material and its glass paste according to the embodiment of the present invention, it is possible to perform conductive bonding and heat dissipation bonding even in the case of such metal base material or the like, with the operation of the contained lead-free glass composition.

Further, it is also possible to use the glass composite material and the glass paste containing the metal particles, when conductivity is allowed in the junction and sealing part, as glass material and its glass paste as described in the example 2. At that time, matching as in the case of the example 2 is not performed between the bonded member or the sealed member and the thermal expansion coefficient, but stress mitigation is performed in accordance with size or amount of contained metal particles, and low-temperature bonding or low-temperature sealing is performed.

Example 4

In the present example, using the glass composite material containing the lead-free glass composition and the metal particles, electrodes/wirings were formed on various types of substrates, and electric resistance (wiring resistance) of the electrodes/wirings and adhesive property to the various types of substrates was evaluated. As the lead-free glass composition, the glass composition A-20 shown in Table 1 was used, and as the metal particles, silver (Ag), was used. Further, as the substrates, an alumina ($Al_2O_3$) substrate, a borosilicate glass substrate, a silicon (Si) substrate, a ferrite substrate, and a polyimide substrate were used. The electrodes/wirings were formed by manufacturing the glass paste containing the lead-free glass composition particles, the metal particles, and the solvent, applying the glass paste to the various types of substrates, drying and temporarily firing the substrates. They were used as the evaluation samples.

(Manufacturing of Glass Paste)

The glass paste was manufactured by compounding and mixing the lead-free glass composition particles, the metal particles, and the solvent. As the lead-free glass composition particles, particles of the glass composition A-20 having a particle diameter of about 1 μm were used, and as the metal particles, spherical silver (Ag) particles having an average particle diameter of about 1.5 μm, were used. Further, α-terpineol was used as the solvent, and isobonyl cyclohexanol was added as a viscosity modifier. Table 11 shows compounding ratios between the lead-free glass composition A-20 particles and the metal particles Ag. At the compounding ratios shown in Table 11, seven types of glass pastes were manufactured. Note that the content of solid in the glass paste (sum of the lead-free glass composition particles and the metal particles) was about 75 to 80 mass %.

(Manufacturing of Evaluation Sample)

Figure 7:
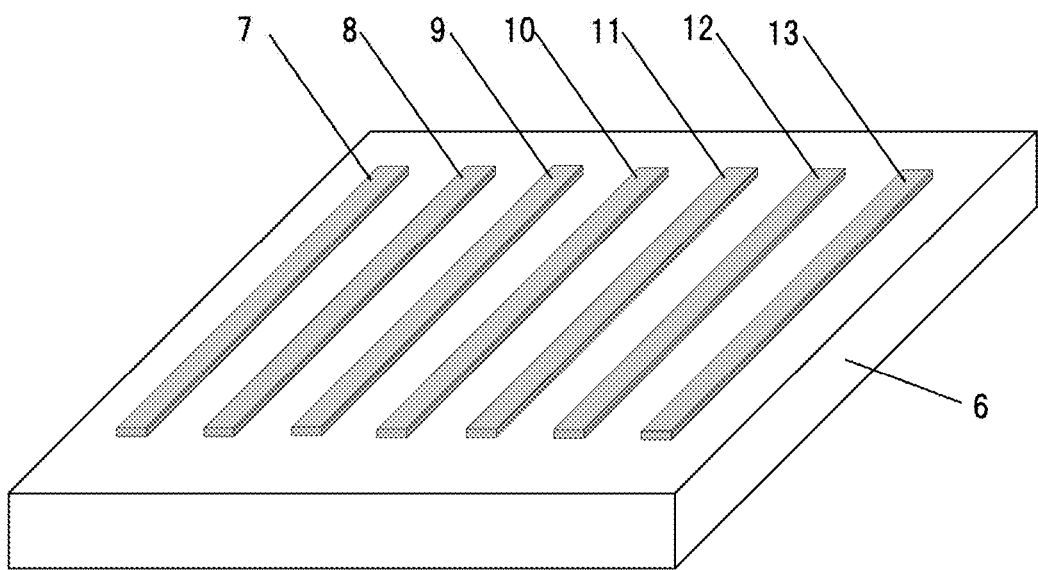
FIG. 7 is a schematic perspective diagram showing a wiring pattern for measurement of wiring resistance in formed electrodes/wirings and peeling test.

The respective electrodes/wirings were formed in a wiring pattern shown in FIG. 7 using the seven types of glass pastes DH-01 to DH-07 shown in Table 11. As the substrates 6 in FIG. 7, an alumina ($Al_2O_3$) substrate, a borosilicate glass substrate, a silicon (Si) substrate, a ferrite substrate, and a polyimide substrate were used. Wirings 7 to 13 correspond to the glass pastes DH-01 to 07 in Table 11. First, using the respective conductive glass pastes, a 2 mm×40 mm pattern was respectively applied by the screen printing method on the respective substrates, and the substrates were dried at 150° C. in the atmosphere. The film thickness at that time was 30 to 40 μm. They were set in an electric furnace, and heated at a temperature rising rate of 10° C./min in the atmosphere up to 200° C., and held for 30 minutes, thus the respective wirings 7 to 13 were formed on the substrates 6.

(Evaluation of Wiring Resistance)

The wiring resistance values of the wirings 7 to 13 formed on the respective substrates at the compounding ratios for the seven types of glass pastes DH-01 to 07 shown in Table 11 were measured by the four-terminal methods.

TABLE 11

| Electrode/Wiring No. | Lead-Free Glass Composition A-20 (volume %) | Metal Particle Ag (volume %) | Remarks |
| --- | --- | --- | --- |
| DH-01 | 5 | 95 | Wiring 7 in FIG. 7 |
| DH-02 | 10 | 90 | Wiring 8 in FIG. 7 |
| DH-03 | 15 | 85 | Wiring 9 in FIG. 7 |
| DH-04 | 20 | 80 | Wiring 10 in FIG. 7 |
| DH-05 | 30 | 70 | Wiring 11 in FIG. 7 |
| DH-06 | 40 | 60 | Wiring 12 in FIG. 7 |
| DH-07 | 50 | 50 | Wiring 13 in FIG. 7 |

(Evaluation of Adhesive Property)

The adhesive properties of the wirings 7 to 13 to the respective substrates were evaluated by a peeling test. A peeling tape was attached to the wirings formed on the respective substrates. When the tape was tore off, the wiring not peeled off from the substrate and not broken was evaluated as "accepted". On the other hand, the wiring peeled off and/or broken was evaluated as "rejected".

Figure 8:
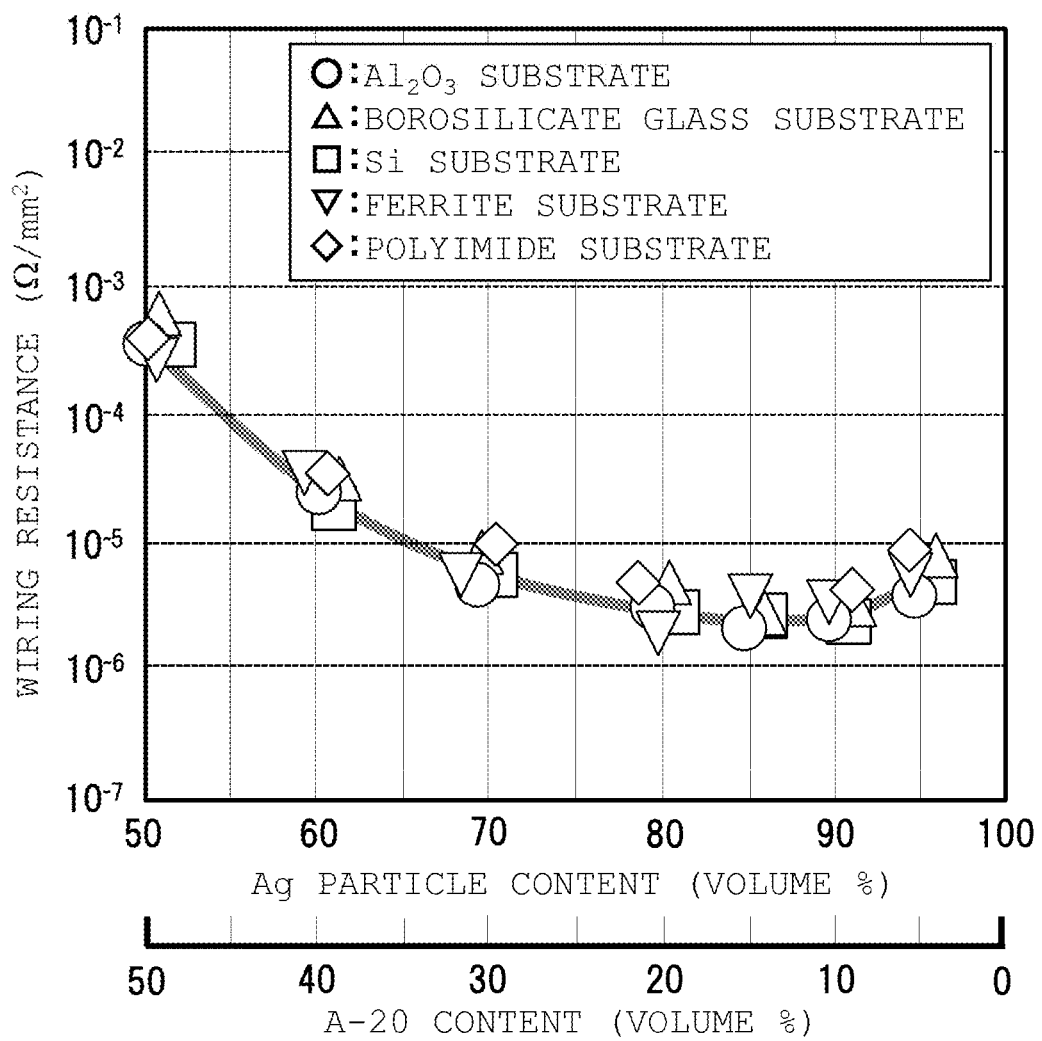
FIG. 8 is a graph showing the relationship between the wiring resistance of the electrodes/wirings, formed with the glass composite material containing lead-free glass composition according to another embodiment of the present invention and the Ag particles, and the content ratio between the lead-free glass composition and the Ag particles in the glass composite material.

FIG. 8 shows the relationship between the wiring resistance of the wirings, formed with the glass composite material containing lead-free glass composition A-20 and the metal particles Ag on the respective substrates, and the content ratio between the glass composition A-20 and Ag in the conductive material. As the substrates, five types of substrates, the $A_2O_3$ substrate, the borosilicate glass substrate, the Si substrate, the ferrite substrate, and the polyimide substrate, were examined. Almost no difference of wiring resistance by substrate was observed. In accordance with increment of Ag content and decrement of glass composition A-20 content, the wiring resistance was decreased. When the Ag content was 70 to 95 volume % and the glass composition A-20 content was within a range of 30 to 5 volume %, wiring resistance of $10^{-6}$ Ωcm level was attained. Further, regarding the reduction of the wiring resistance, when the Ag content was 80 to 90 volume % and the glass composition A-20 content was about 10 to 20 volume %, the minimum value of the wiring resistance was obtained. In the glass composite material according to FIG. 8, it is possible to promote necking of the Ag particles by obtaining good softening liquidity upon formation of the wirings. Accordingly, it is possible to form the electrodes/wirings with remarkably low wiring resistance at this low temperature, i.e. in the present example, at a low temperature of 200° C. Further, in the present example, the five types of substrates, the $A_2O_3$ substrate, the borosilicate glass substrate, the Si substrate, the ferrite substrate, and the polyimide substrate were examined; however, it is easily guessed that the invention is applicable to other substrates than these substrates. Especially, development to resin substrates is greatly expected.

Table 12 shows the results of the peeling test performed on the respective wirings formed on the respective substrates. When the content of the lead-free glass composition A-20 was equal to or greater than 10 volume % and the content of the metal particles Ag was less than 90 volume %, as shown in the glass pastes DH-02 to 07 in Table 12, the evaluation was "accepted", and good adhesive property was obtained with respect to any of the substrates. However, when the glass composition A-20 content was 5 volume % and the Ag content was 95 volume %, the wiring was peeled off and the evaluation was "rejected", with respect to any of the substrates. The adhesive property was not sufficient. It is considered that this evaluation was resulted from the small content of the lead-free glass composition in the glass composite material. From the result, it was found that as the glass composite material, the preferable content of the lead-free glass composition is equal to or greater than 10 volume %. However, even when the content of the lead-free glass composition is 5 volume %, there is a good possibility of acquisition of good adhesive property if pressurization or the like is performed upon wiring formation.

TABLE 12

| Electrode/<br>Wiring No. | Al$_2$O$_3$<br>Substrate | Borosilicate<br>Glass<br>Substrate | Si<br>Substrate | Ferrite<br>Substrate | Polyimide<br>Substrate |
|---|---|---|---|---|---|
| DH-01 | Rejected | Rejected | Rejected | Rejected | Rejected |
| DH-02 | Accepted | Accepted | Accepted | Accepted | Accepted |
| DH-03 | Accepted | Accepted | Accepted | Accepted | Accepted |
| DH-04 | Accepted | Accepted | Accepted | Accepted | Accepted |
| DH-05 | Accepted | Accepted | Accepted | Accepted | Accepted |
| DH-06 | Accepted | Accepted | Accepted | Accepted | Accepted |
| DH-07 | Accepted | Accepted | Accepted | Accepted | Accepted |

As described above, it is possible to effectively develop the lead-free glass composition according to the present invention into glass composite material and its glass paste to form electrodes/wirings at a low temperature. In the present example, the glass composition A-20 has been described as representative lead-free glass, however, it goes without saying that regarding the lead-free glass compositions A-1 to A-41, similar performance is exhibited. Further, in the present example, Ag has been described as the metal particles contained in the glass composite material and its glass paste, however, the metal particles are not limited to this metal. It goes without saying that there is a possibility that the invention is applicable to an Ag alloy, Cu, Al, and Sn, or alloys of these metals. It was found that it is possible to effectively develop the glass composite material according to the embodiment of the present invention and its glass paste into formation of electrodes/wirings in various types of electronic components at a low temperature.

Example 5

In the present example, using the glass composite material containing the lead-free glass composition and resin, adhesion strengths of metals, ceramic, and glass to the base material were evaluated. As the lead-free glass composition, the glass composition A-07 shown in Table 1 was used, and as the resin, six types of resins, epoxy resin, phenoxy resin, phenol resin, acrylic resin, urethane resin, and fluororesin, were used. Further, as the metal base materials, aluminum (Al), copper (Cu), and iron (Fe) were used, as the ceramic base materials, alumina (Al$_2$O$_3$) and magnesia (MgO) were used, and as the glass base materials, soda lime glass and borosilicate glass, were used. The evaluation samples were formed by applying the glass paste, containing the lead-free glass composition particles, the resin, and the solvent, as a coating material, to the various types of base materials, and firing the base materials, to form coating films.

(Manufacturing of Glass Paste)

The glass paste was manufactured by compounding and mixing the lead-free glass composition particles, the resin, and the solvent. As the lead-free glass composition particles, particles of the glass composition A-07 having a particle diameter of about 1 μm were used, and as the solvent, butylcarbitol acetate were used. First, the epoxy resin, the phenoxy resin, the phenol resin, the acrylic resin, the urethane resin, and the fluororesin were respectively dissolved in the solvent. Next, the lead-free glass composition particles were introduced into the solutions, and the solutions were stirred well, thus the glass pastes were manufactured. The compounding ratios between the lead-free glass composition and the resins were, by volume %, 0:100 and 10:90. Further, the content of solid in the glass paste (sum of the lead-free glass composition particles and the resin) was 75 to 80 mass %. Note that the paste in which the compounding ratio between the lead-free glass composition and the resin was 0:100, i.e., the paste not containing lead-free glass composition, was a comparative material.

(Manufacturing of Evaluation Sample)

The manufactured glass pastes were applied to the Al, Cu, and Fe metal base materials, the Al$_2$O$_3$ and MgO ceramic base materials, and the glass base materials of the soda lime glass and borosilicate glass, respectively. The coating films were formed on the respective base materials by heating the base materials at a temperature rising rate of 10° C./min in the atmosphere up to 150° C., then holding them for 15 minutes, thereafter, heating them at a temperature rising rate of 5° C./min up to 190° C., then holding them for 10 minutes.

(Evaluation of Adhesion Strength)

The adhesion strengths of the coating films formed on the respective base materials were evaluated by a scratch test (peeling strength). With the adhesion strength of the coating film in which the compounding ratio between the lead-free glass composition and the resin was 0:100, i.e. the adhesion of a coating film not containing lead-free glass composition as "1", the adhesion strengths of the coating films containing the lead-free glass composition were relatively compared. That is, when the strength was above "1", the adhesion strength was improved. On the other hand, when the strength was below "1", the adhesion strength was reduced.

Table 13 shows the results of the evaluation of relative adhesion strengths to the respective base materials when the content of the lead-free glass composition A-07 was 10 volume %. When any of the epoxy resin, the phenoxy resin, the phenol resin, the acrylic resin, the urethane resin, and the fluororesin was contained, and further, with respect to any base material of Al, Cu, Fe, Al$_2$O$_3$, MgO, soda lime glass, and borosilicate glass, when the glass composition A-07 was contained, the adhesion strength was improved to twice or higher. It is considered that upon formation of coating film, the glass composition A-07 was softened and fluidized, and strongly bonded to the respective base materials, which caused the improvement of the adhesion strength. Accordingly it is considered that in a base material where the glass composition A-07 was more strongly bonded, the adhesion strength was further improved. The adhesion strength differs in accordance with contained resin, especially, the adhesion strength was increased when the phenoxy resin and the phenol resin were contained. It is guessed that the softening liquidity of the glass composition A-07 was different in accordance with resin, and in the phenoxy resin and the phenol resin, the glass composition had good softening liquidity.

TABLE 13

| Resin (90<br>volume %) | Metal Base<br>Material | | | Ceramic Base<br>Material | | Glass Base Material | |
|---|---|---|---|---|---|---|---|
| | Al | Cu | Fe | Al$_2$O$_3$ | MgO | Soda Lime<br>Glass | Borosilicate<br>Glass |
| Epoxy Resin | 2.2 | 2.1 | 2.3 | 2.5 | 2.6 | 2.5 | 2.0 |
| Phenoxy Resin | 2.7 | 2.5 | 2.4 | 2.8 | 3.5 | 3.0 | 2.4 |
| Phenolic Resin | 3.5 | 2.9 | 2.5 | 3.3 | 3.8 | 3.7 | 2.8 |
| Acrylic Resin | 2.2 | 2.0 | 2.0 | 2.2 | 2.4 | 2.4 | 2.1 |
| Urethane Resin | 2.5 | 2.2 | 2.2 | 2.0 | 2.3 | 2.5 | 2.4 |

TABLE 13-continued

|  | Metal Base Material | | | Ceramic Base Material | | Glass Base Material | |
|---|---|---|---|---|---|---|---|
| Resin (90 volume %) | Al | Cu | Fe | $Al_2O_3$ | MgO | Soda Lime Glass | Borosilicate Glass |
| Fluorine Resin | 2.5 | 2.6 | 2.3 | 2.4 | 2.2 | 2.1 | 2.0 |

As described above, it was found that when the lead-free glass composition according to the embodiment of the present invention and the resin are compounded, it is possible to improve the adhesion strengths of the coating film to the metal, ceramic, and glass base materials. In the present example, the glass composition A-07 has been described as a representative lead-free glass composition, however, regarding the lead-free glass compositions A-01 to A-41, equivalent performance is exhibited. Further, as the contained resin, general resin, i.e. the epoxy resin, the phenoxy resin, the phenol resin, the acrylic resin, the urethane resin and the fluororesin were examined, however, the resin was not limited to these resins. Further, as the metal base materials to form the coating film, the Al, Cu, and Fe metal base materials were used, as the ceramic base material, $Al_2O_3$ and MgO were used, and as the glass base materials, soda lime glass and borosilicate glass were used, however, the base materials were not limited to these base materials.

Example 6

In an example 6, using the glass composite material containing the lead-free glass composition and the resin, the influence of the compounding ratio between the lead-free glass composition and the resin on the adhesion strengths to the metal, ceramic and glass base materials was evaluated. As the lead-free glass composition, the glass composition A-07 shown in Table 1 was used, and as the resin, phenolic resin was used. Further, as the metal base materials, aluminum (Al), copper (Cu), and iron (Fe) were used, as the ceramic base materials, alumina ($Al_2O_3$) and magnesia (MgO) were used, and as the glass base materials, soda lime glass and borosilicate glass were used. The glass pastes containing the lead-free glass composition particles, the resin, and the solvent, as coating materials, were applied to the various types of base materials, and the base materials were fired, thus the coating films were formed, as evaluation samples.

(Manufacturing of Glass Paste)

The glass paste was manufactured by compounding and mixing the lead-free glass composition particles, the resin, and the solvent. As the lead-free glass composition particles, particles of the glass composition A-07 having a particle diameter of about 1 μm were used, and as the solvent, butylcarbitol acetate was used. The lead-free glass composition particles were introduced into the butylcarbitol acetate in which the phenol resin was dissolved, and the solutions were well stirred, thus the glass pastes were manufactured. The compounding ratios between the lead-free glass composition and the resin were, by volume %, five types of ratios, 5:95, 10:90, 30:70, 50:50, and 70:30. Further, the content of solid in the glass paste (sum of the lead-free glass composition and the resin) was about 75 to 80 mass %.

(Manufacturing of Evaluation Sample)

The coating films were formed on the respective base materials by applying the manufactured glass pastes to the Al, Cu, and Fe metal base materials, the $Al_2O_3$ and MgO ceramic base materials, and the base materials of soda lime glass and borosilicate glass, heating the base materials at a temperature rising rate of 10° C./min in the atmosphere up to 150° C., holding the base materials for 15 minutes, then heating the base materials at a temperature rising rate of 5° C./min up to 190° C., and holding the base materials for 10 minutes.

(Evaluation of Adhesion Strength)

The adhesion strengths of the coating films formed on the respective base materials were evaluated by the scratch test (peeling strength). At the compounding ratio between the lead-free glass composition and the resin, 0:100, i.e., the adhesion strength of a coating film not containing the lead-free glass composition as "1", the adhesion strength of the coating film containing the lead-free glass composition was relatively compared. That is, when it was above "1", the adhesion strength was improved. On the other hand, when it was below "1", the adhesion strength was reduced. Table 14 shows the results of evaluation of the adhesion strengths relative to the respective base materials when the phenol resin was used.

TABLE 14

| Lead-Free Glass Composition | Resin Phenolic | Metal Base Material | | | Ceramic Base Material | | Glass Base Material | |
|---|---|---|---|---|---|---|---|---|
| A-07 | Resin | | | | | | Soda Lime | Borosilicate |
| (volume %) | (volume %) | Al | Cu | Fe | $Al_2O_3$ | MgO | Glass | Glass |
| 5 | 95 | 2.6 | 2.1 | 1.9 | 2.4 | 2.5 | 2.2 | 1.5 |
| 10 | 90 | 3.5 | 2.9 | 2.6 | 3.3 | 3.8 | 3.7 | 2.8 |
| 30 | 70 | 3.7 | 2.4 | 2.1 | 2.1 | 2.8 | 2.2 | 2.0 |
| 50 | 50 | 2.3 | 1.7 | 1.4 | 1.3 | 2.8 | 1.4 | 1.1 |
| 70 | 30 | 1.4 | 0.9 | 0.7 | 0.6 | 1.1 | 0.8 | 0.5 |

In any of the base materials of Al, Cu, Fe, $Al_2O_3$, MgO, soda lime glass, and borosilicate glass, a tendency that the adhesion strength of the coating film was increased in accordance with increment of the content of the lead-free glass composition A-07 then reduced was observed. Further, the maximum adhesion strength was not based on the type of base material. It was within a range that the content of the glass composition A-07 was 5 to 30 volume % and the content of the phenol resin was 70 to 95 volume %. Further, when the content of the glass composition A-07 was equal to or less than 50 volume % and the content of the phenol resin was equal to or greater than 50 volume %, with respect to the coating film not containing the glass composition A-07 but only coating the phenol resin, in any of the base material, the evaluation was above "1", and the improvement of the adhesion strength was observed. However, when the content of the glass composition A-07 was above 50 volume % and the content of the phenol resin was less than 50 volume %, in most base materials, the evaluation was below "1", and the adhesion strength of the coating film was degraded. It is considered that when the content of the lead-free glass composition was large, it was not possible to mitigate thermal stress upon formation of the coating film, accordingly, the adhesion strength was lowered. However, only in the Al base material and the MgO base material, even when the compounding ratio between the glass composition A-07 and the phenol resin was, by volume %, 70:30, the evaluation was above "1". The adhesion strengths of the coating films on different base materials showed a tendency that the adhesion strength was especially high in the base materials of Al, MgO, and soda lime glass to which the glass composition A-07 when softened and fluidized was strongly bonded.

As described above, it was found that in the glass composite material, containing the lead-free glass composition according to the present invention and the resin, and its glass paste, when the content of the lead-free glass composition is equal to or less than 50 volume % and the content of the resin is equal to or greater than 50 volume %, the adhesion strengths of the coating films to the metal, ceramic, and glass base materials are improved, and it is possible to effectively develop into the coating material to the metal, ceramic, and glass base materials. Especially, it was clarified that when the content of the lead-free glass composition is equal to or less than 5 to 30 volume % and the content of the resin is 95 to 70 volume %, the coating film has an excellent adhesion strength, and it is very effective as a coating material to metal, ceramic and glass base materials.

As described in the example 5 and the example 6, it was found that in the lead-free glass composition according to the present invention, it is possible to realize, in addition to compounding with the ceramic particles and the metal particles described in the above examples 2 to 4, compounding with resin with lower thermal resistance than that of the above particles, and new development to coating materials and the like was found. Especially, upon development into the coating materials, when the base materials forming the coating films are metal, ceramic, and glass, the coating film can be strongly bonded. Accordingly, the invention is applicable to various coated components.

Example 7

In the present example, using two soda lime glass substrates, and the glass composite material according to the embodiment of the present invention, a vacuum insulation multilayer glass panel was manufactured as one of representative examples of glass sealing parts, to substantiate applicability of the glass composite material. Note that in the present example, the glass paste was used as the glass composite material.

Figure 9A:
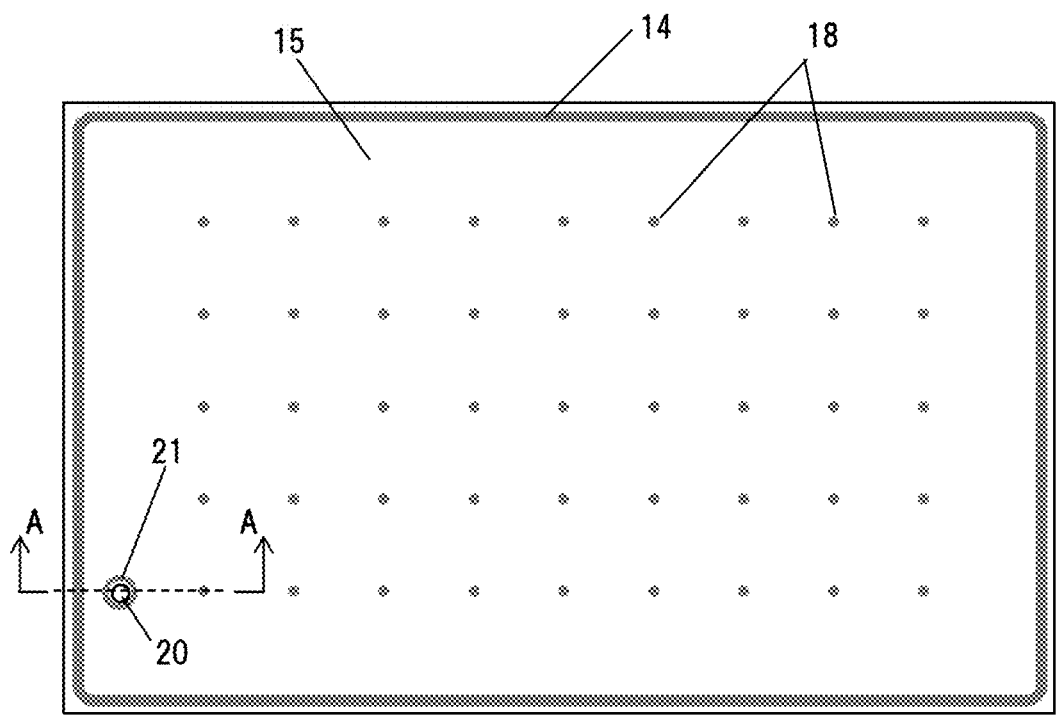
FIG. 9A is a schematic plane diagram of a vacuum insulation multilayer glass panel according to another embodiment of the present invention.

FIG. 9A is a schematic plane diagram of the manufactured vacuum insulation multilayer glass panel. Further, FIG. 9B is an enlarged view of an A-A cross-section around a sealing part.

As shown in FIG. 9A, the vacuum insulation multilayer glass panel has a sealing part 14 at peripheral edges of a soda lime glass substrate 15 and a soda lime glass substrate (numeral 16 in FIG. 9B) stacked on the soda lime glass substrate 15 with a gap between them. Plural spacers 18 are two-dimensionally arrayed at equal intervals between these substrates (15, 16). An exhaust hole 20 is formed in the soda lime glass substrate (16). Exhaustion in the gap between the two substrates (15, 16) is performed by using a vacuum pump (not shown) from the exhaust hole 20. A cap 21 is attached to the exhaust hole 20.

Figure 9B:
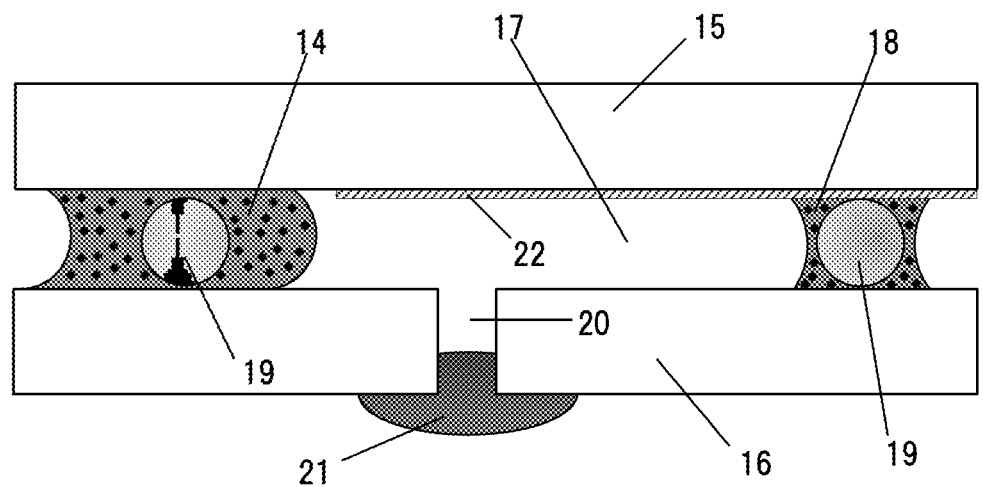
FIG. 9B is an A-A cross-sectional diagram of FIG. 9A.

As shown in FIG. 9B, space 17 (the above-described gap) exists between the pair of soda lime glass substrates 15 and 16 having the sealing part 14 at the peripheral part (peripheral edges), and the space 17 is in vacuum state. As the sealing part 14, the glass composite material according to the embodiment of the present invention is used. It is possible to develop the vacuum insulation multilayer glass panel into building material window glass, vehicle window glass, business-use refrigerators and refrigerator doors, and the like. The glass composite material used in the sealing part 14 contains, in addition to the lead-free glass composition according to the present invention, ceramic particles having a small thermal expansion coefficient for matching with respect to the thermal expansion coefficient of the soda lime glass substrates 15 and 16. The thermal resistance of the soda lime glass substrates 15 and 16 is about 500° C., accordingly, it is necessary to form the sealing part 14 at a temperature equal to or lower than that temperature. Further, since the soda lime glass substrates 15 and 16 are easily damaged due to rapid heating or rapid cooling, it is necessary to gradually perform heating and cooling upon sealing. To improve the productivity of the vacuum insulation multilayer glass panel, sealing at temperature as low as possible is required. Further, the soda lime glass substrates 15 and 16 are frequently subjected to cooling and tempering for crime prevention and safety. The cooling and tempering is performed to form a compression reinforced layer on the surfaces of the soda lime glass substrates 15 and 16. The reinforced layer is gradually reduced by heating at a temperature equal to or higher than 300° C., and disappears by heating at a temperature equal to or higher than 400° C. From this fact, sealing at a lower temperature is strongly required.

To ensure vacuum-state space 17, the plural spacers 18 are provided in the space 17 between the soda lime glass substrates 15 and 16. Further, to obtain the space 17 having an appropriate thickness, it is effective to introduce spherical beads 19 or the like having a uniformed particle diameter in the spacers 18 and the sealing part 14. Further, to fix the spacers 18, it is possible to utilize the glass composite material according to the embodiment of the present invention as in the case of the sealing part 14. To obtain the space 17 having vacuum state, the exhaust hole 20 is previously formed in the soda lime glass substrate 16, and exhaustion of the space 17 is performed by using the vacuum pump from the exhaust hole 20. After the exhaustion, the cap 21 is attached so as to maintain the vacuum degree in the space 17. When the panel is applied to building material window glass, vehicle window glass or the like, it may be configured such that a heat-ray reflective film 22 is previously formed by the vapor deposition method or the like on the inner surface of the soda lime glass substrate 15.

In the present example, the soda lime glass substrates 15 and 16 having a size of 900×600×3 mm were used. Note that as the heat-ray reflective film 22 was formed on the soda lime glass substrate 15, and the exhaust hole 20 was formed in the soda lime glass substrate 16. To obtain the gap between the soda lime glass substrates 15 and 16, i.e., the space 17 having a thickness of about 200 μm, the sealing part 14 and the spacers 18 contain the spherical beads 19 having a diameter slightly smaller than 200 μm. As the spherical beads 19, the soda lime glass was used. As the sealing part 14, the glass composite material of the lead-free glass composition A-08 shown in Table 1 and the ceramic particles CF-01 shown in Table 3 was used. The compounding ratio between the glass composition A-08 and the ceramic particles CF-01 was, by volume %, 65:35. Further, the sealing part 14 contained the spherical beads 19 by 1 volume % with respect to the glass composite material, and the spacers 18 contained the spherical beads by 20 volume % with respect to the glass composite material.

(Manufacturing of Glass Paste)

The glass paste was manufactured by compounding and mixing the lead-free glass composition particles according to the embodiment of the present invention, the ceramic particles, and the solvent. As the lead-free glass composition particles, the glass composition A-08 having a particle diameter of about 15 μm was used, and as the ceramic particles, the ceramic particles CF-01 (zirconium phosphate tungstate) having a particle diameter of about 30 μm was used. Further, as the solvent, α-terpineol was used, and isobonyl cyclohexanol was added as a viscosity modifier. The glass paste was manufactured such that the compounding ratio between the lead-free glass composition A-08 particles and the ceramic particles CF-01 was, by volume %, 65:35, and the content of solid (sum of the glass composition A-08 and the ceramic particles CF-01) was about 75 to 80 mass %. Further, the glass paste contained spherical beads of soda lime glass having a particle diameter of about 180 to 200 μm. The content of the beads with respect to the solid was 1 volume % for low-temperature sealing, and 20 volume % for the spacer.

(Manufacturing of Vacuum Insulation Multilayer Glass Panel)

A manufacturing method of the vacuum insulation multilayer glass panel according to the present example will be described by using FIGS. 10A to 12.

Figure 10A:
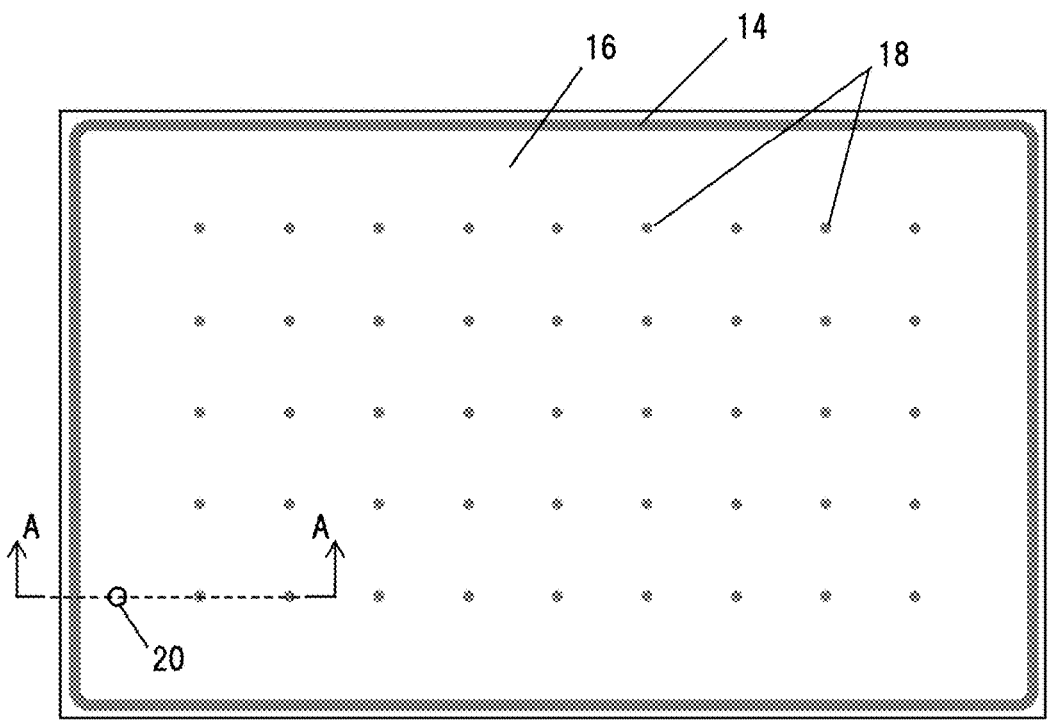
FIG. 10A is a schematic plane diagram showing a part of method of manufacturing the vacuum insulation multilayer glass panel in FIG. 9A.
Figure 10B:
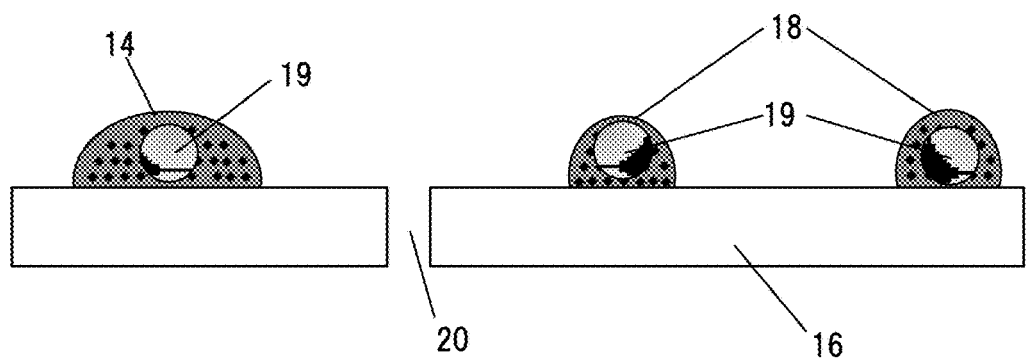
FIG. 10B is an A-A cross-sectional diagram of FIG. 10A.

FIG. 10A shows the soda lime glass substrate 16, forming the vacuum insulation multilayer glass panel shown in FIGS. 9A and 9B, in which the sealing part 14 and the spacers 18 were formed. As shown in FIG. 10A, the above-described manufactured glass paste was applied to an outer peripheral part (sealing part 14) and the inside (spacers 18) of the soda lime glass substrate 16 respectively by the dispenser method, and the glass substrate was dried at 150° C. in the atmosphere. The substrate was heated at a temperature rising rate of 5° C./min in the atmosphere up to 200° C., then held for 30 minutes, such that the sealing part 14 and the spacers 18 were bonded to the soda lime glass substrate 16. As shown in FIG. 10B which is an A-A cross-sectional diagram shown in FIG. 10A, the sealing part 14 and the spacers 18 contain the spherical beads 19.

Figure 11A:
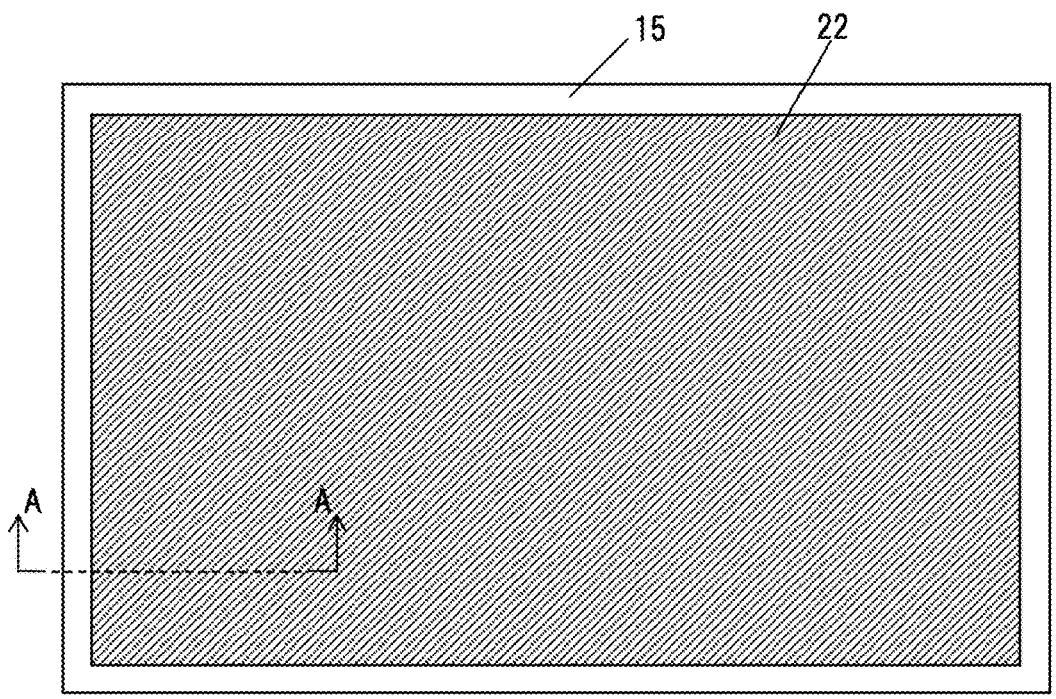
FIG. 11A is a schematic plane diagram showing a part of the method of manufacturing the vacuum insulation multilayer glass panel in FIG. 9A.
Figure 11B:
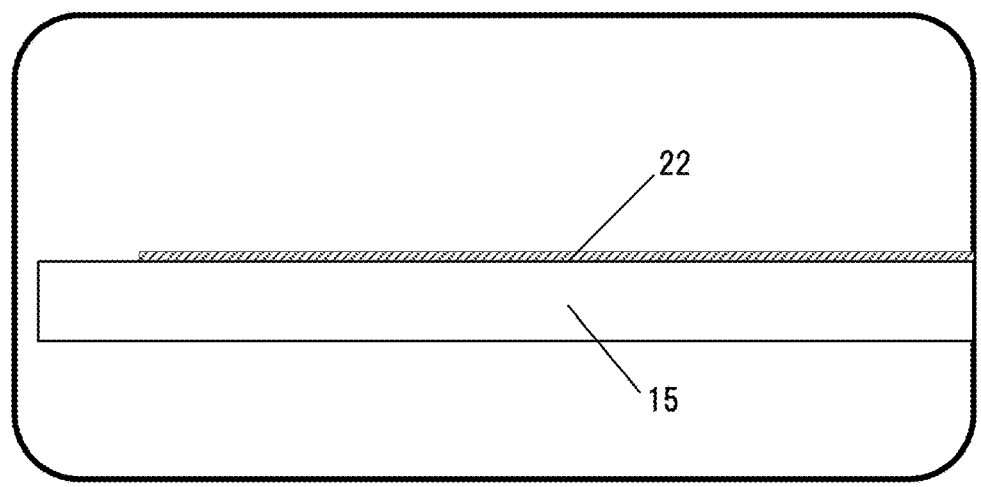
FIG. 11B is an A-A cross-sectional diagram of FIG. 11A.

FIG. 11A shows the soda lime glass substrate 15 forming the vacuum insulation multilayer glass panel shown in FIG. 9B. FIG. 11B is an A-A cross-sectional diagram of FIG. 11A. As shown in FIGS. 11A and 11B, the heat-ray reflective film 22 is formed on one surface of the soda lime glass substrate 15.

Figure 12:
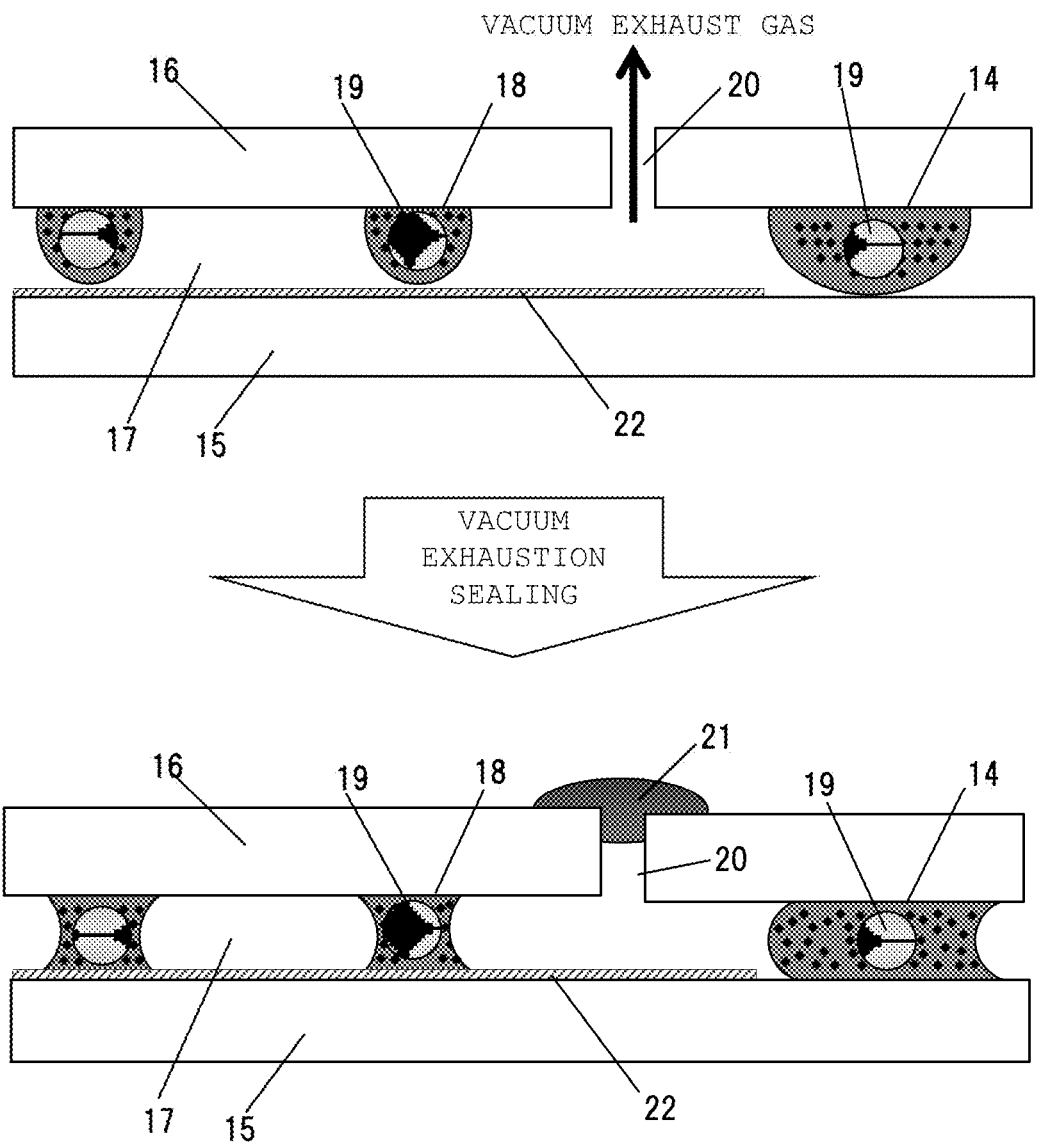
FIG. 12 is a schematic cross-sectional diagram showing a part of the method of manufacturing the vacuum insulation multilayer glass panel in FIG. 9A.

FIG. 12 shows the last process of the manufacturing method of the vacuum insulation multilayer glass panel shown in FIGS. 9A and 9B. In FIG. 12, the soda lime glass substrates 15 and 16 are faced each other, positioned with each other, and fixed with plural thermal resistance clips. The substrates were sealed by thermal processing while being vacuum exhausted.

Figure 13:
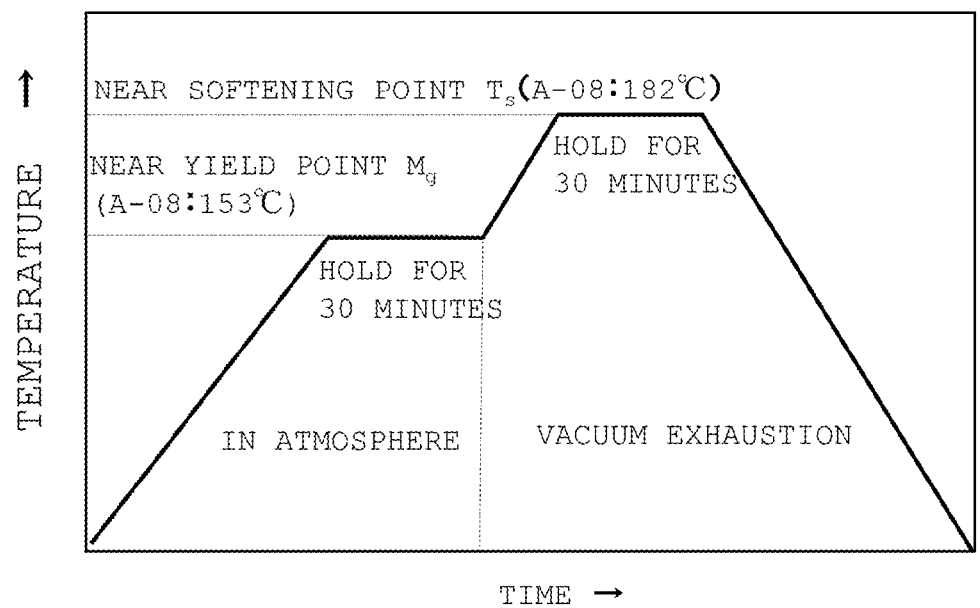
FIG. 13 is a sealing temperature profile in a manufacturing process of the vacuum insulation multilayer glass panel shown in FIG. 12.

FIG. 13 shows a sealing temperature profile in the thermal processing. In the sealing temperature profile shown in FIG. 13, the sealing was performed by heating at a temperature rising rate of 5° C./min in the atmosphere up to around the yield point $M_g$ of the employed lead-free glass composition, i.e. 153° C. as the yield point $M_g$ of the glass composition A-08 here, and holding for 30 minutes, then heating at a temperature rising rate of 5° C./min up to around the softening point $T_s$ of the employed lead-free glass composition, i.e., 182° C. as the softening point $T_s$ of the glass composition A-08 here, while exhausting the inside of the panel with the vacuum pump from the exhaust hole 20, then holding for 30 minutes.

As shown in FIG. 12, upon thermal processing, the sealing part 14 and the spacers 18 were crushed, and bonded to the two soda lime glass substrates 15 and 16. Thereafter, the cap 21 was attached to the exhaust hole 20, thus the vacuum insulation multilayer glass panel was manufactured. Note that in the present example, ten vacuum insulation multilayer glass panels were manufactured.

(Evaluation Result of Manufactured Vacuum Insulation Multilayer Glass Panel)

First, an outer appearance test was performed on the ten vacuum insulation multilayer glass panels manufactured in the present example. As a result, no chink or crack was observed, and there was no problem in the outer appearance. Further, with the spherical beads 19 in the sealing part 14 and the spacers 18, the gap between the soda lime glass substrates 15 and 16 had an almost uniform thickness. That is, the vacuum insulation multilayer glass panel having predetermined space 17 was obtained. Further, it was checked by the helium leak test that the inside of the panel was in vacuum state and the panel outer peripheral part was airtightly sealed.

To check the reliability of the sealing part 14, three of the manufactured vacuum insulation multilayer glass panels were immersed in hot water at 50° C. for 30 days. It was confirmed that in all the three panels, any inside water filtration was not found, and the inside of the panel was maintained in vacuum state. Further, a temperature cycle test at −50° C. to +100° C. was performed 1000 times on other three of the vacuum insulation multilayer glass panels. In this test, in all the three panels, the inside was maintained in vacuum state. Form these results, it was found that in the vacuum insulation multilayer glass panel to which the glass composite material according to the embodiment of the present invention and its glass paste are applied, a sealing part having high thermal resistance and high reliability is obtained. Further, with the glass composite material according to the embodiment of the present invention, and by using the glass composite material, it is possible to remarkably lower the sealing temperature, which greatly contributes to improvement of productivity of the vacuum insulation multilayer glass panel and application of the soda lime glass substrate subjected to cooling and tempering.

As described above, in the present example, as one of representative examples of the sealing structure, the application to the vacuum insulation multilayer glass panel using the glass composite material containing the lead-free glass composition according to the present invention and its glass paste has been described. It was confirmed that it is possible to effectively apply the glass composite material containing the lead-free glass composition according to the present invention and its glass paste to a sealing part of a sealing structure, and to provide a sealing structure having both excellent reliability and productivity. It goes without saying that it is also possible to effectively develop them into other sealing structures than the vacuum insulation multilayer glass panel.

Example 8

In the present example, as one of representative examples of the sealing structure, a display including a large number of organic light emitting diodes (OLED) between two borosilicate glass substrates was manufactured, to substantiate applicability of the glass composite material according to the present invention. Note that in the present example, as glass composite material, its glass paste was used.

Figure 14A:
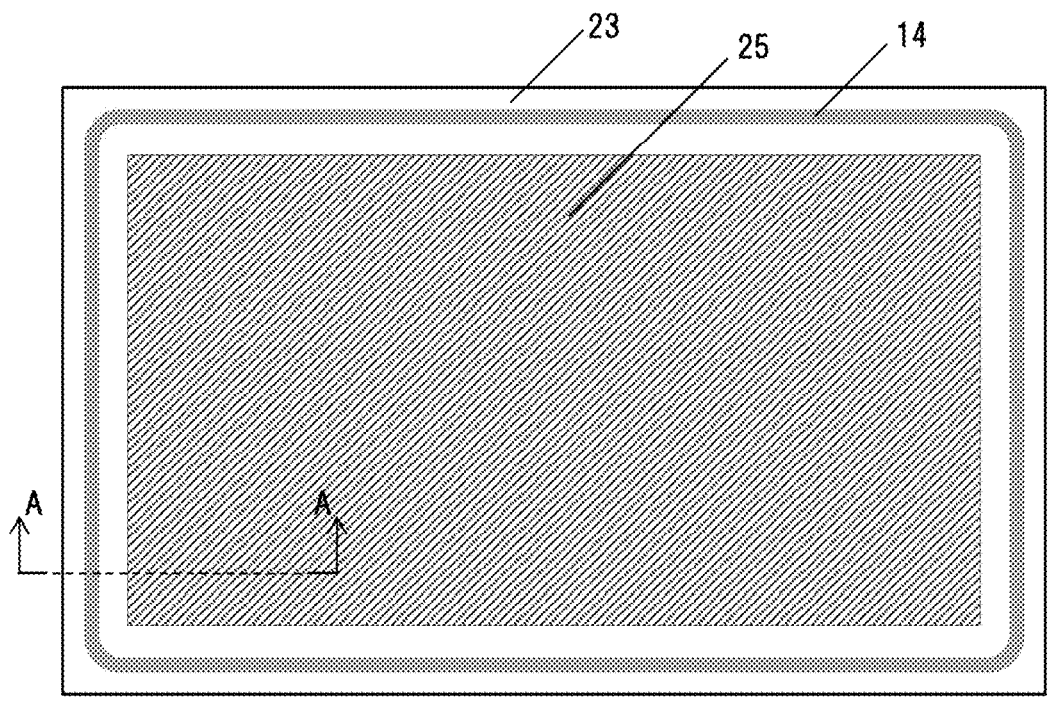
FIG. 14A is a schematic plane diagram of an organic light emitting diode (OLED) display according to another embodiment of the present invention.
Figure 14B:
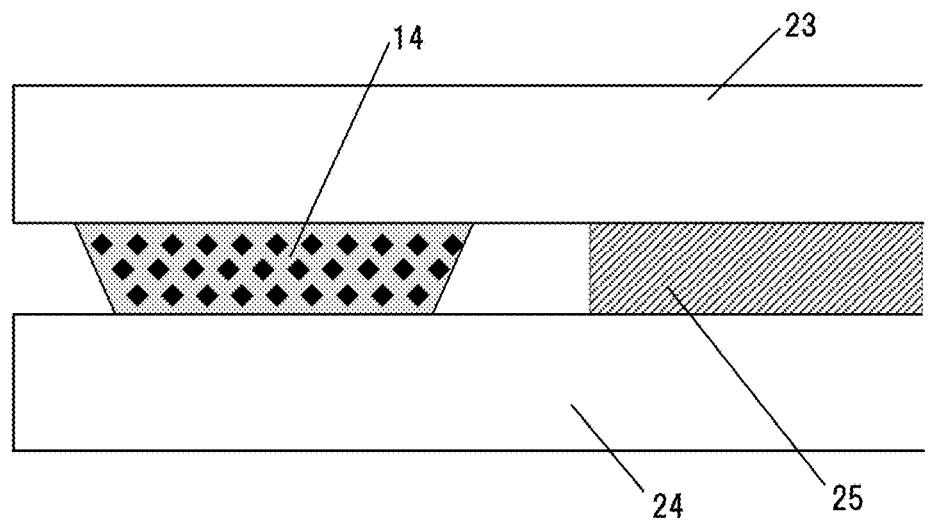
FIG. 14B is an A-A cross-sectional diagram of FIG. 14A.

FIG. 14A is a schematic plane diagram showing an example of the OLED display. FIG. 14B is an A-A cross-sectional diagram of FIG. 14A.

In FIG. 14A, the OLED display has the sealing part 14 as the glass composite material according to the embodiment of the present invention, at an outer peripheral part of a borosilicate glass substrate 23 and a borosilicate glass substrate (numeral 24 in FIG. 14B) stacked on the above substrate with a gap between them. OLEDs 25 are incorporated between the borosilicate glass substrates (23 and 24).

Since the OLED 25 is easily degraded by moisture content and/or oxygen, it is very important to airtightly seal the outer peripheral part of the borosilicate glass substrates 23 and 24, i.e., the sealing part 14, with the glass composite material containing the lead-free glass composition. The glass composite material used in the sealing part 14 contains, in addition to the lead-free glass composition according to the present invention, ceramic particles having a small thermal expansion coefficient for matching with respect to the thermal expansion coefficient of the borosilicate glass substrates 23 and 24 as much as possible. In the present example, as the sealing part 14, the glass composite material of the lead-free glass composition A-19 shown in Table 1 and the ceramic particles CF-02 shown in Table 3 was used. The contents of the glass compositions A-19 and the ceramic particles CF-02 were 60:40 volume %. Further, in the present example, as the glass composite material, its glass paste was used, and as the solvent, high-viscosity α-terpineol was used.

(Manufacturing of Glass Paste)

The glass paste was manufactured by compounding and mixing the lead-free glass composition particles, the ceramic particles, and the solvent. As the lead-free glass composition particles, the glass composition A-19 having an average particle diameter of about 1 μm, and as the ceramic particles, the ceramic particles CF-02 (a chemical compound mainly containing zirconium phosphate tungstate) having an average particle diameter of about 3 μm was used. Further, as the solvent, α-terpineol was used, and isobonyl cyclohexanol was added as a viscosity modifier. As described later, in the ceramic particles CF-02, iron tungstate ($FeWO_4$) was contained in the zirconium phosphate tungstate particles so as to efficiently absorb red semiconductor laser to promote heat generation. The low-temperature sealing glass paste was manufactured such that compounding ratio between the lead-free glass composition A-19 particles and the ceramic particles CF-02 was, by volume %, 60:40, and the content of the solid (sum of A-19 and CF-02) was about 80 mass %.

(Manufacturing of Organic Light Emitting Diode (OLED) Display)

FIGS. 15A to 17 show a manufacturing method of the OLED display according to the present example.

Figure 15A:
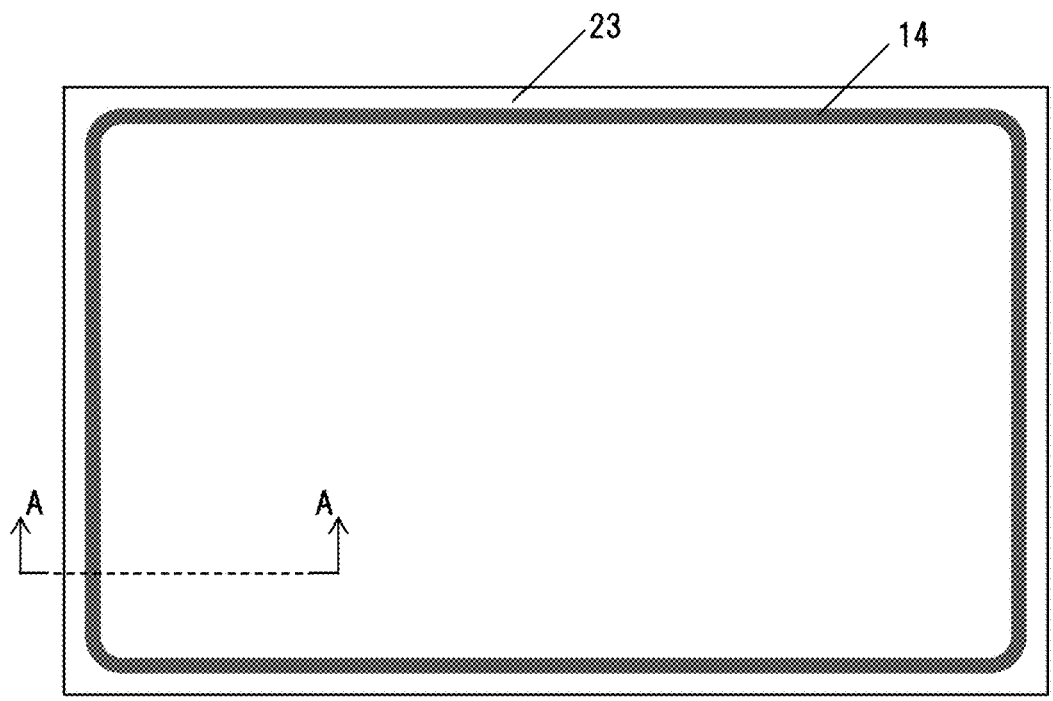
FIG. 15A is a schematic plane diagram showing a part of a method of manufacturing the OLED display in FIG. 14A.
Figure 15B:
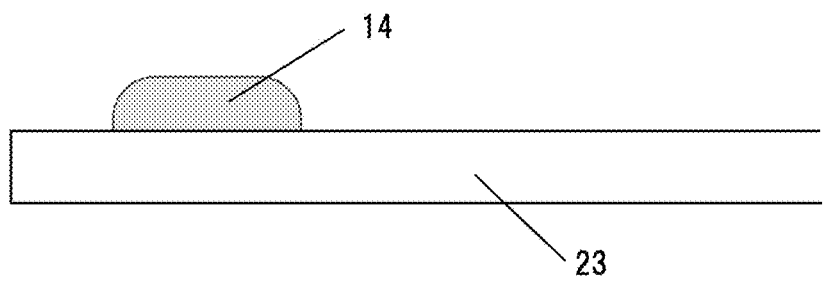
FIG. 15B is an A-A cross-sectional diagram of FIG. 15A.

FIG. 15A shows one substrate of the OLED display. FIG. 15B is an A-A cross-sectional diagram of FIG. 15A. As shown in FIG. 15A, the manufactured above-described glass paste was applied to an outer peripheral part of the borosilicate glass substrate 23 by the screen printing method, and the substrate was dried at 150° C. in the atmosphere. The substrate was heated at a temperature rising rate of 5° C./min in the atmosphere up to 200° C., and held for 30 minutes. With this configuration, the sealing part 14 was formed at the outer peripheral part of the borosilicate glass substrate 23.

Note that the sealing part 14 formed at the outer peripheral part of the borosilicate glass substrate 23 had a line width of about 2 mm, and a fired film thickness of about 15 μm.

Figure 16A:
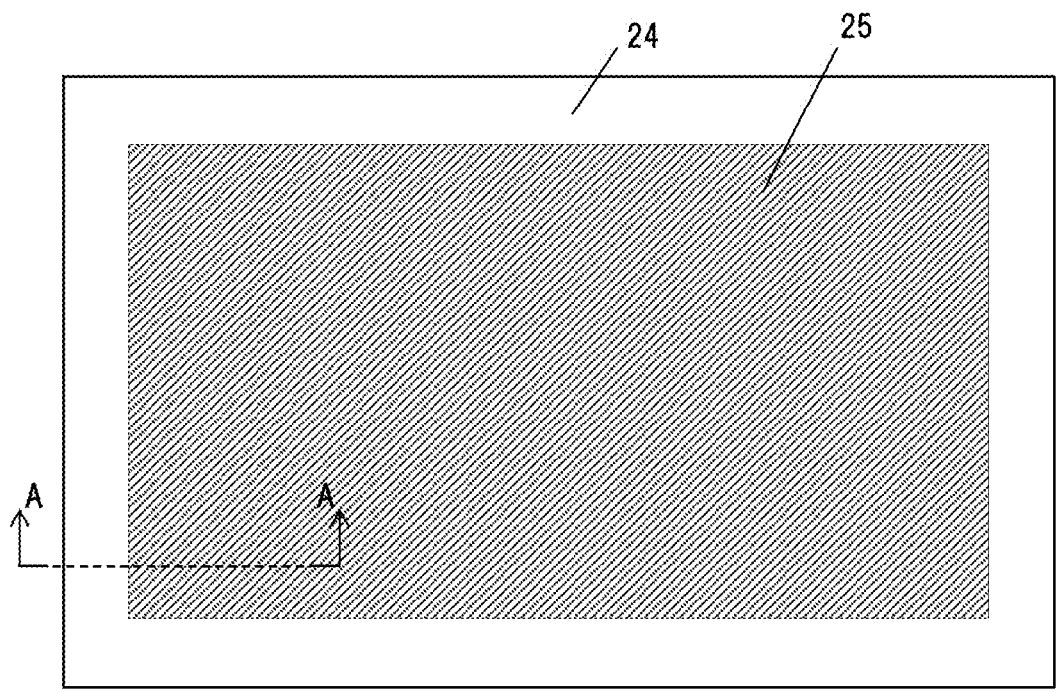
FIG. 16A is a schematic plane diagram showing a part of the method of manufacturing the OLED display in FIG. 14A.
Figure 16B:
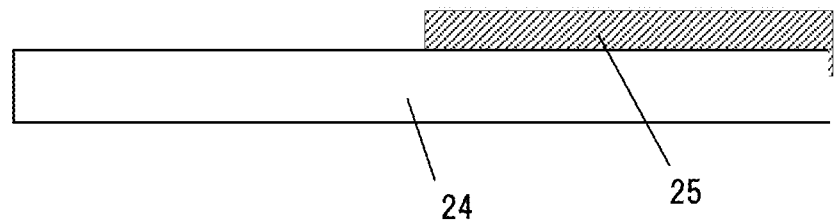
FIG. 16B is an A-A cross-sectional diagram of FIG. 16A.
Figure 17:
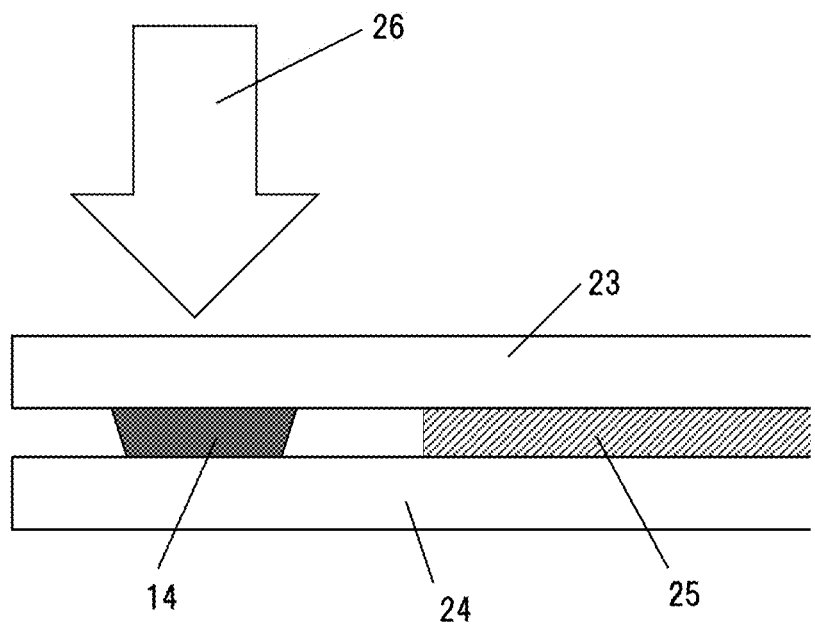
FIG. 17 is a schematic cross-sectional diagram showing a part of the method of manufacturing the OLED display in FIG. 14.

FIG. 16A shows the other substrate of the OLED display. FIG. 16B is an A-A cross-sectional diagram of FIG. 16A. As shown in these figures, the large number of OLEDs 25 corresponding to the number of pixels were formed on the borosilicate glass substrate 24. The borosilicate glass substrate 24 on which the OLEDs 25 were formed and the borosilicate glass substrate 23 on which the sealing part 14 was formed were faced each other as shown in FIG. 17, and laser 26 was irradiated from the direction of the borosilicate glass substrate 23 toward the sealing part 14 in low-vacuum state. As the laser 26, red semiconductor laser having a wavelength of 805 nm was used for effective absorption of the laser wavelength in the lead-free glass composition and the low-thermal expansion ceramic particles in the glass composite material, to cause heat generation, and promote softening and fluidization of the lead-free glass composition. The laser 26 was moved at the outer peripheral part at a speed of 10 mm/sec, and the outer peripheral parts of the borosilicate glass substrates 23 and 24 were bonded with the sealing part 14, thus the OLED display was manufactured.

Note that in the present example, five OLED displays were manufactured. The laser was used to prevent thermal damage to the OLED and to improve the productivity.

(Evaluation Result of Manufactured Organic Light Emitting Diode (OLED) Display)

First, a lighting test of the manufactured OLED display was performed. As a result, it was confirmed that the display was turned on without any problem. Further, the bonding property and adhesive property of the sealing part were good. Next, the OLED display was subjected to a high-temperature high-humidity test (saturated pressure cooker test) for 1 day, 3 days, and 7 days on the condition of 120° C.-100% Rh-202 kPa, and the lighting test was similarly performed. As a comparative example, the OLED display sealed only with resin was subjected to the test. Note that the line width of the resin sealing was about 5 mm, and the thickness was about 15 μm. In the 1 day high-temperature high-humidity test, the both of OLED displays were turned on without any problem. However, in the resin-sealed OLED display, serious degradation occurred in the lightening from the 3 days and the subsequent days. As moisture content and oxygen were introduced from the resin sealing part into the inside of the OLED display, the OLED was degraded. On the other hand, in the OLED according to the present example, even in the 7 days high-temperature high-humidity test, degradation was not observed in the lighting of the OLED, and the test result was good. This result indicated that good airtightness was maintained. Further, as a result of evaluation of the bonding property and adhesive property of the sealing part after the high-temperature high-humidity test, serious degradation as in the resin sealing was not observed, but the properties were approximately equivalent to those before the test.

As described above, in the present example, as one of representative examples of the sealing structure, the application to the organic light emitting diode (OLED) display using the glass composite material containing the lead-free glass composition according to the present invention and its glass paste has been described. It was confirmed that it is possible to effectively apply the glass composite material containing the lead-free glass composition according to the present invention and its glass paste to the sealing part of the sealing structure, and to provide a sealing structure in which both of high functionality including reliability and productivity are excellent. Further, from the result of the present example, it goes without saying that it is possible to effectively develop them to sealing structures which are thermal-damage susceptible such as OLED-mounted lighting equipment, an organic photovoltaic cell, an organic device-mounted MEMS sensor and the like.

Example 9

In the present example, as one of representative examples of the electrical/electronic component, a photovoltaic cell using a silicon (Si) substrate having a pn junction was manufactured, and it was examined and evaluated as to whether or not the glass composite material according to the present invention is applicable to the electrodes/wirings of the photovoltaic cell. Note that in the present example, as the glass composite material, its glass paste was used.

Figure 18A:
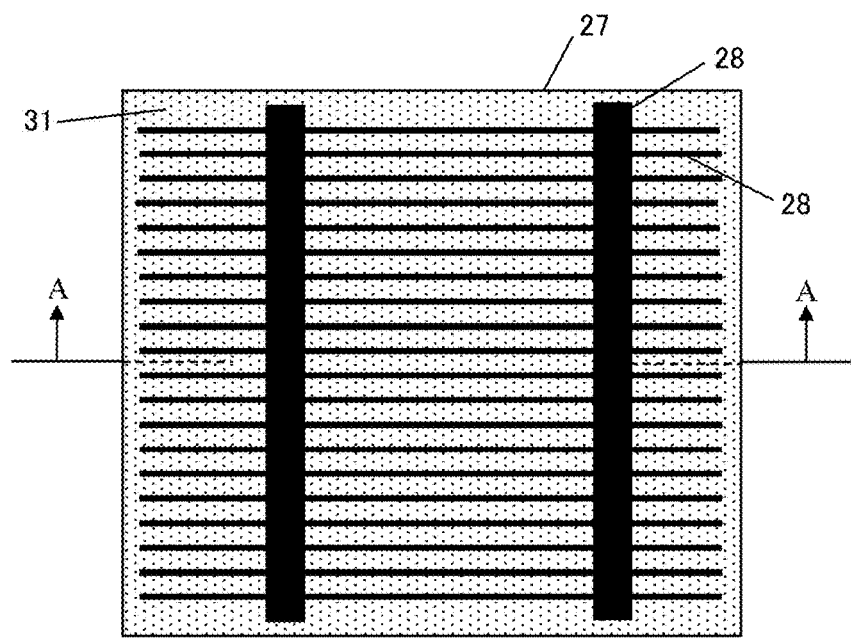
FIG. 18A is a schematic plane diagram showing a light receiving surface of a photovoltaic cell according to another embodiment of the present invention.
Figure 18B:
FIG. 18B is a rear diagram of the light receiving surface of the photovoltaic cell in FIG. 18A.
Figure 18C:
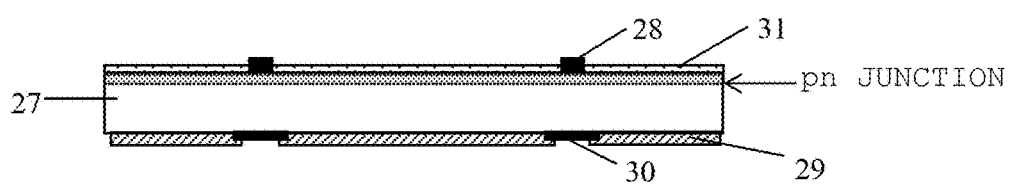
FIG. 18C is an A-A cross-sectional diagram of FIG. 18A.

FIG. 18A is a schematic diagram of a light receiving surface of the manufactured photovoltaic cell. FIG. 18B is a schematic diagram of the rear surface. FIG. 18C is an A-A cross-sectional diagram of FIG. 18A.

In FIG. 18A, light receiving surface electrodes/wirings 28 and an antireflective film 31 are formed on the light receiving surface of the Si substrate 27 (silicon substrate) of the photovoltaic cell.

As shown in FIG. 18B, collector electrodes/wirings 29 and output electrodes/wirings 30 are formed on the rear surface of the photovoltaic cell.

As shown in FIG. 18C, the photovoltaic cell has a pn junction 31 on the light receiving surface side of the Si substrate 27. As the light receiving surface electrodes/wirings 28, the collector electrodes/wirings 29, and the output electrodes/wirings 30, the glass composite material according to the embodiment of the present invention is used. Conventionally, for formation of the light receiving surface electrodes/wirings 28 and the output electrodes/wirings 30, lead-containing glass paste containing silver (Ag) particles and lead-containing low-melting glass composition particles was used, and for formation of the collector electrodes/wirings 29, lead-containing glass paste containing aluminum (Al) particles and lead-containing low-melting glass composition particles was used. These lead-containing glass pastes were respectively applied to both surfaces of the Si substrate 27 by the screen printing method or the like. Then after the substrate was dried, it was fired at 500 to 800° C. in the atmosphere, thus the respective electrodes/wirings were formed on the both surfaces of the Si substrate 27. In addition to the problem of containing of the harmful lead, other problems occurred. Since the firing temperature for formation of the electrodes/wirings was high, the photovoltaic cell was strongly warped. Upon handling of the substrate, the Si substrate 27 became easily breakable. Further, a fragile metal compound was generated by reaction between Al in the collector electrodes/wirings 29 and Ag in the output electrodes/wirings 30. When stress concentrated on the metal compound, a crack or the like easily occurred in the Si substrate 27.

In the present example, as the Si substrate 27 having the pn junction, a monocrystal Si substrate for 150×150×0.2 mm photovoltaic cell was used. Further, as the light receiving surface of the Si substrate 27, the antireflective film 31 of silicon nitride (SiN) was formed by about 100 nm. As the light receiving surface electrodes/wirings 28 and the output electrodes/wirings 30, the glass composite material containing the lead-free glass composition A-35 shown in Table 1 and the spherical silver (Ag) particles having an average particle diameter of about 1.5 μm was used. The contents of the glass composition A-35 and the Ag particles were, by volume %, 20:80. As the collector electrodes/wirings 29, a conductive material containing the lead-free glass composition A-38 shown in Table 1 and the spherical aluminum (Al) particles having an average particle diameter of about 3 μm was used. The contents of the glass composition A-38 and the Al particles were 15:85 volume %.

(Manufacturing of Conductive Glass Paste)

The glass paste was manufactured by compounding and mixing the lead-free glass composition A-35 or A-38 particles, the silver (Ag) or aluminum (Al) metal particles, and the solvent. As the glass paste used in the light receiving surface electrodes/wirings 28 and the output electrodes/wirings 30, the glass composition A-35 particles having an average particle diameter of about 1 μm and the spherical Ag particles having the average particle diameter of about 1.5 μm were used, and the compounding ratio was, by volume %, 20:80. As the solvent, α-terpineol was used, and isobonyl cyclohexanol was added as a viscosity modifier. Further, as the glass paste used in the collector electrodes/wirings 29, the glass composition A-38 particles having an average particle diameter of about 1 μm and the spherical Al particles having the average particle diameter of about 3 μm were used, and the compounding ratio was, by volume %, 15:85. As the solvent, α-terpineol was used, and isobonyl cyclohexanol was added as a viscosity modifier. In any of the glass pastes, the content of the solid (sum of the lead-free glass composition particles and the metal particles) in the paste was about 80 mass %.

(Manufacturing of Photovoltaic Cell)

A manufacturing method of the photovoltaic cell shown in FIGS. 18A to 18C will be described.

The glass paste manufactured as described above containing the glass composition A-35 particles and the Ag particles was applied to the light receiving surface side of the Si substrate 27 (150×150×0.2 mm), in which the antireflective film 31 was formed on the light receiving surface, by the screen printing method, and dried at about 150° C. The substrate was heated at a temperature rising rate of about 20° C./min up to 200° C. in a tunnel furnace, and was held for 30 minutes, thus the light receiving surface electrodes/wirings 28 were formed on the light receiving surface of the Si substrate 27. Next, the glass paste containing the glass composition A-35 particles and the Ag particles the same as above was applied to the rear surface of the Si substrate 27, by the screen printing method, and dried at about 150° C. Further, the glass paste manufactured as described above containing the glass composition A-38 particles and the Al particles was applied by the screen printing method, and dried at about 150° C. The substrate was fired on the same heating condition as that of the light receiving surface electrodes/wirings 28, thus the collector electrodes/wirings 29 and the output electrodes/wirings 30 were formed on the rear surface of the Si substrate 27. The twice heating history was added to the light receiving surface electrodes/wirings 28, with which electrical connection from the light receiving surface electrodes/wirings 28 to the Si substrate 27 became good. In this manner, the light receiving surface electrodes/wirings 28, the collector electrodes/wirings 29, and the output electrodes/wirings 30 were formed, thus the photovoltaic cell according to the present example was manufactured. Note that in the present example, ten photovoltaic cells were manufactured.

(Evaluation Result of Manufactured Photovoltaic Cell)

First, an outer appearance test was performed on the ten photovoltaic cells manufactured in the present example. As a result, no chink or crack was observed in the Si substrate 27 and the light receiving surface electrodes/wirings 28, the collector electrodes/wirings 29, and the output electrodes/wirings 30 formed on the Si substrate 27. Further, no strong warp was observed, and there was no problem in the outer appearance. This is the effect obtained by lowering the forming temperature of the various electrodes/wirings to a remarkably low temperature with the lead-free glass composition according to the present invention. Next, it was checked that in the ten manufactured photovoltaic cells, electrical connection between the Si substrate 27 and the light receiving surface electrodes/wirings 28, and ohmic contact between the Si substrate 27 and the collector electrodes/wirings 29 and the output electrodes/wirings 30 were obtained, and there was no problem. Next, the power generation efficiency of the ten manufactured photovoltaic cells was evaluated with a solar simulator. Even though the manufacturing temperature was remarkably lowered, the efficiency of about 18% equivalent to the conventional efficiency was obtained. Further, to check the reliability, three of the manufactured photovoltaic cells were immersed in hot water at 50° C. for 5 days, and the power generation efficiency was similarly measured. In the conventional photovoltaic cell, the electrodes/wirings were corroded, and the power generation efficiency was remarkably degraded to about 12 to 13%. In the photovoltaic cell manufactured in the present example, the electrodes/wirings were almost not corroded, and degradation of the power generation efficiency was not observed. It is considered that as described in the example 3 and the example 4, this high-reliability photovoltaic cell is obtained by the characteristic reaction between the lead-free glass composition according to the present invention and Ag or Al.

Next, an overlap part between the collector electrodes/wirings 29 and the output electrodes/wirings 30 formed on the rear surface was subjected to a disassembly inspection. The generation of a fragile metal compound by the reaction between Ag and Al was not observed. With this configuration, even when stress concentrated, the occurrence of a crack or the like in the Si substrate 27 was suppressed. Further, as the warp of the Si substrate 27 was greatly reduced, the breakage upon handling such as installation into a module was reduced. As the firing temperature (200° C.) of the photovoltaic cell according to the present example is much lower than that (500 to 800° C.) of the conventional photovoltaic cell, the generation of a fragile metal compound is prevented and the warp is reduced.

As described above, in the present example, as one of representative examples of the electrical/electronic component, an application to the photovoltaic cell having the electrodes/wirings formed by using the glass composite material containing the lead-free glass composition according to the example of the present invention and its glass paste has been described. The glass composite material containing the lead-free glass composition according to the present invention and its glass paste are not limited to the photovoltaic cell, but are effectively applicable to electrodes/wirings of various electrical/electronic components. It is possible to provide an electrical/electronic component in which high functionality including reliability, productivity, and yield improvement are excellent.

Example 10

In the present example, as one of representative examples of the electrical/electronic component, a crystal oscillator package was manufactured, to examine whether or not the glass composite material according to the present invention is applicable to a conductive junction and a sealing part of the package. Note that in the present example, as the glass composite material, its glass paste was used.

FIGS. 19A to 19F show a manufacturing method of the crystal oscillator package. FIG. 19G is a cross-sectional schematic diagram of the manufactured crystal oscillator package.

The crystal oscillator package shown in FIG. 19G has a crystal oscillator 32 provided via a conductive junction 35 on the surface of a ceramic substrate 33 having wirings 34. The wirings 34 and the conductive junction 35 are electrically connected. With this configuration, the crystal oscillator 32 is electrically connected to the outside. A ceramic cap 36 is used for protection of the crystal oscillator 32. The ceramic cap is airtightly bonded with a sealing part 37 to an outer peripheral part of the ceramic substrate 33. As the conductive junction 35, the glass composite material containing the lead-free glass composition according to the present invention and the metal particles is used, and as the sealing part 37, the glass composite material containing the lead-free glass composition according to the present invention and the ceramic particles is used.

The manufacturing method of the crystal oscillator package is as follows.

Figure 19A:
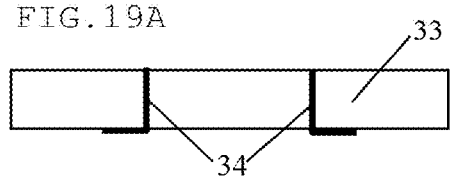
FIG. 19A is a schematic cross-sectional diagram showing a method of manufacturing a crystal oscillator package according to another embodiment of the present invention.
Figure 19B:
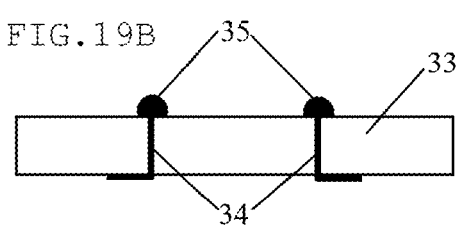
FIG. 19B is a schematic cross-sectional diagram showing a method of manufacturing the crystal oscillator package according to the embodiment of the present invention.
Figure 19D:
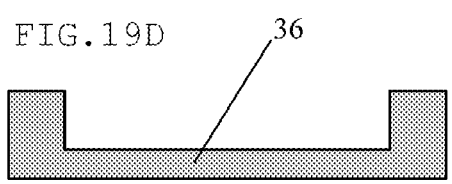
FIG. 19D is a schematic cross-sectional diagram showing the method of manufacturing the crystal oscillator package according to the embodiment of the present invention.

First, the ceramic substrate 33 on which the wirings 34 shown in FIG. 19A are formed is manufactured. Next, as shown in FIG. 19B, the glass paste containing the metal particles is applied on the wirings 34, then dried, and heated in the atmosphere, such that the lead-free glass composition in the glass composite material is softened and fluidized, thus the conductive junction 35 is formed.

Figure 19C:
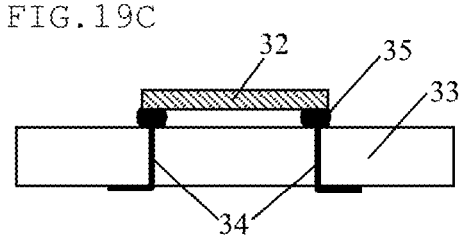
FIG. 19C is a schematic cross-sectional diagram showing the method of manufacturing the crystal oscillator package according to the embodiment of the present invention.

As shown in FIG. 19C, the crystal oscillator 32 is provided on the conductive junction 35, and heated in inert gas or in vacuum environment, to again soften and fluidize the lead-free glass composition in the conductive junction 35 and establish electrical connection.

On the other hand, the ceramic cap 36 shown in FIG. 19D is prepared. Then as shown in FIG. 19E, the glass paste containing the ceramic particles is applied to the outer peripheral part of the ceramic cap 36, then dried, and heated in the atmosphere, such that the lead-free glass composition in the glass composite material is softened and fluidized, thus the sealing part 37 is formed.

Figure 19E:
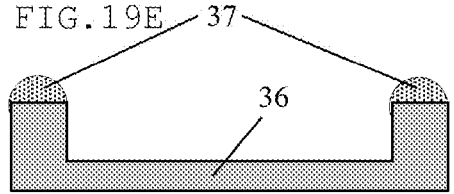
FIG. 19E is a schematic cross-sectional diagram showing the method of manufacturing the crystal oscillator package according to the embodiment of the present invention.
Figure 19F:
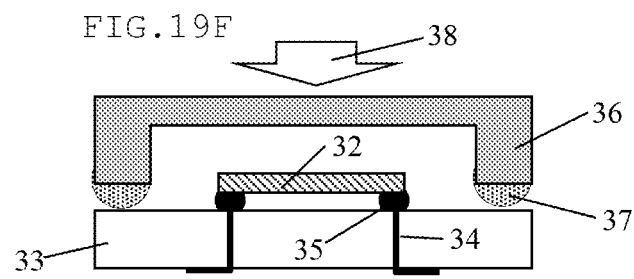
FIG. 19F is a schematic cross-sectional diagram showing the method of manufacturing the crystal oscillator package according to the embodiment of the present invention.
Figure 19G:
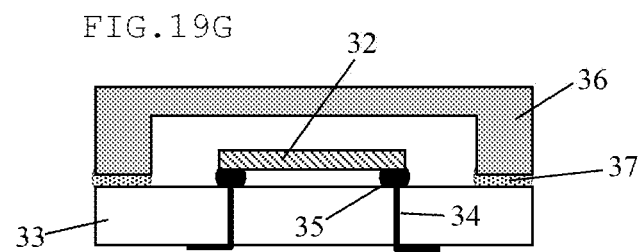
FIG. 19G is a schematic cross-sectional diagram showing the crystal oscillator package manufactured by the method in FIGS. 19A to 19F.

The ceramic substrate 33 having the crystal oscillator 32 and the conductive junction 35 shown in FIG. 19C and the ceramic cap 36 having the sealing part 37 shown in FIG. 19E are attached as shown in FIG. 19F, heated in inert gas or in vacuum environment and subjected to slight load 38, such that the lead-free glass composition in the sealing part 37 is again softened and fluidized. With this configuration, the crystal oscillator package shown in FIG. 19G is obtained.

Note that at that time, it is necessary to be careful about peel off of the conductive junction 35 from the crystal oscillator 32 and/or the wirings 34. For this purpose, it is effective to lower the softening point $T_s$ of the lead-free glass composition in the sealing part 37 to a temperature lower than the softening point $T_s$ of the lead-free glass composition in the conductive junction 35. That is, it is necessary to prepare the lead-free glass composition, contained in the glass composite material, as the glass composition which differs in accordance with application position of a part.

(Manufacturing of Glass Paste Used in Conductive Junction and Sealing Part)

In the present example, as the lead-free glass composition in the glass paste used for formation of the conductive junction 35, the glass composition A-37 shown in Table 1 having the softening point $T_s$ at 200° C. was used, and as the lead-free glass composition in the glass paste used for formation of the sealing part 37, the glass composition A-03 shown in Table 1 having the softening point $T_s$ at 177° C. was used. As a temperature difference of the softening point $T_s$ between the glass compositions A-37 and A-03 is 23° C., it seems possible to perform sealing without problem of peel-off or the like of the conductive junction 35. That is, it is possible to simultaneously obtain good conductive junction 35 and sealing part 37.

The glass paste for formation of the conductive junction 35 was manufactured by compounding and mixing the lead-free glass composition particles, the metal particles, and the solvent. As the lead-free glass composition particles, particles of the glass composition A-37 having an average particle diameter of about 3 μm were used, as the metal particles, spherical silver (Ag) particles having an average particle diameter of about 1.5 μm were used. As the solvent, α-terpineol was used, and isobonyl cyclohexanol was added as a viscosity modifier. The compounding ratio between the glass composition A-37 particles and the Ag particles was, by volume %, 30:70. The glass paste for formation of the conductive junction 35 was manufactured such that the content of the solid (sum of the glass composition A-37 and the Ag particles) was about 80 mass %.

The glass paste for formation of the sealing part 37 was manufactured by compounding and mixing the lead-free glass composition particles, the ceramic particles, and solvent. As the lead-free glass composition particles, particles of the glass composition A-03 having an average particle diameter of about 3 μm were used, as the ceramic particles, the ceramic particles CF-01 (zirconium phosphate tungstate) shown in Table 3 having an average particle diameter of about 10 μm were used. As the solvent, α-terpineol was used, and isobonyl cyclohexanol was added as a viscosity modifier. The glass paste for formation of the sealing part 37 was manufactured such that the compounding ratio between the glass composition A-03 particles and the ceramic particles CF-01 was, by volume %, 70:30, and the content of the solid (sum of the glass composition A-03 and the ceramic particles CF-01) was about 80 mass %.

(Manufacturing of Crystal Oscillator Package)

The manufacturing method of the crystal oscillator package according to the present example will be more particularly described. In the present example, as the ceramic substrate 33 and the ceramic cap 36, alumina (α-$Al_2O_3$) substrate and alumina cap were used.

As shown in FIGS. 19A and 19B, the glass paste for formation of the above-described conductive junction 35 was applied on the wirings 34 formed on the ceramic substrate 33, by the dispenser method, and dried at about 150° C. in the atmosphere. The substrate was heated at a temperature rising rate of 10° C./min in the atmosphere up to 200° C. and held for 30 minutes, thus the conductive junction 35 was formed on the wirings 34 on the ceramic substrate 33.

Next, as shown in FIG. 19C, the crystal oscillator 32 was provided on the conductive junction 35, and heated at a temperature rising rate of 20° C./min in inert gas (in argon) up to 210° C., then held for 10 minutes, thus the crystal oscillator 32 was connected to the conductive junction 35.

On the other hand, as shown in FIGS. 19D and 19E, the glass paste for formation of the above-described sealing part 37 was applied to the outer peripheral part of ceramic cap 36, by the screen printing method, and dried at about 150° C. in the atmosphere. The cap was heated at a temperature rising rate of 10° C./min in the atmosphere up to 190° C., and held for 30 minutes, thus the sealing part 37 was formed at the outer peripheral part of the ceramic cap 36.

As shown in FIG. 19F, the ceramic cap 36 in which the sealing part 37 was formed was attached to the ceramic substrate 33 connected to the crystal oscillator 32, then provided on a specialized fixing jig, and subjected to load. They were heated at a temperature rising rate of 10° C./min in the atmosphere up to 180° C. and held for 15 minutes, to seal the ceramic cap 36 and the ceramic substrate 33, thus the crystal oscillator package shown in FIG. 19G was manufactured. Note that in the present example, twenty-four crystal oscillator packages were manufactured.

(Evaluation Result of Manufactured Crystal Oscillator Package)

First, an outer appearance test was performed with a stereomicroscope on eighteen of the crystal oscillator packages manufactured in the present example. As a result, shift of the ceramic cap 36 upon sealing almost did not occurred, further, no chink or crack due to crystallization was observed in the sealing part 37. There was no problem in the outer appearance.

Next, as to whether or not the conductive junction 35 inside the sealed ceramic cap 36 was electrically connected to the crystal oscillator 32 and the wirings 34, it was checked by a conduction test from the wirings 34 on the rear of the ceramic substrate 33 that the crystal oscillator operated in all the manufactured crystal oscillator packages. Further, in five of the manufactured crystal oscillator packages, it was checked by performing the helium leak test that the inside of the package was in vacuum state, and the outer peripheral part was airtightly sealed with the sealing part 37. To check the reliability of the sealing part 37, five of the manufactured crystal oscillator packages were subjected to a high-temperature high-humidity test (saturated pressure cooker test) for 3 days on the condition of 120° C.-100% Rh-202 kPa. Thereafter, the helium leak test was performed, and it was confirmed in all the crystal oscillator packages subjected to the high-temperature high-humidity test that the airtightness and bonding properties of the sealing part 37 were maintained.

As described above, it was found that by applying the glass composite material, containing the lead-free glass composition according to the present invention and the metal particles or the ceramic particles, and its glass paste, to the conductive junction or the sealing part, it is possible, with consideration of influence on environmental load, to obtain high-reliability crystal oscillator package. In the present example, as one of representative examples of the electrical/electronic component and the sealing structure, an application to the crystal oscillator package has been described. The glass composite material according to the present invention and its glass paste are not limited to the crystal oscillator package, but effectively developable to many conductive junctions and sealing parts, further, to electrical/electronic components and sealing structures having a heat dissipation junction.

Example 11

In the present example, as one of representative examples of the electrical/electronic component, the possibility of development to a resin wiring board was examined. On the resin wiring board, devices such as a capacitor, an inductor and the like are mounted and integrated. Wirings on the resin wiring board are formed by plating or the like on the resin substrate, and the devices are electrically connected to the wirings. As the resin substrate, generally, epoxy or phenoxy resin containing glass fiber is used since such resin is cheap. The thermal resistance of this resin substrate is low and is about 200° C. Accordingly, conventionally, to electrically connect the wirings on the resin substrate to the devices, lead solder having a melting point equal to or lower than 200° C. was applied. However, by recent environmental regulations such as the RoHS directive, the lead solder cannot be used. As a substitute for the lead solder, lead-free tin solder may be used, however, it is difficult to heat the solder in the atmosphere. Further, since it is necessary to raise the connection temperature to near 250° C., there is a problem that the temperature exceeds the thermal resistance of the resin wiring board. Accordingly, lead-free resin silver paste began to be used in the device connection part of the resin wiring board. The connection of the devices with the resin silver paste to the resin wiring board is possible at around 150° C. in the atmosphere, and the connection part is formed with silver particles and resin. However, to set the resin, it was necessary to hold it for several hours at about 150° C. in the atmosphere. Further, with the resin silver paste, necking of the silver particles was not performed in the resin, accordingly, it was hard to say that the conductivity of the device connection part was high. Further, as the device connection part contained resin, it was hard to say that the reliability such as humidity resistance was sufficient.

(Manufacturing of Conductive Glass Paste)

The devices such as a capacitor and an inductor were connected to the resin wiring board by using the conductive glass paste of the glass composite material containing the lead-free glass composition and the metal particles. As the lead-free glass composition, the glass composition A-03 shown in Table 1 having the softening point $T_s$ at 177° C. was used, and its average particle diameter was 2 μm. As the metal particles, spherical silver (Ag) having an average particle diameter of about 1.5 μm was used. Further, as the solvent for manufacturing the conductive glass paste, α-terpineol was used. The conductive glass paste was manufactured such that the compounding ratio between the glass composition A-03 particles and the Ag particles was, by volume %, 25:75, and the content of the solid (sum of the glass composition A-03 and Ag) was about 80 mass %.

(Connection of Devices to Resin Wiring Board)

The plural devices were connected, by using the manufactured conductive glass paste, on predetermined wirings on the resin wiring board. As the method of device connection, first, the conductive glass paste was applied to the predetermined wirings, then the plural devices were placed on the wirings, and dried at about 150° C. in the atmosphere. Thereafter, the wiring board was heated at a temperature rising rate of 10° C./min in the atmosphere up to 190° C. and was held for 10 minutes, thus the plural devices were electrically connected to the resin wiring board. Further, as a comparative example, a resin wiring board, to which plural devices were electrically connected, by using the resin silver paste, and being held at 150° C. in the atmosphere for 5 hours, was manufactured.

(Evaluation Result of Device-Connected Resin Wiring Board)

It was found that when the conductive glass paste according to the present example is used, it is possible to connect the devices to the resin wiring board in time remarkably shorter than that in the resin silver paste used in the comparative example, and to improve the productivity. Further, it was found that the connection resistance was within a range of $10^{-6}$ to $10^{-5}$ Ωcm, as estimated from FIG. 8, lower than that when the resin silver paste of the comparative example is used by one or more digits, and the conductivity is very high. As the necking of the silver particles occurs in the lead-free glass composition according to the present invention, the conductivity is very high. Further, as a result of 85° C.-85% Rh high-temperature high-humidity test for 3 days, in the comparative example, corrosion was observed in the device connection part, and a tendency of increase of the connection resistance was observed. In the present example, the corrosion of the device connection part and the increment of the connection resistance were almost not observed, and it was found that it is possible to obtain a high-reliability device connection part.

As described above, it was found that it is possible to effectively apply the glass composite material containing the lead-free glass composition according to the present invention and the metal particles and its glass paste to electrical connection of the devices to the resin wiring board. It goes without saying that it is possible to widely develop this resin wiring board as various electrical/electronic components.

In the examples 7 to 11, as the sealing structures and the electrical/electronic components, the vacuum insulation multilayer glass panel, the OLED display, the photovoltaic cell, the crystal oscillator package, and the resin wiring board have been described as representative examples, however, the present invention is not limited to them, but apparently applicable to many sealing structures and electrical/electronic components such as various display panels, a package device, an image display device, a multilayer capacitor, an inductor, a light emitting diode, a multilayer circuit board, a semiconductor module, a semiconductor sensor, a semiconductor sensor and the like.

LIST OF REFERENCE SIGNS

1: columnar base material, 1': columnar metal base material, 2,2': bonded surface, 3,3': glass paste, 4,4': glass composite material, 5: plate base material, 5': plate metal base material, 6: substrate, 7: wiring (DH-01 in Table 11), 8: wiring (DH-02 in Table 11), 9: wiring (DH-03 in Table 11), 10: wiring (DH-04 in Table 11), 11: wiring (DH-05 in Table 11), 12: wiring (DH-06 in Table 11), 13: wiring (DH-07 in Table 11), 14: sealing part, 15, 16: soda lime glass substrate, 17: space, 18: spacer, 19: spherical beads, 20: exhaust hole, 21: cap, 22: heat-ray reflective film, 23, 24: borosilicate glass substrate, 25: organic light emitting diode (OLED), 26: laser, 27: silicon (Si) substrate, 28: light receiving surface electrodes/wirings, 29: collector electrodes/wirings, 30: output electrodes/wirings, 31: antireflectivefilm, 32: crystal oscillator, 33: ceramic substrate, 34: wirings, 35: conductive junction, 36: ceramic cap, 37: sealing part, 38: load

The invention claimed is:

1. A lead-free glass composition, containing silver oxide, tellurium oxide, and vanadium oxide,
   further, as additional components, containing at least one of yttrium oxide, lanthanum oxide, cerium oxide, erbium oxide, ytterbium oxide, aluminum oxide, gallium oxide, indium oxide, and iron oxide,
   wherein the contents (mol %) of the silver oxide, the tellurium oxide, and the vanadium oxide, when calculated in terms of the oxides as shown below, have the relationship of $Ag_2O > TeO_2 \geq V_2O_5$, and $Ag_2O \leq 2V_2O_5$, and
   wherein the content of $TeO_2$ is 25 mol % to 37 mol %.

2. The lead-free glass composition according to claim 1, wherein, when calculated in terms of the oxides, the content of $Ag_2O$ is equal to or greater than 40 mol % and less than 50 mol %, and the content of $V_2O_5$ is equal to or greater than 20 mol % and less than 30 mol %.

3. The lead-free glass composition according to claim 1, wherein the content of the additional component is, when calculated in terms of the oxides, 0.1 mol % to 3.5 mol %.

4. The lead-free glass composition according to claim 1, wherein the additional component is at least one of yttrium oxide, lanthanum oxide, and aluminum oxide, and
wherein the content (mol %) of the additional component is, when calculated in terms of the oxides as shown below, $Ag_2O+Ln2O3 \leq 2V_2O_5$ (Ln: Y, La, Al).

5. The lead-free glass composition according to claim 4, wherein the content of the additional component is, when calculated in terms of the oxides, 0.3 mol % to 1.5 mol %.

6. The lead-free glass composition according to claim 1, wherein the second endothermic peak temperature in differential thermal analysis is equal to or lower than 200° C.

\* \* \* \* \*